United States Patent
Anthony et al.

(10) Patent No.: US 7,113,383 B2
(45) Date of Patent: Sep. 26, 2006

(54) PREDETERMINED SYMMETRICALLY BALANCED AMALGAM WITH COMPLEMENTARY PAIRED PORTIONS COMPRISING SHIELDING ELECTRODES AND SHIELDED ELECTRODES AND OTHER PREDETERMINED ELEMENT PORTIONS FOR SYMMETRICALLY BALANCED AND COMPLEMENTARY ENERGY PORTION CONDITIONING

(75) Inventors: Anthony A. Anthony, Erie, PA (US); William M. Anthony, Erie, PA (US); James P. Muccioli, Farmington Hills, MI (US)

(73) Assignee: X2Y Attenuators, LLC, Erie, PA (US)

( * ) Notice: Subject to any disclaimer, the term of this patent is extended or adjusted under 35 U.S.C. 154(b) by 513 days.

(21) Appl. No.: 10/460,361

(22) Filed: Jun. 13, 2003

(65) Prior Publication Data

US 2003/0202312 A1 Oct. 30, 2003

Related U.S. Application Data

(63) Continuation of application No. 09/845,680, filed on Apr. 30, 2001, now Pat. No. 6,580,595.
(60) Provisional application No. 60/200,327, filed on Apr. 28, 2000, provisional application No. 60/215,314, filed on Jun. 30, 2000, provisional application No. 60/225,497, filed on Aug. 15, 2000, and provisional application No. 60/255,818, filed on Dec. 15, 2000.

(51) Int. Cl.
*H02H 9/00* (2006.01)

(52) U.S. Cl. .............................. 361/118; 361/56; 361/58
(58) Field of Classification Search .................. 361/56, 361/58, 91.1, 111, 113, 117, 118, 119, 127, 361/91
See application file for complete search history.

(56) References Cited

U.S. PATENT DOCUMENTS

| 6,016,095 A | 1/1800 | Herbert |
| 3,240,621 A | 3/1966 | Flower Jr. et aal. |
| 3,343,034 A | 9/1967 | Ovshinsky |

(Continued)

FOREIGN PATENT DOCUMENTS

| DE | 197 28 692 A1 | 1/1999 |
| DE | 198 57 043 C1 | 3/2000 |
| EP | 98915364 | 11/1994 |

(Continued)

OTHER PUBLICATIONS

Greb, "An Intuituve Approach to EM Coupling," EMC Test & Design, Dec. 1993, pp. 20–25.
Sakamoto, "Noiseproof Power Supplies: What's Important in EMI Removal Filters!" JEE, Jun. 1986, pp. 80–85.

(Continued)

*Primary Examiner*—Stephen W. Jackson
(74) *Attorney, Agent, or Firm*—Neifeld IP Law, PC

(57) ABSTRACT

A predetermined amalgamation of electrodes formed or manufactured at least in part, by predetermined, sequential manufacturing operations into a balanced and shielding electrode structure. The balanced total electrode structure also uses a grouping of identically configured, and balanced positioned, shielding electrodes that are amalgamated in sequential combination with predetermined, complimentary balanced shielded electrodes groupings and other predetermined elements that are together, practicable to provide predetermined multiple energy conditioning functions operable upon portions of propagating energy as well simultaneously being operable to provide a common, voltage reference function operable for at least dynamic circuit operations.

24 Claims, 15 Drawing Sheets

U.S. PATENT DOCUMENTS

| | | |
|---|---|---|
| 3,573,677 A | 4/1971 | Detar |
| 3,742,420 A | 6/1973 | Harnden, Jr. |
| 3,790,858 A | 2/1974 | Brancaleon et al. |
| 3,842,374 A | 10/1974 | Schlicke |
| 4,023,071 A | 5/1977 | Fussell |
| 4,119,084 A | 10/1978 | Eckels |
| 4,135,132 A | 1/1979 | Tafjord |
| 4,139,783 A | 2/1979 | Engeler |
| 4,191,986 A | 3/1980 | ta Huang et al. |
| 4,198,613 A | 4/1980 | Whitley |
| 4,259,604 A | 3/1981 | Aoki |
| 4,262,317 A | 4/1981 | Baumbach |
| 4,275,945 A * | 6/1981 | Krantz et al. ............... 439/608 |
| 4,292,558 A | 9/1981 | Flick et al. |
| 4,308,509 A | 12/1981 | Tsuchiya et al. |
| 4,320,364 A | 3/1982 | Sakamoto et al. |
| 4,335,417 A | 6/1982 | Sakshaug et al. |
| 4,353,044 A | 10/1982 | Nossek |
| 4,366,456 A | 12/1982 | Ueno et al. |
| 4,384,263 A | 5/1983 | Neuman et al. |
| 4,394,639 A | 7/1983 | McGalliard |
| 4,412,146 A | 10/1983 | Futterer et al. |
| 4,494,092 A | 1/1985 | Griffin et al. |
| 4,533,931 A | 8/1985 | Mandai et al. |
| 4,553,114 A | 11/1985 | English et al. |
| 4,563,659 A | 1/1986 | Sakamoto |
| 4,586,104 A | 4/1986 | Standler |
| 4,587,589 A | 5/1986 | Marek |
| 4,590,537 A * | 5/1986 | Sakamoto ............... 361/306.3 |
| 4,612,140 A | 9/1986 | Mandai |
| 4,612,497 A | 9/1986 | Ulmer |
| 4,636,752 A | 1/1987 | Saito |
| 4,682,129 A | 7/1987 | Bakermans et al. |
| 4,685,025 A | 8/1987 | Carlomagno |
| 4,688,151 A | 8/1987 | Kraus et al. |
| 5,694,265 A | 9/1987 | Kupper |
| 4,698,721 A | 10/1987 | Warren |
| 4,703,386 A | 10/1987 | Speet et al. |
| 4,712,540 A | 12/1987 | Tucker et al. |
| 4,713,540 A | 12/1987 | Gilby et al. |
| 4,720,760 A | 1/1988 | Starr |
| 4,746,557 A | 5/1988 | Sakamoto et al. |
| 4,752,752 A | 6/1988 | Okubo |
| 4,760,485 A | 7/1988 | Ari et al. |
| 4,772,225 A | 9/1988 | Ulery |
| 4,777,460 A | 10/1988 | Okubo |
| 4,780,598 A | 10/1988 | Fahey et al. |
| 4,782,311 A | 11/1988 | Ookubo |
| 4,789,847 A | 12/1988 | Sakamoto et al. |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,845,606 A | 7/1989 | Herbert |
| 4,847,730 A | 7/1989 | Konno et al. |
| 4,904,967 A | 2/1990 | Morii et al. |
| 4,908,586 A | 3/1990 | Kling et al. |
| 4,908,590 A | 3/1990 | Sakamoto et al. |
| 4,924,340 A | 5/1990 | Sweet |
| 4,942,353 A | 7/1990 | Herbert et al. |
| 4,967,315 A | 10/1990 | Schelhorn |
| 4,978,906 A | 12/1990 | Herbert et al. |
| 4,990,202 A | 2/1991 | Murata et al. |
| 4,999,595 A | 3/1991 | Azumi et al. |
| 5,029,062 A | 7/1991 | Capel |
| 5,034,709 A | 7/1991 | Azumi et al. |
| 5,034,710 A | 7/1991 | Kawaguchi |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,079,069 A | 1/1992 | Howard et al. |
| 5,079,223 A | 1/1992 | Maroni |
| 5,079,669 A | 1/1992 | Williams |
| 5,089,688 A | 2/1992 | Fang et al. |
| 5,105,333 A | 4/1992 | Yamano et al. |
| 5,107,394 A | 4/1992 | Naito et al. |
| 5,109,206 A | 4/1992 | Carlile |
| 5,140,297 A | 8/1992 | Jacobs et al. |
| 5,140,497 A | 8/1992 | Kato et al. |
| 5,142,430 A * | 8/1992 | Anthony ..................... 361/56 |
| 5,148,005 A | 9/1992 | Fang et al. |
| 5,155,655 A | 10/1992 | Howard et al. |
| 5,161,086 A | 11/1992 | Howard et al. |
| 5,167,483 A | 12/1992 | Gardiner |
| 5,173,670 A | 12/1992 | Naito et al. |
| 5,179,362 A | 1/1993 | Okochi et al. |
| 5,181,859 A | 1/1993 | Foreman et al. |
| 5,186,647 A | 2/1993 | Denkmann et al. |
| 5,208,502 A | 5/1993 | Yamashita et al. |
| 5,219,812 A | 6/1993 | Doi et al. |
| 5,220,480 A | 6/1993 | Kershaw, Jr. et al. |
| 5,236,376 A | 8/1993 | Cohen |
| 5,243,308 A | 9/1993 | Shusterman et al. |
| 5,251,092 A | 10/1993 | Brady et al. |
| 5,261,153 A | 11/1993 | Lucas |
| 5,262,611 A | 11/1993 | Danysh et al. |
| 5,268,810 A | 12/1993 | DiMarco et al. |
| 5,290,191 A | 3/1994 | Foreman et al. |
| 5,299,956 A | 4/1994 | Brownell et al. |
| 5,300,760 A | 4/1994 | Batliwalla et al. |
| 5,310,363 A | 5/1994 | Brownell et al. |
| 5,311,408 A | 5/1994 | Ferchau et al. |
| 5,321,373 A | 6/1994 | Shusterman et al. |
| 5,321,573 A | 6/1994 | Person et al. |
| 5,326,284 A | 7/1994 | Bohbot et al. |
| 5,337,028 A | 8/1994 | White |
| 5,353,189 A | 10/1994 | Tomlinson |
| 5,353,202 A | 10/1994 | Ansell et al. |
| 5,357,568 A | 10/1994 | Pelegris |
| 5,362,249 A | 11/1994 | Carter |
| 5,362,254 A | 11/1994 | Siemon et al. |
| 5,378,407 A | 1/1995 | Chandler et al. |
| 5,382,928 A | 1/1995 | Davis et al. |
| 5,382,938 A | 1/1995 | Hansson et al. |
| 5,396,201 A | 3/1995 | Ishizaki et al. |
| 5,401,952 A | 3/1995 | Sugawa |
| 5,405,466 A | 4/1995 | Naito et al. |
| 5,414,587 A | 4/1995 | Kiser et al. |
| 5,414,393 A | 5/1995 | Rose et al. |
| 5,420,553 A | 5/1995 | Sakamoto et al. |
| 5,432,484 A | 7/1995 | Klas et al. |
| 5,446,625 A | 8/1995 | Urbish et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,461,351 A | 10/1995 | Shusterman |
| 5,463,232 A | 10/1995 | Yamashita et al. |
| 5,471,035 A | 11/1995 | Holmes |
| 5,477,933 A | 12/1995 | Nguyen |
| 5,481,238 A | 1/1996 | Carsten et al. |
| 5,483,407 A | 1/1996 | Anastasio et al. |
| 5,488,540 A | 1/1996 | Hatta |
| 5,491,299 A | 2/1996 | Naylor et al. |
| 5,493,260 A | 2/1996 | Park |

| | | | | | | |
|---|---|---|---|---|---|---|
| 5,495,180 A | 2/1996 | Huang et al. | | 5,980,718 A | 11/1999 | Van Konynenburg et al. |
| 5,500,629 A | 3/1996 | Meyer | | 5,995,352 A | 11/1999 | Gumley |
| 5,500,785 A | 3/1996 | Funada | | 5,999,067 A | 12/1999 | O'Ostilio |
| 5,512,196 A | 4/1996 | Mantese et al. | | 5,999,398 A | 12/1999 | Makl et al. |
| 5,531,003 A | 7/1996 | Seifried et al. | | 6,004,752 A | 12/1999 | Loewy et al. |
| 5,534,837 A | 7/1996 | Brandt | | 6,013,957 A | 1/2000 | Puzo et al. |
| 5,535,101 A | 7/1996 | Miles et al. | | 6,018,448 A | 1/2000 | Anthony |
| 5,536,978 A | 7/1996 | Cooper et al. | | 6,021,564 A | 2/2000 | Hanson |
| 5,541,482 A | 7/1996 | Siao | | 6,023,406 A | 2/2000 | Kinoshita et al. |
| 5,544,002 A | 8/1996 | Iwaya et al. | | 6,031,710 A | 2/2000 | Wolf et al. |
| 5,546,058 A | 8/1996 | Azuma et al. | | 6,034,576 A | 3/2000 | Kuth |
| 5,548,255 A | 8/1996 | Spielman | | 6,034,864 A | 3/2000 | Naito et al. |
| 5,555,150 A | 9/1996 | Newman, Jr. | | 6,037,846 A | 3/2000 | Oberhammer |
| 5,568,348 A | 10/1996 | Foreman et al. | | 6,038,121 A | 3/2000 | Naito et al. |
| 5,570,278 A | 10/1996 | Cross | | 6,042,685 A | 3/2000 | Shinada et al. |
| 5,583,359 A | 12/1996 | Ng et al. | | 6,046,898 A | 4/2000 | Seymour et al. |
| 5,586,007 A | 12/1996 | Funada | | 6,052,038 A | 4/2000 | Savicki |
| 5,592,391 A | 1/1997 | Muyshondt et al. | | 6,061,227 A | 5/2000 | Nogi |
| 5,612,657 A | 3/1997 | Kledzik | | 6,064,286 A | 5/2000 | Ziegner et al. |
| 5,614,881 A | 3/1997 | Duggal et al. | | 6,072,687 A | 6/2000 | Naito et al. |
| 5,619,079 A | 4/1997 | Wiggins et al. | | 6,075,211 A | 6/2000 | Tohya et al. |
| 5,624,592 A | 4/1997 | Paustian | | 6,078,117 A | 6/2000 | Perrin et al. |
| 5,640,048 A | 6/1997 | Selna | | 6,078,229 A | 6/2000 | Funada et al. |
| 5,645,746 A | 7/1997 | Walsh | | 6,088,235 A | 7/2000 | Chiao et al. |
| 5,647,766 A | 7/1997 | Nguyen | | 6,091,310 A | 7/2000 | Utsumi et al. |
| 5,668,511 A | 9/1997 | Furutani et al. | | 6,092,269 A | 7/2000 | Yializis et al. |
| 5,682,303 A | 10/1997 | Goad | | 6,094,112 A | 7/2000 | Goldberger et al. |
| 5,700,167 A | 12/1997 | Pharney et al. | | 6,094,339 A | 7/2000 | Evans |
| 5,708,553 A | 1/1998 | Hung | | 6,097,260 A | 8/2000 | Whybrew et al. |
| 5,719,450 A | 2/1998 | Vora | | 6,097,581 A | 8/2000 | Anthony |
| 5,719,477 A | 2/1998 | Tomihari | | 6,104,258 A | 8/2000 | Novak |
| 5,719,750 A | 2/1998 | Iwane | | 6,104,599 A | 8/2000 | Ahiko et al. |
| 5,751,539 A | 5/1998 | Stevenson et al. | | 6,108,448 A | 8/2000 | Song et al. |
| 5,767,446 A | 6/1998 | Ha et al. | | 6,111,479 A | 8/2000 | Myohga et al. |
| 5,789,999 A | 8/1998 | Barnett et al. | | 6,120,326 A | 9/2000 | Brooks |
| 5,790,368 A | 8/1998 | Naito et al. | | 6,121,761 A | 9/2000 | Herbert |
| 5,796,568 A | 8/1998 | Baiatu | | 6,125,044 A | 9/2000 | Cherniski et al. |
| 5,796,595 A | 8/1998 | Cross | | 6,130,585 A | 10/2000 | Whybrew et al. |
| 5,797,770 A | 8/1998 | Davis et al. | | 6,137,392 A | 10/2000 | Herbert |
| 5,808,873 A | 9/1998 | Celaya et al. | | 6,142,831 A | 11/2000 | Ashman et al. |
| 5,825,628 A | 10/1998 | Garbelli et al. | | 6,144,547 A | 11/2000 | Retseptor |
| 5,828,093 A | 10/1998 | Naito et al. | | 6,147,587 A | 11/2000 | Hadano et al. |
| 5,828,272 A | 10/1998 | Romerein et al. | | 6,150,895 A | 11/2000 | Steigerwald et al. |
| 5,828,555 A | 10/1998 | Itoh | | 6,157,528 A | 12/2000 | Anthony |
| 5,831,489 A | 11/1998 | Wire | | 6,157,547 A | 12/2000 | Brown et al. |
| 5,834,992 A | 11/1998 | Kato et al. | | 6,163,454 A | 12/2000 | Strickler |
| 5,838,216 A | 11/1998 | White et al. | | 6,163,456 A | 12/2000 | Suzuki et al. |
| 5,867,361 A | 2/1999 | Wolf et al. | | 6,165,814 A | 12/2000 | Wark et al. |
| 5,870,272 A | 2/1999 | Seifried et al. | | 6,175,287 B1 | 1/2001 | Lampen et al. |
| 5,875,099 A | 2/1999 | Maesaka et al. | | 6,180,588 B1 | 1/2001 | Walters |
| 5,880,925 A | 3/1999 | DuPre et al. | | 6,181,231 B1 | 1/2001 | Bartilson |
| 5,889,445 A | 3/1999 | Ritter et al. | | 6,183,685 B1 | 2/2001 | Cowman et al. |
| 5,895,990 A | 4/1999 | Lau | | 6,185,091 B1 | 2/2001 | Tanahashi et al. |
| 5,898,403 A | 4/1999 | Saitoh et al. | | 6,188,565 B1 | 2/2001 | Naito et al. |
| 5,898,562 A | 4/1999 | Cain et al. | | 6,191,475 B1 | 2/2001 | Skinner et al. |
| 5,905,627 A | 5/1999 | Brendel et al. | | 6,191,669 B1 | 2/2001 | Shigemura |
| 5,907,265 A | 5/1999 | Sakuragawa et al. | | 6,191,932 B1 | 2/2001 | Kuroda et al. |
| 5,908,151 A | 6/1999 | Elias | | 6,195,269 B1 | 2/2001 | Hino |
| 5,909,155 A | 6/1999 | Anderson et al. | | 6,198,123 B1 | 3/2001 | Linder et al. |
| 5,909,350 A * | 6/1999 | Anthony ................. 361/118 | | 6,198,362 B1 | 3/2001 | Harada et al. |
| 5,910,755 A | 6/1999 | Mishiro et al. | | 6,204,448 B1 | 3/2001 | Garland et al. |
| 5,912,809 A | 6/1999 | Steigerwald et al. | | 6,205,014 B1 | 3/2001 | Inomata et al. |
| 5,917,388 A | 6/1999 | Tronche et al. | | 6,207,081 B1 | 3/2001 | Sasaki et al. |
| 5,926,377 A | 7/1999 | Nakao et al. | | 6,208,063 B1 | 3/2001 | Horikawa et al. |
| 5,928,076 A | 7/1999 | Clements et al. | | 6,208,225 B1 | 3/2001 | Miller |
| 5,955,930 A | 9/1999 | Anderson et al. | | 6,208,226 B1 | 3/2001 | Chen et al. |
| 5,959,829 A | 9/1999 | Stevenson et al. | | 6,208,494 B1 | 3/2001 | Nakura et al. |
| 5,959,846 A | 9/1999 | Noguchi et al. | | 6,208,495 B1 | 3/2001 | Wieloch et al. |
| 5,969,461 A | 10/1999 | Anderson et al. | | 6,208,501 B1 | 3/2001 | Ingalls et al. |
| 5,977,845 A | 11/1999 | Kitahara | | 6,208,502 B1 | 3/2001 | Hudis et al. |
| 5,978,231 A | 11/1999 | Tohya et al. | | 6,208,503 B1 | 3/2001 | Shimada et al. |

| | | | | | |
|---|---|---|---|---|---|
| 6,208,521 B1 | 3/2001 | Nakatsuka | 6,894,884 B1 | 5/2005 | Anthony, Jr. et al. |
| 6,208,525 B1 | 3/2001 | Imasu et al. | 6,950,293 B1 | 9/2005 | Anthony |
| 6,211,754 B1 | 4/2001 | Nishida et al. | 6,954,346 B1 | 10/2005 | Anthony |
| 6,212,078 B1 | 4/2001 | Hunt et al. | 6,995,983 B1 | 2/2006 | Anthony et al. |
| 6,215,647 B1 | 4/2001 | Naito et al. | 2001/0001989 A1 | 5/2001 | Smith |
| 6,215,649 B1 | 4/2001 | Appelt et al. | 2001/0002105 A1 | 5/2001 | Brandelik et al. |
| 6,218,631 B1 | 4/2001 | Hetzel et al. | 2001/0002624 A1 | 6/2001 | Khandros et al. |
| 6,219,240 B1 | 4/2001 | Sasov | 2001/0008288 A1 | 7/2001 | Murakami et al. |
| 6,222,427 B1 | 4/2001 | Kato et al. | 2001/0008478 A1 | 7/2001 | McIntosh et al. |
| 6,222,431 B1 | 4/2001 | Ishizaki et al. | 2001/0008509 A1 | 7/2001 | Watanabe |
| 6,225,876 B1 | 5/2001 | Akino et al. | 2001/0009496 A1 | 7/2001 | Kappel et al. |
| 6,226,169 B1 | 5/2001 | Naito et al. | 2001/0010444 A1 | 8/2001 | Pahl et al. |
| 6,226,182 B1 | 5/2001 | Maehara | 2001/0011763 A1 | 8/2001 | Ushijima et al. |
| 6,229,226 B1 | 5/2001 | Kramer et al. | 2001/0011934 A1 | 8/2001 | Yamamoto |
| 6,236,572 B1 | 5/2001 | Teshome et al. | 2001/0011937 A1 | 8/2001 | Satoh et al. |
| 6,240,621 B1 | 6/2001 | Nellissen et al. | 2001/0013626 A1 | 8/2001 | Fujii |
| 6,243,253 B1 | 6/2001 | DuPre et al. | 2001/0015643 A1 | 8/2001 | Goldifine et al. |
| 6,249,047 B1 | 6/2001 | Corisis | 2001/0015683 A1 | 8/2001 | Mikami et al. |
| 6,249,439 B1 | 6/2001 | DeMore et al. | 2001/0017576 A1 | 8/2001 | Kondo et al. |
| 6,252,161 B1 | 6/2001 | Hailey et al. | 2001/0017579 A1 | 8/2001 | Kurata |
| 6,262,895 B1 | 7/2001 | Forthun | 2001/0019869 A1 | 9/2001 | Hsu |
| 6,266,228 B1 | 7/2001 | Naito et al. | 2001/0020879 A1 | 9/2001 | Takahashi et al. |
| 6,266,229 B1 | 7/2001 | Naito et al. | 2001/0022547 A1 | 9/2001 | Muruta et al. |
| 6,272,003 B1 | 8/2001 | Schaper | 2001/0023983 A1 | 9/2001 | Kobayashi et al. |
| 6,282,074 B1 | 8/2001 | Anthony | 2001/0024148 A1 | 9/2001 | Gerstenberg et al. |
| 6,282,079 B1 | 8/2001 | Nagakari et al. | 2001/0028581 A1 | 10/2001 | Yanagisawa et al. |
| 6,285,109 B1 | 9/2001 | Katagiri et al. | 2001/0029648 A1 | 10/2001 | Ikada et al. |
| 6,285,542 B1 | 9/2001 | Kennedy, III et al. | 2001/0031191 A1 | 10/2001 | Korenaga |
| 6,292,350 B1 | 9/2001 | Naito et al. | 2001/0033664 A1 | 10/2001 | Poux et al. |
| 6,292,351 B1 | 9/2001 | Ahiko et al. | 2001/0035801 A1 | 11/2001 | Gilbert |
| 6,309,245 B1 | 10/2001 | Sweeney | 2001/0035802 A1 | 11/2001 | Kadota |
| 6,310,286 B1 | 10/2001 | Troxel et al. | 2001/0035805 A1 | 11/2001 | Suzuki et al. |
| 6,313,584 B1 | 11/2001 | Johnson et al. | 2001/0037680 A1 | 11/2001 | Buck et al. |
| 6,320,547 B1 | 11/2001 | Fathy et al. | 2001/0039834 A1 | 11/2001 | Hsu |
| 6,324,047 B1 | 11/2001 | Hayworth | 2001/0040484 A1 | 11/2001 | Kim |
| 6,324,048 B1 | 11/2001 | Liu | 2001/0040487 A1 | 11/2001 | Ikata et al. |
| 6,325,672 B1 | 12/2001 | Belopolsky et al. | 2001/0040488 A1 | 11/2001 | Gould et al. |
| 6,327,134 B1 | 12/2001 | Kuroda et al. | 2001/0041305 A1 | 11/2001 | Sawada et al. |
| 6,327,137 B1 | 12/2001 | Yamamoto et al. | 2001/0043100 A1 | 11/2001 | Tomita et al. |
| 6,331,926 B1 | 12/2001 | Anthony | 2001/0043129 A1 | 11/2001 | Hideka et al. |
| 6,331,930 B1 | 12/2001 | Kuroda | 2001/0043450 A1 | 11/2001 | Seale et al. |
| 6,342,681 B1 | 1/2002 | Goldberger et al. | 2001/0043453 A1 | 11/2001 | Poon et al. |
| 6,373,673 B1 | 4/2002 | Anthony | 2001/0048581 A1 | 12/2001 | Anthony et al. |
| 6,388,856 B1 | 5/2002 | Anthony | 2001/0048593 A1 | 12/2001 | Yamauchi et al. |
| 6,395,996 B1 | 5/2002 | Tsai et al. | 2001/0048906 A1 | 12/2001 | Lau et al. |
| 6,448,873 B1 | 9/2002 | Mostov | 2001/0050550 A1 | 12/2001 | Yoshida et al. |
| 6,456,481 B1 | 9/2002 | Stevenson | 2001/0050600 A1 | 12/2001 | Anthony et al. |
| 6,469,595 B1 | 10/2002 | Anthony et al. | 2001/0050637 A1 | 12/2001 | Stevenson et al. |
| 6,498,710 B1 | 12/2002 | Anthony | 2001/0052833 A1 | 12/2001 | Enokihara et al. |
| 6,504,451 B1 | 1/2003 | Yamaguchi | 2001/0054512 A1 | 12/2001 | Belau et al. |
| 6,509,807 B1 | 1/2003 | Anthony et al. | 2001/0054734 A1 | 12/2001 | Koh et al. |
| 6,510,038 B1 | 1/2003 | Satou et al. | 2001/0054756 A1 | 12/2001 | Horiuchi et al. |
| 6,522,516 B1 | 2/2003 | Anthony | 2001/0054936 A1 | 12/2001 | Okada et al. |
| 6,549,389 B1 | 4/2003 | Anthony et al. | 2002/0000521 A1 | 1/2002 | Brown |
| 6,563,688 B1 | 5/2003 | Anthony et al. | 2002/0000583 A1 | 1/2002 | Kitsukawa et al. |
| 6,580,595 B1 | 6/2003 | Anthony et al. | 2002/0000821 A1 | 1/2002 | Haga et al. |
| 6,594,128 B1 | 7/2003 | Anthony | 2002/0000893 A1 | 1/2002 | Hidaka et al. |
| 6,603,372 B1 | 8/2003 | Ishizaki et al. | 2002/0000895 A1 | 1/2002 | Takahashi et al. |
| 6,603,646 B1 | 8/2003 | Anthony et al. | 2002/0003454 A1 | 1/2002 | Sweeney et al. |
| 6,606,011 B1 | 8/2003 | Anthony et al. | 2002/0005880 A1 | 1/2002 | Ashe et al. |
| 6,606,237 B1 | 8/2003 | Naito et al. | 2002/0024787 A1 | 2/2002 | Anthony |
| 6,618,268 B1 | 9/2003 | Dibene, II et al. | 2002/0027263 A1 | 3/2002 | Anthony et al. |
| 6,636,406 B1 | 10/2003 | Anthony | 2002/0027760 A1 | 3/2002 | Anthony |
| 5,257,950 A1 | 11/2003 | Lenker et al. | 2002/0044401 A1 | 4/2002 | Anthony et al. |
| 6,650,525 B1 | 11/2003 | Anthony | 2002/0075096 A1 | 6/2002 | Anthony |
| 6,687,108 B1 | 2/2004 | Anthony et al. | 2002/0079116 A1 | 6/2002 | Anthony |
| 6,696,952 B1 | 2/2004 | Zirbes | 2002/0089812 A1 | 7/2002 | Anthony |
| 6,717,301 B1 | 4/2004 | De Daran et al. | 2002/0113663 A1 | 8/2002 | Anthony et al. |
| 6,738,249 B1 | 5/2004 | Anthony et al. | 2002/0122286 A1 | 9/2002 | Anthony |
| 6,806,806 B1 | 10/2004 | Anthony | 2002/0131231 A1 | 9/2002 | Anthony |
| 6,873,513 B1 | 3/2005 | Anthony | 2002/0149900 A1 | 10/2002 | Anthony |

| | | | |
|---|---|---|---|
| 2002/0158515 A1 | 10/2002 | Anthony Jr. et al. | |
| 2002/0186100 A1 | 12/2002 | Anthony et al. | |
| 2003/0029632 A1 | 2/2003 | Anthony Jr. et al. | |
| 2003/0029635 A1 | 2/2003 | Anthony Jr. et al. | |
| 2003/0048029 A1 | 3/2003 | DeDaran et al. | |
| 2003/0067730 A1 | 4/2003 | Anthony et al. | |
| 2003/0161086 A1 | 8/2003 | Anthony | |
| 2003/0202312 A1 | 10/2003 | Anthony et al. | |
| 2003/0210125 A1 | 11/2003 | Anthony | |
| 2003/0231451 A1 | 12/2003 | Anthony | |
| 2003/0231456 A1 | 12/2003 | Anthony et al. | |
| 2004/0004802 A1 | 1/2004 | Anthony et al. | |
| 2004/0008466 A1 | 1/2004 | Anthony et al. | |
| 2004/0027771 A1 | 2/2004 | Anthony | |
| 2004/0032304 A1 | 2/2004 | Anthony et al. | |
| 2004/0054426 A1 | 3/2004 | Anthony | |
| 2004/0085699 A1 | 5/2004 | Anthony | |
| 2004/0105205 A1 | 6/2004 | Anthony et al. | |
| 2004/0012949 A1 | 7/2004 | Anthony et al. | |
| 2004/0130840 A1 | 7/2004 | Anthony | |
| 2004/0218332 A1 | 11/2004 | Anthony et al. | |
| 2004/0402267 | 11/2004 | Anthony et al. | |
| 2005/0016761 A9 | 1/2005 | Anthony Jr. et al. | |
| 2005/0018374 A1 | 1/2005 | Anthony | |
| 2005/0063127 A1 | 3/2005 | Anthony | |
| 2005/0248900 A1 | 11/2005 | Anthony | |

FOREIGN PATENT DOCUMENTS

| | | |
|---|---|---|
| EP | 0776016 | 5/1997 |
| EP | 0933871 | 8/1999 |
| EP | 1022751 | 7/2000 |
| EP | 1024507 | 8/2000 |
| EP | 1061535 | 12/2000 |
| EP | WO 05/65097 | 7/2005 |
| FR | 2765417 | 12/1998 |
| FR | 2808135 | 10/2001 |
| GB | 2217136 | 4/1988 |
| JP | 63-269509 | 11/1988 |
| JP | 1-27251 | 1/1989 |
| JP | 02-267879 | 11/1990 |
| JP | 03-018112 | 1/1991 |
| JP | 5-283284 | 10/1993 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-151014 | 5/1994 |
| JP | 06-151244 | 5/1994 |
| JP | 06-151245 | 5/1994 |
| JP | 06-325977 | 11/1994 |
| JP | 07-235406 | 9/1995 |
| JP | 07-235852 | 9/1995 |
| JP | 07-240651 | 9/1995 |
| JP | 08-124795 | 5/1996 |
| JP | 08-163122 | 6/1996 |
| JP | 08-172025 | 7/1996 |
| JP | 09-284077 | 10/1997 |
| JP | 09-284078 | 10/1997 |
| JP | 09/284078 | 10/1997 |
| JP | 9-294041 | 11/1997 |
| JP | 11-21456 | 8/1999 |
| JP | 11-214256 | 8/1999 |
| JP | 11-223396 | 8/1999 |
| JP | 11-294908 | 10/1999 |
| JP | 11-305302 | 11/1999 |
| JP | 11-319222 | 11/1999 |
| JP | 11-345273 | 12/1999 |
| WO | WO 91/15046 | 10/1991 |
| WO | WO 98/45921 | 10/1998 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | WO 01/10000 | 2/2001 |
| WO | WO 01/41232 | 6/2001 |
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/33798 | 4/2002 |
| WO | WO 02/1227794 | 4/2002 |
| WO | WO 02/45233 | 6/2002 |
| WO | WO 02/65606 | 8/2002 |
| WO | WO 02/080330 | 10/2002 |
| WO | WO 03/005541 | 1/2003 |
| WO | WO 04/70905 | 8/2004 |
| WO | WO 05/02018 | 1/2005 |
| WO | WO 05/15719 | 2/2005 |

OTHER PUBLICATIONS

Montrose, "Analysis on Loop Area Trace Radiated Emissions from Decoupling Capacitor Placement on Printed Circuit Boards," IEEE, 1999, pp. 423–428.

Miyoshi, "Surface Mounted Distributed Constant Type Noise Filter," IEEE, 1999, pp. 157–160.

Shigeta et al., "Improved EMI Performance by Use of a Three–Terminal–Capacitor Applied to an IC Power Line," IEEE, 1999, pp. 161–164.

PCT International Search Report for PCT/US99/07653.

IPER for PCT/US99/07653.

U.S. Appl. No. 10/479,506, Claims 1–46 from Preliminary Amendment filed Dec. 10, 2003.

U.S. Appl. No. 10/189,339, Claims 1–41 from Preliminary Amendment filed Oct. 28, 2003.

U.S. Appl. No. 10/443,792, Claims 1–41 from Preliminary Amendment filed Oct. 28, 2003.

PCT International Search Report for PCT/US98/06962.

PCT International Search Report for PCT/US99/01040.

PCT International Search Report for PCT/US00/11409.

PCT International Search Report for PCT/US00/14626.

PCT International Search Report for PCT/US00/16518.

PCT International Search Report for PCT/US00/21178.

Fang et al., "Conductive Polymers Prolong Circuit Life," Design News, date unknown, 3 pages.

Carpenter, Jr. et al., "A New Approach to TVSS Design," Power Quality Assurance, Sep./Oct. 1996 p. 60–63.

Raychem, "Polyswitch Resettable Fuses," Circuit Protection Databook, Jan., 1996, pp. 11–18.

PCT International Search Report for PCT/US01/09185.

Polka et al, "Package–Level Interconnect Design for Optimum Electrical Performance," Intel Technology Journal Q3, 2000, pp. 1–17.

PCT International Search Report for PCT/US01/43418.

PCT International Search Report for PCT/US01/132480.

PCT International Search Report for PCT/US02/10302.

PCT International Search Report for PCT/US02/21238.

PCT International Search Report for PCT/US01/13911.

PCT International Search Report for PCT/US91/01250.

PCT International Search Report for PCT/US01/03792.
"Johanson Dielectrics, Inc. Licenses X2Y Circuit Conditioning Technology," Press Release, Dec. 16, 1998, 1 page.
Beyne et al., "PSGA–an innovative IC package for single and multichip designs," Components, Mar. 1997, pp. 6–9.
"EMC Design for Brush Commutated DC Electric Motors," Sep. 15, 1997, pp. 1–2.
"Tomorrow's Capacitors," Components, 1996, No. 4, page 3.
Mason, "Valor–Understanding Common Mode Noise," Mar. 30, 1998, pp. 1–7.
Anthony, Anthony et al., Pending specification, claims figures for U.S. Appl. No. 10/237,079, Claims 21–81; filed Sep. 9, 2002.
David Anthony et al., Pending specification, Claims, figures for U.S. Appl. No. 10/766,000, Claims 1–63; filed Jan. 29, 2004.
William Anthony, Pending specification claims, figures for U.S. Appl. No. 10/399,630, Claims 1–35; filed Aug. 27, 2003.
Anthony, Anthony et al., Pending specification, claims, figures for U.S. Appl. No. 10/432,840, Claims 1–39; filed May 28, 2003.
William Anthony, Pending specification, claims, figures for U.S. Appl. No. 10/443,482, Claims 1–25; filed Jun. 12, 2003.
Anthony, Anthony et al., Pending specification, claims, figures for U.S. Appl. No. 10/435,199, Claims 1–32; filed May 12, 2003.
Anthony, Anthony et al., Pending specification, claims, figures for U.S. Appl. No. 10/115,159, Claims 1–31; filed Apr. 2, 2002.
Anthony, Anthony et al., Pending specification, claims, figures for U.S. Appl. No. 10/189,338, Claims 1–69; filed Jul. 2, 2002.
Anthony, Anthony et al., Pending specification, claims, figures for U.S. Appl. No. 10/189,339, Claims 1–41; filed Jul. 2, 2002.
Anthony, Anthony et al., Pending specification, claims, figures for U.S. Appl. No. 10/479,506, Claims 1–46; filed Dec. 10, 2003.
Anthony, Anthony, Pending specification, claims, figures for U.S. Appl. No. 10/443,764, Claims 26–40; filed Sep. 16, 2003.
Anthony, Anthony, Pending specification, claims figures for U.S. Appl. No. 10/443,792, claims 1–41; May 23, 2003.
Pending specification, claims, figures for U.S. Appl. No. 10/443,788, Claims 1; 21–45; filed May 23, 2003.
Anthony Anthony et al., Pending specification, claims, figures for U.S. Appl. No. 10/460,361, Claims 1–16; filed Jun. 13, 2003.
Anthony, Anthony et al., Pending specification claims figures for U.S. Appl. No. 10/443,788, Claims 1; 21–45; filed May 23, 2003.
Anthony, Anthony et al., Pending specification claims, figures for U.S. Appl. No. 10/705,962, claims 19–33; filed May 25, 2005.
Anthony, Anthony, Pending specification, claims, figures for U.S. Appl. No. 10/369,335, claims 1–20; Feb. 18, 2003.
Anthony, Pending specification, claims, figures for U.S. Appl. No 09/647,648, Claims 1–48; filed Nov. 17, 2000.
Anthony, Anthony, Pending specification, claims, figures for U.S. Appl. No. 10/328,942, Claims 1–20; filed Dec. 23, 2002.
Anthony, Anthony et al., Pending specification, claims, figures for U.S. Appl. No. 09/996,355, claims 1–73; filed Nov. 29, 2001.
Pending specification, claims, figures for U.S. Appl. No. 10/023,467, Claims 1–20; filed Dec. 17, 2001.
Weir et al., "DesignCon 2005, High Performance FPGA Bypass Networks".
Pending claims 1–40 and figures (3 pages) for Appl. No. 10/399,590; the specification is contained in WO 02/33798, filed Oct. 17, 2001, which is the published version of PCT/US01/32480, which is Neifeld Reference: X2YA0015UPCT–US, which is reference F–063 in the Information Disclosure Statement filed Apr. 23, 2004.
PCT International Search Report for PCT/US04/00218.
PCT International Search Report for PCT/US04/14539.
Australian Patent Office Examination Report for SG. 200303041–8; Neifeld Ref: X2YA0025UPCT–SG.
PCT International Search Report for PCT/US04/18938.
Muccioli, "EMC Society Seattle and Oregon Chapters–New X2Y Filter Technology Emerges as Singles Component Solution for Noise Suppression".
PCT Corrected IPER for PCT/US04/00218.
Supplementary Partial European Search Report EP 99916477.
Supplementary European Search Report EP 98915364.
PCT ISR for PCT/US04/39777.

* cited by examiner

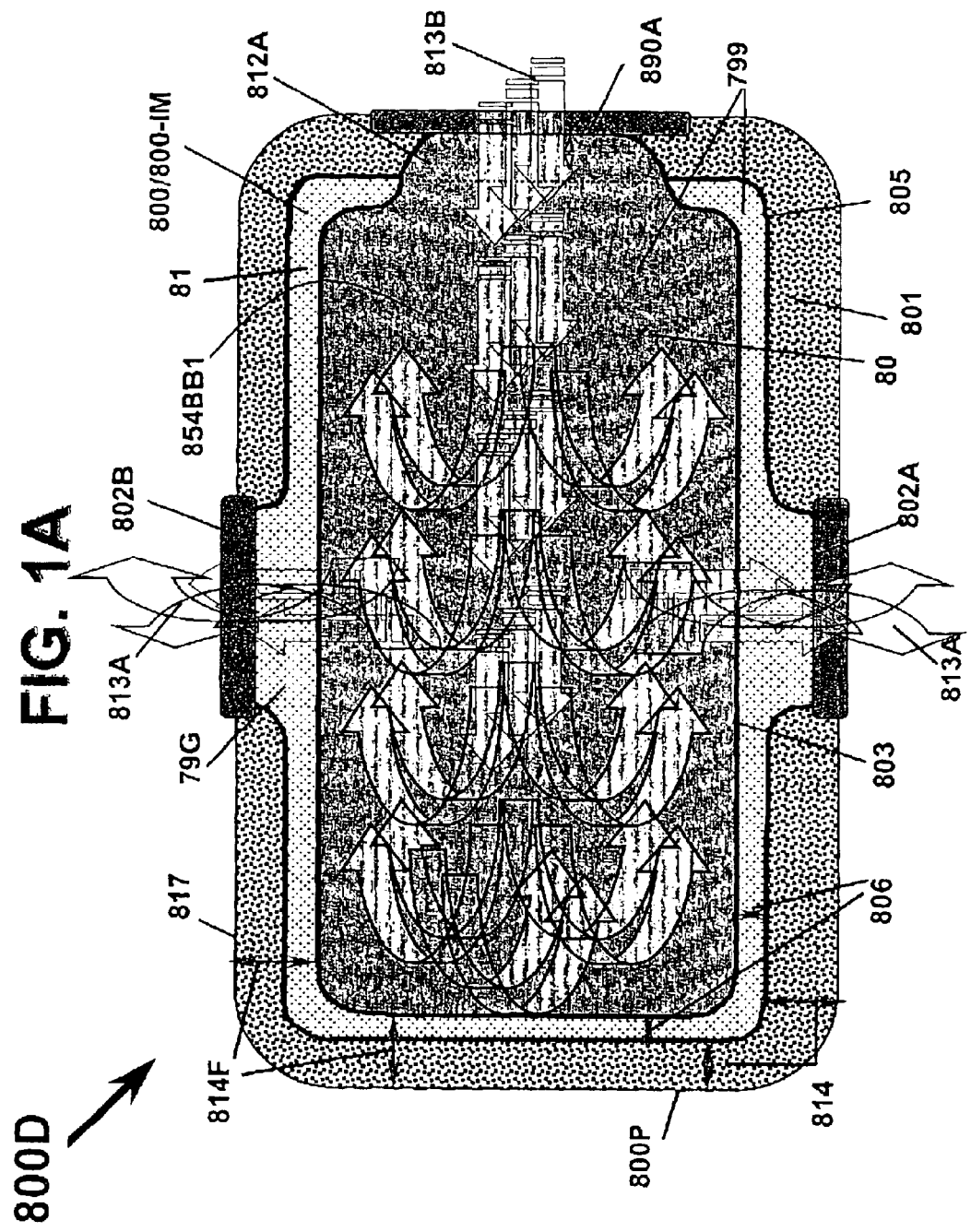

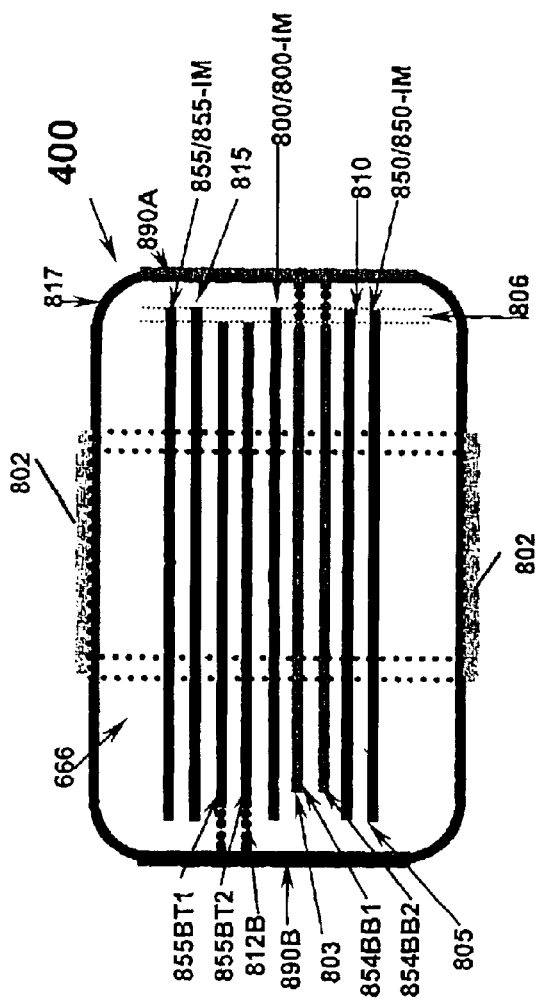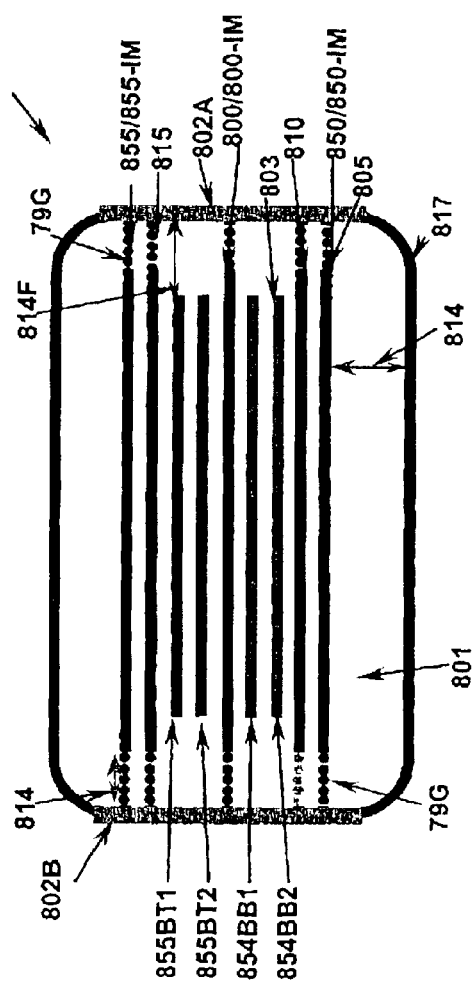
FIG. 2B
FIG. 2C

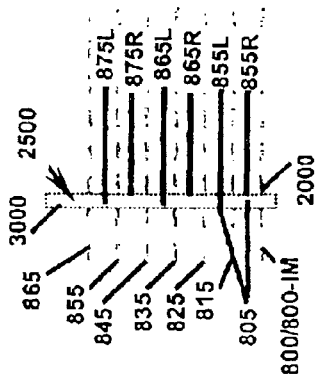
FIG. 3A
FIG. 3B
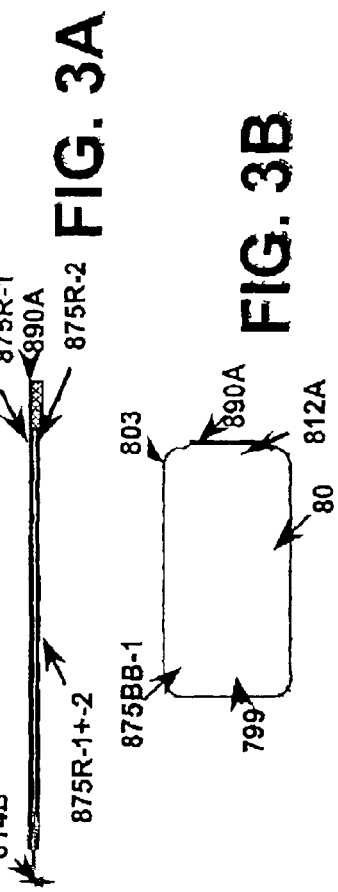
FIG. 3C
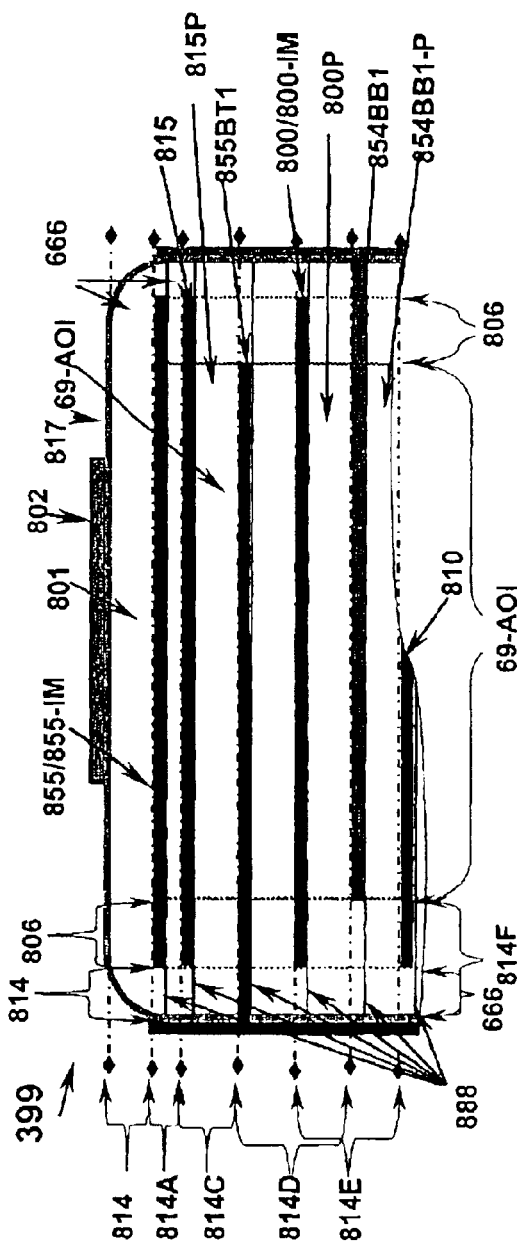
FIG. 4

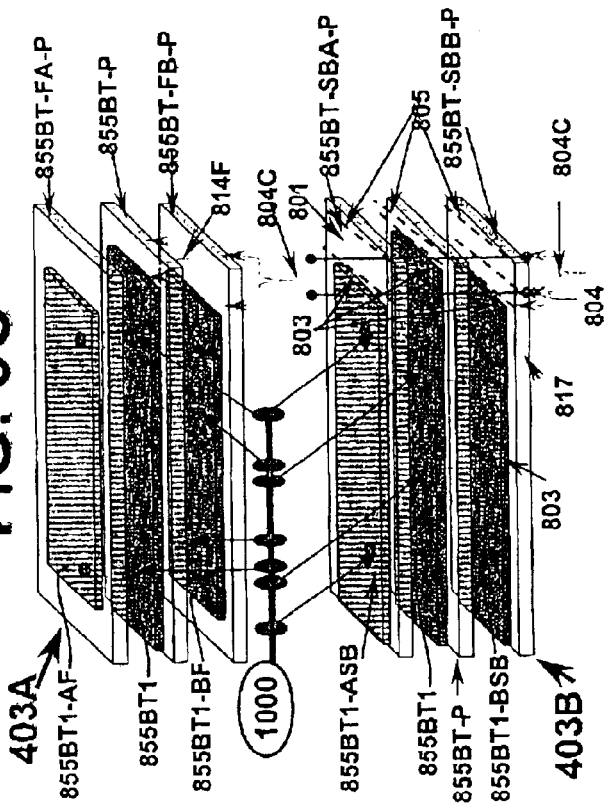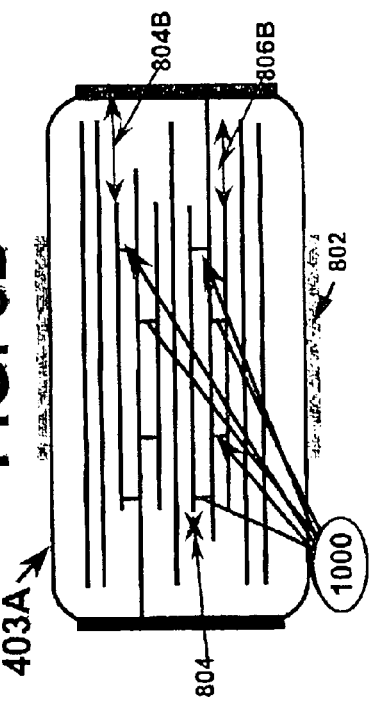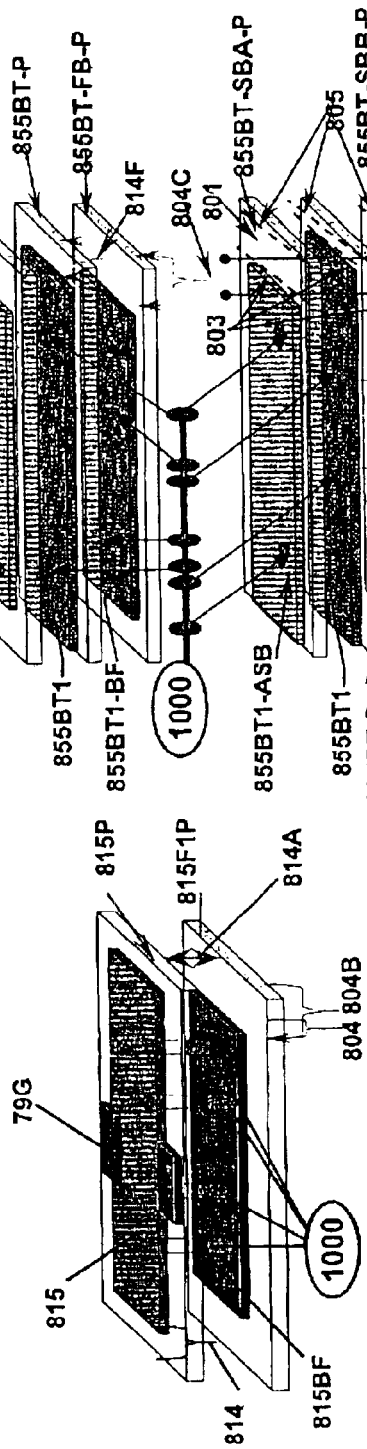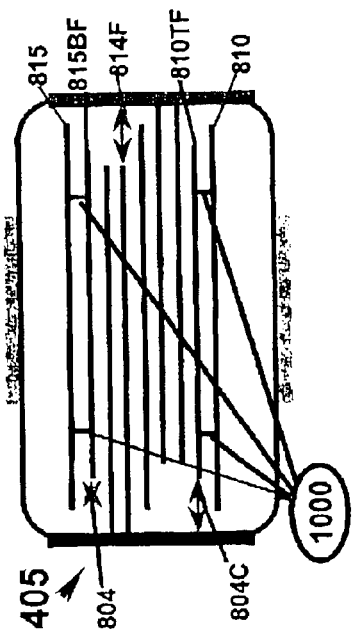

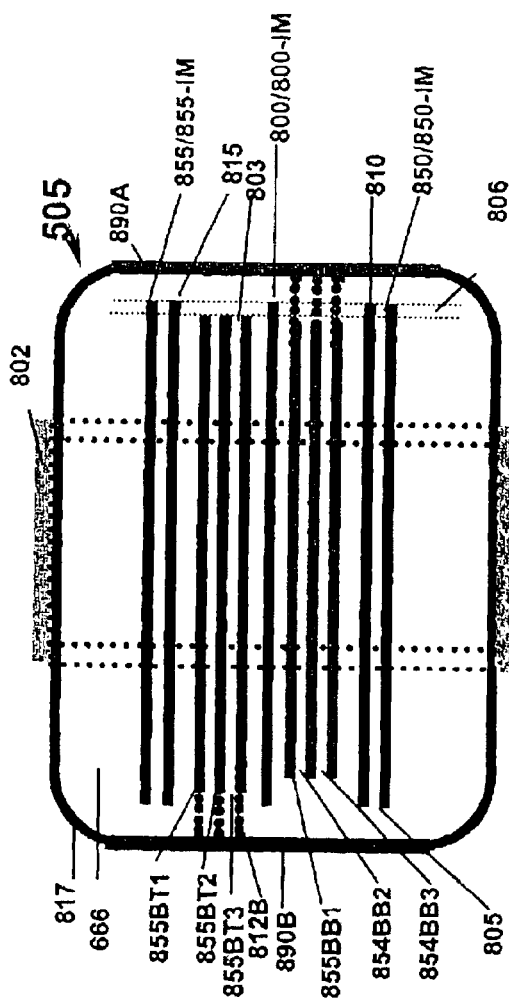
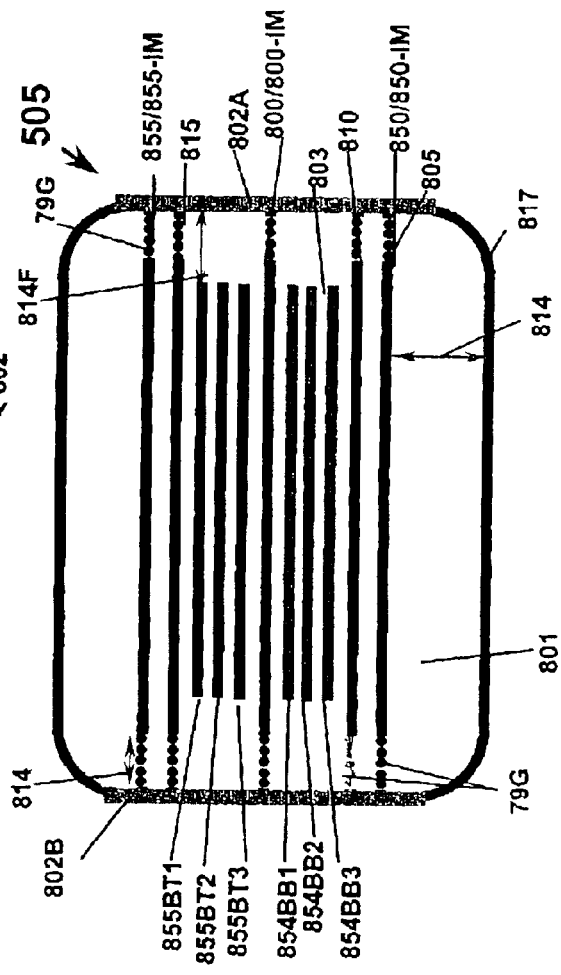
FIG. 6A
FIG. 6B

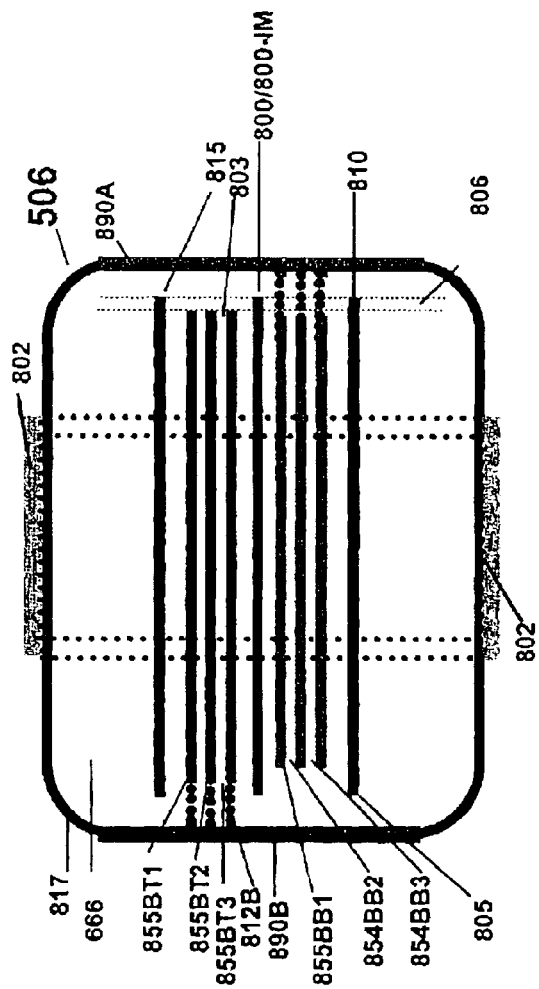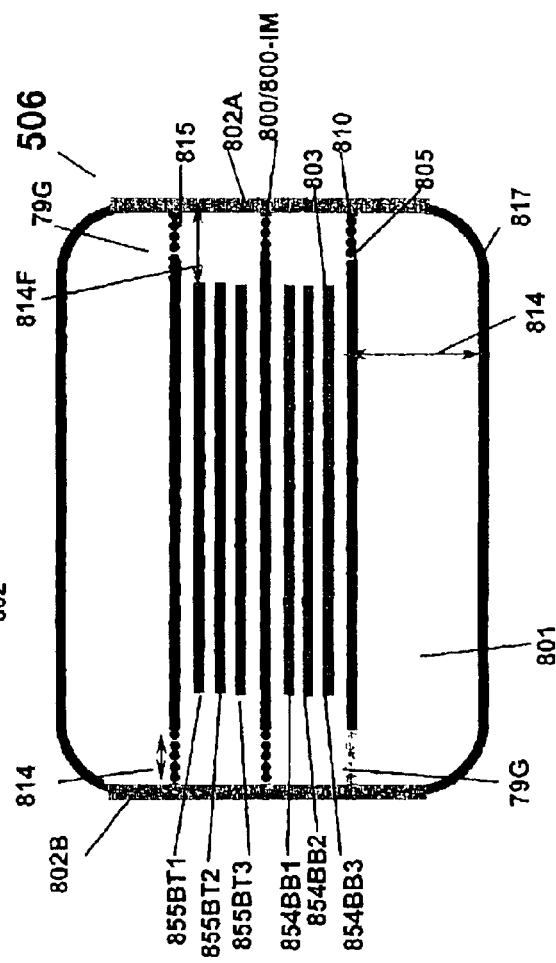

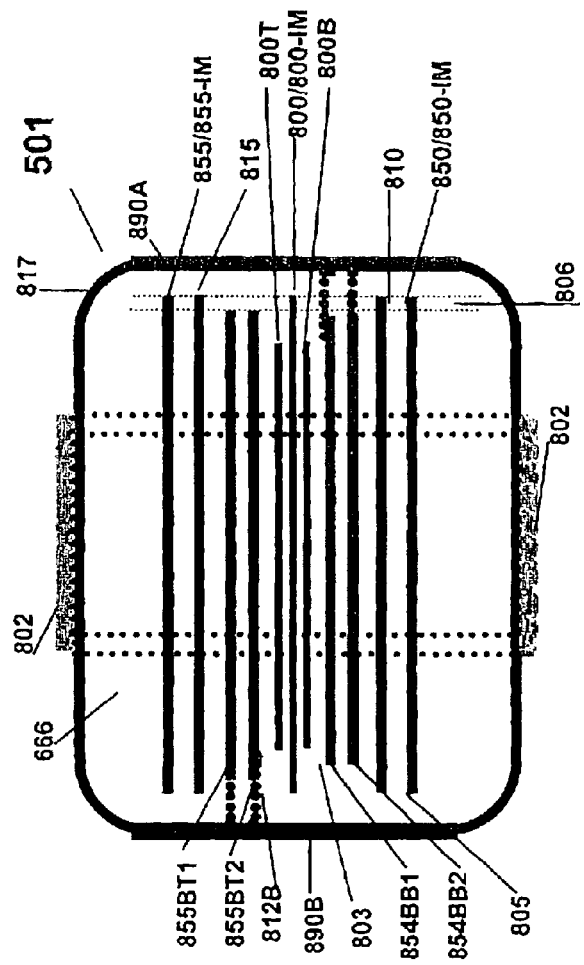
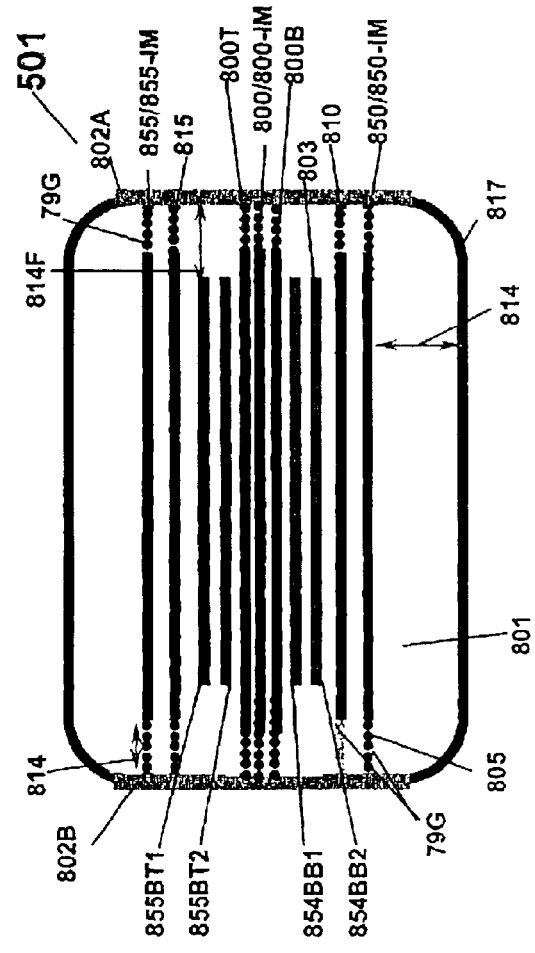
FIG. 8A
FIG. 8B

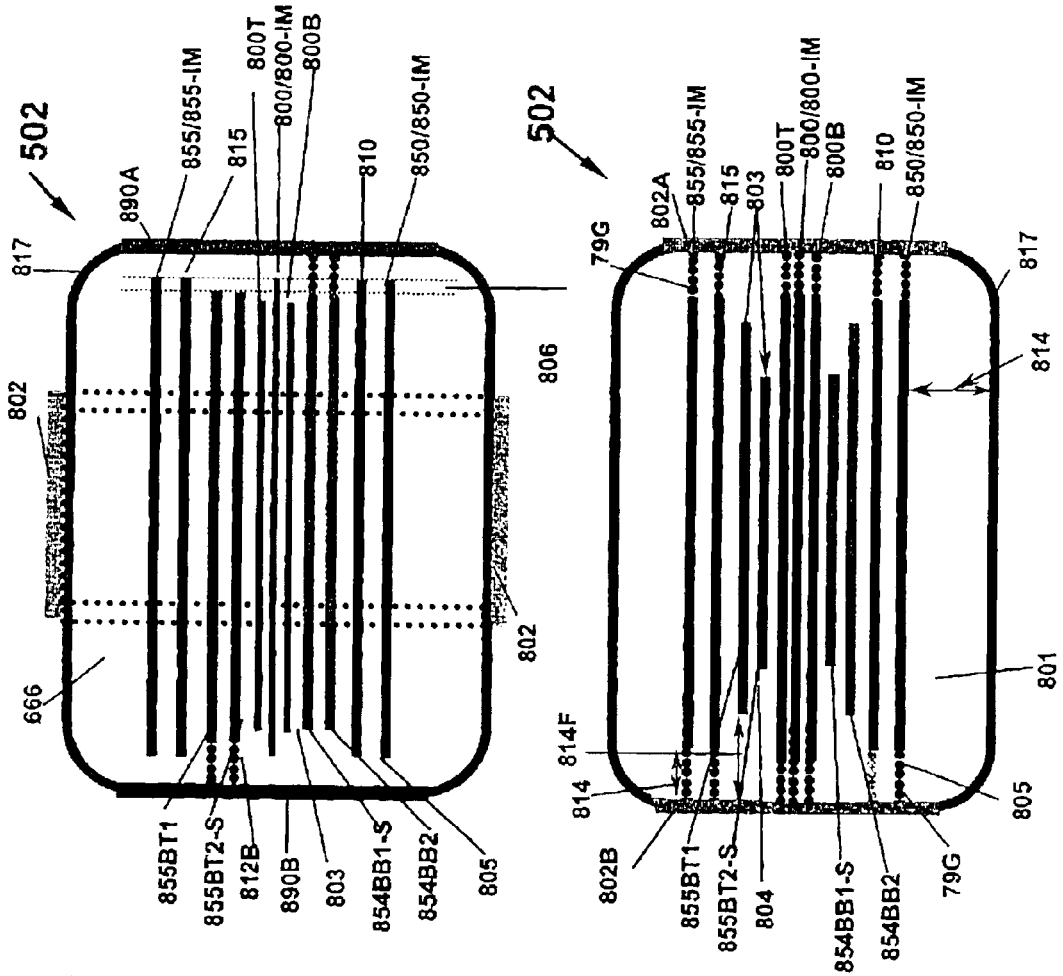

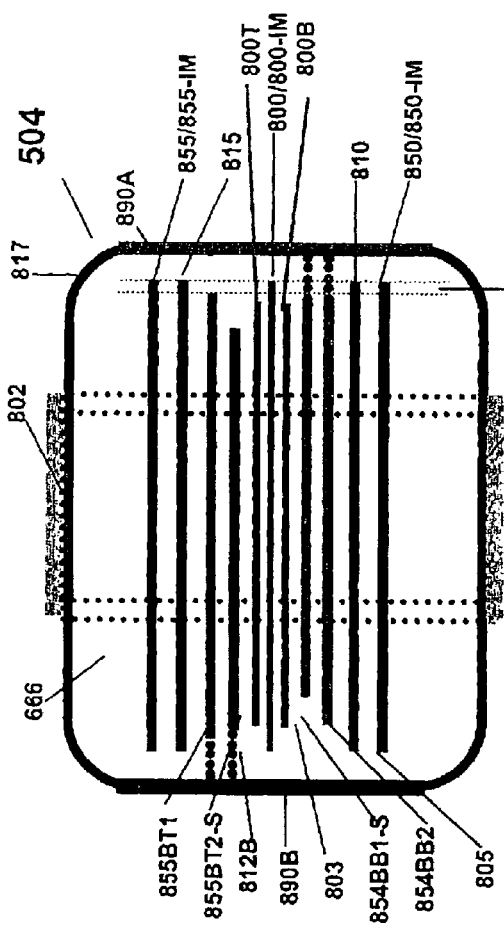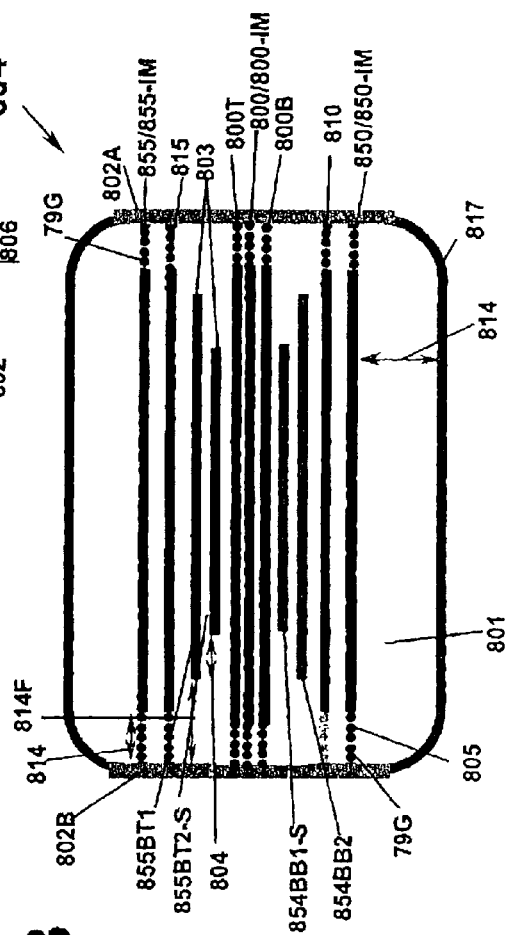
FIG. 11A
FIG. 11B

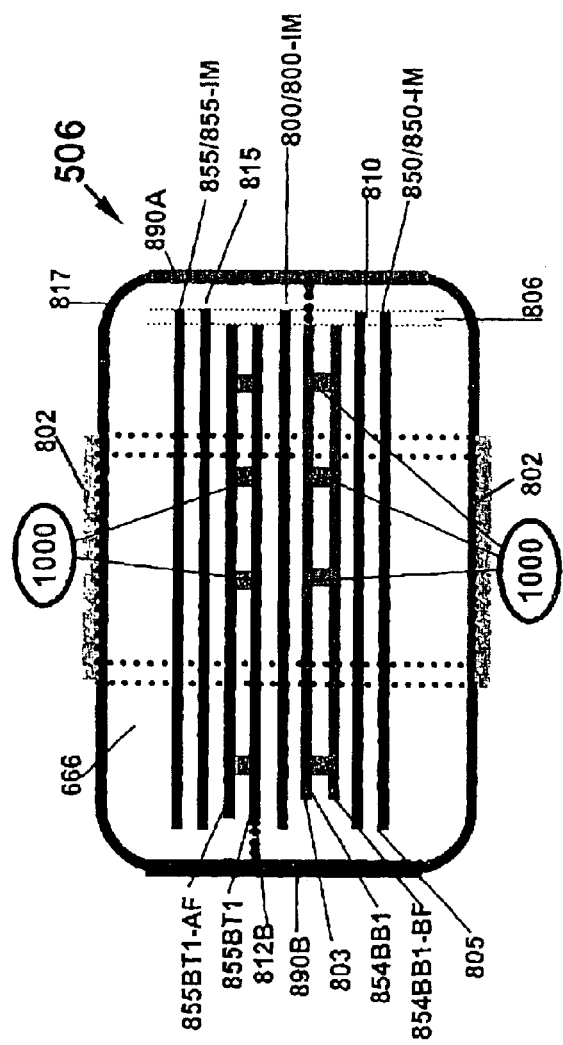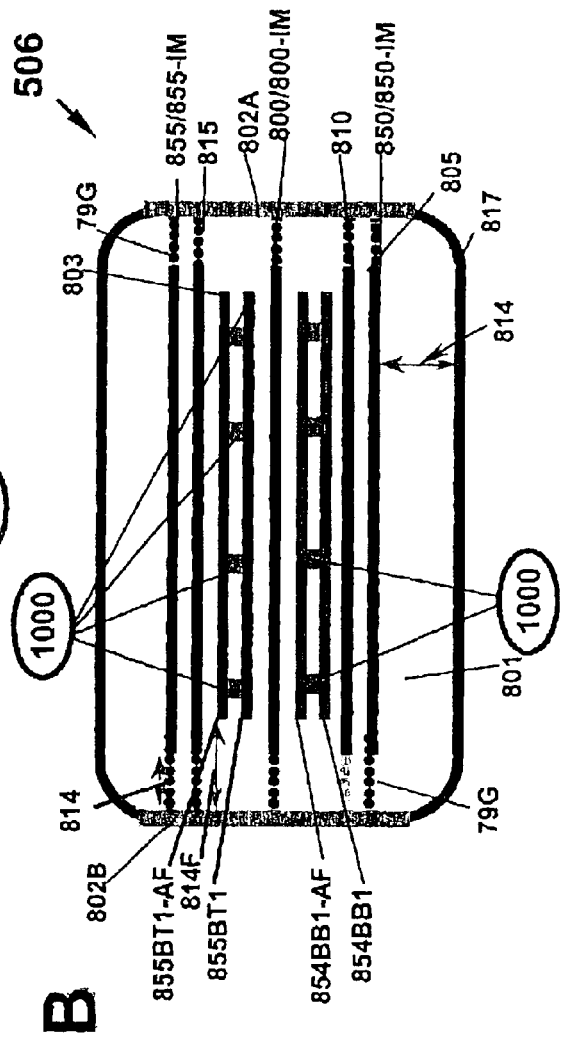
FIG. 12A
FIG. 12B

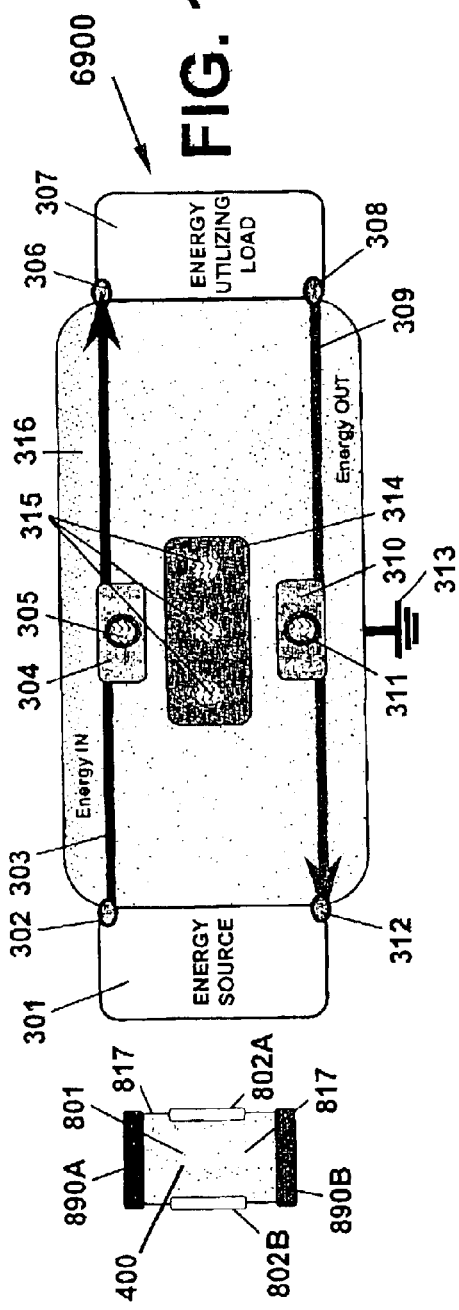
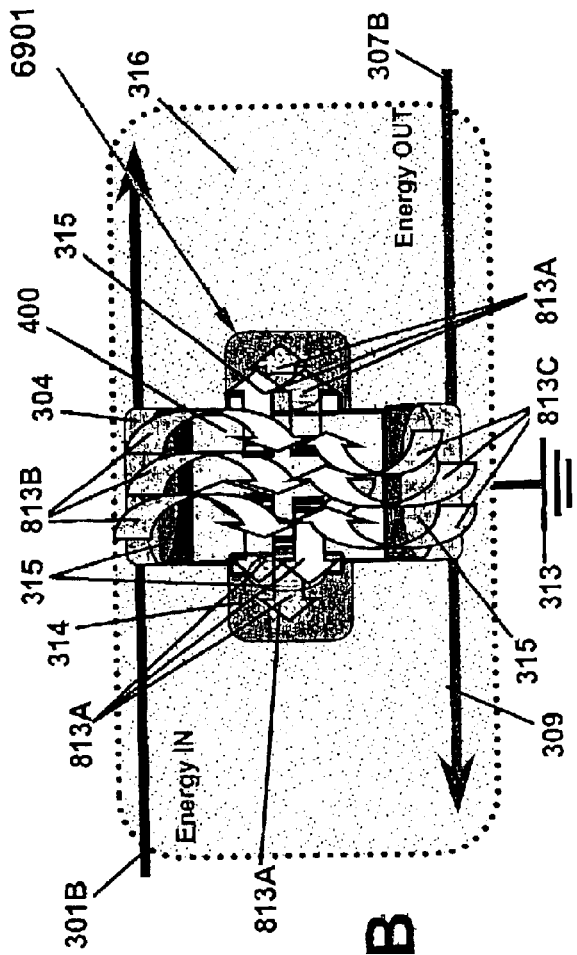
FIG. 14A
FIG. 14B

US 7,113,383 B2

PREDETERMINED SYMMETRICALLY BALANCED AMALGAM WITH COMPLEMENTARY PAIRED PORTIONS COMPRISING SHIELDING ELECTRODES AND SHIELDED ELECTRODES AND OTHER PREDETERMINED ELEMENT PORTIONS FOR SYMMETRICALLY BALANCED AND COMPLEMENTARY ENERGY PORTION CONDITIONING

TECHNICAL FIELD

This application is a continuation of application Ser. No. 09/845,680 filed Apr. 30, 2001, now allowed, which claims the benefit of U.S. provisional application No. 60/200,327 filed Apr. 28, 2000, provisional application No. 60/215,314, filed Jun. 30, 2000, provisional application No. 60/225,497, filed Aug. 15, 2000 and provisional application No. 60/255,818 filed Dec. 15, 2000. All of the foregoing applications are incorporated herein by reference.

BACKGROUND OF THE INVENTION

Today, as the density of electronic devices in societies throughout the world is increasing, governmental and self-imposed standards for the suppression of electromagnetic interference (EMI) and protecting electronics from that interference have become much stricter. Only a few years ago, the primary causes of interference were from sources and conditions such as voltage imbalances, spurious voltage transients from power surges, human beings, or other electromagnetic wave generators.

At higher operating frequencies, line conditioning of propagating energy portions using prior art componentry has led to increased levels of interference in the form of EMI, RFI, and capacitive and inductive parasitics. These increases are due in part to the inherent manufacturing imbalances and performance deficiencies of the passive componentry that create or induce interference into the associated electrical circuitry when functioning at higher operating frequencies. EMI can also be generated from the electrical circuit pathway itself, which makes shielding from EMI desirable.

Differential and common mode noise energy can be generated and will usually traverse along and around cables, circuit board tracks or traces, high-speed transmission lines and bus line pathways. In many cases, these critical energy conductors act as an antenna radiating energy fields that aggravate the problem even more.

In other energy conditioning areas such as for high frequency decoupling for instance, a novel and unique approach is to provide an invention that allows for predetermined and closely positioned parallel energy pathways or electrodes to operate dynamically in close proximity to one another to allow development of a low impedance energy pathway that will develop upon a third parallel energy pathway not normally considered as integral for energized circuit operations.

This third energy pathway is normally found to be electrically isolated from, but be found internally adjacent to, the electrically opposing differential electrode energy pathways or power/signal planes. This third energy pathway can also be utilized in one invention circuit assembly for multiple attachments as opposed to utilizing many, individual discrete low impedance decoupling capacitors, positioned in parallel within a prior art circuit assembly in an attempt to accomplish the same goal.

The present invention discloses a new predetermined embodiment that can be part of a predetermined circuit system to provide predetermined circuit protection and predetermined energy conditioning from various invention embodiments, invention assemblies, invention assembly circuit arrangements that will help also provide the current passive component manufacturing infrastructure with multifunctional energy conditioning structure that also allows an unprecedented ease of adaptability or production changeover as compared to the prior art.

SUMMARY OF THE INVENTION

The invention includes predetermined combinations of at least three, electrode groupings or grouped pluralities of electrodes. The three groupings include at least two groupings of complimentary oriented and positioned, shielded electrodes that are selectively or predetermined and interleaved between a third grouping of electrodes, which will operate as shielding electrodes, relative to the at least two groupings of complimentary oriented and positioned, shielded electrodes.

The three electrode groupings are arranged in a predetermined manner to be practicable for energized operations that will be practicable or operable to allow the creation of at least a dynamic energy pathway of low impedance or low impedance condition that can be operable along a portion of predetermined internal invention energy pathway portions and/or can be operable for a portion of predetermined, conductively coupled, common external conductive portion or pathway.

An external portion of a predetermined, conductively coupled, common conductive portion or pathway in conductively coupled combination with a predetermined physically balanced, amalgamated shielding, common electrode structure can be part of an electrically coupled portion of a predetermined circuit portion to complete a predetermined energy conditioning circuit network or predetermined energy distribution network, or circuit that aids active electronic componentry by creating balanced, electromagnetic actuated impedance states at energization with amalgamated, grouped pluralities of at least two complementary oriented but commonly comprised groups of same-sized shielded, complementary oriented, electrodes that are also arraigned in-part, by at least a predetermined manner to be practicable for energized complementary or differential electrical operations that allows for sustained, smooth energy portion conditioning as well as sustained, simultaneous electromagnetic emissions suppression of stray energy portions or parasitics that would normally be operable to disrupt predetermined energized circuit portions with electrical or dynamic discontinuities.

Accordingly, there has been found a need to provide an amalgamation of selected electrodes into multi-functional energy conditioning embodiment. These predetermined energy conditioning embodiments will be found comprising various electrodes each comprising an electrode, main-body portion with or without, predetermined electrode lead portions that are grouped and placed into relative to each other, both individually and as a part of a predetermined plurality of homogenous (not necessarily, in terms of material-types, composition), physically-configured, electrode groupings or a predetermined plurality of homogenous (not in not necessarily, terms of material-types, composition), physically-configured energy pathways, predetermined for combined, interposing positioning arrangements that includes other, predetermined conductive and non-conductive element portions that art also predetermined in advance to form a predetermined assembly or assemblies and variations.

It is an object of an invention embodiment to be able to provide to a user a layered, multi-functional, predetermined common electrode shield structure comprising conductive bypass pathways for portions of propagating energies that share a common and centrally positioned conductive pathway or electrode as part of its' larger, common, shielding electrode shielding structure that will allow for energy conditioning under predetermined arrangements, within an inclusive embodiment or embodiment variation that possesses a commonly shared and centrally positioned conductive pathway or electrode with a predetermined, main-body portion as part of its structure. It is an object of an invention embodiment to provide a multi-functional, common electrode shield and energy conditioning structure for electrode energy pathways which can take on a wide variety of multi-layered embodiments and utilize a host of dielectric materials, unlimited by their specific physical properties that can, when attached into circuitry and energized, provide simultaneous line conditioning functions and protections as will be described.

It is an object of an invention embodiment to be easily adapted to utilization the shielding electrode element that is operable for performing the electrostatic shielding function and third energy pathway function when energized and conductively coupled to a common conductive area or third energy pathway located external to the originally manufactured invention.

The layered, multi-functional, predetermined common electrode shield structure also provides electrical shielding to portions of propagating energy that will gather or be found near portions of electrode with predetermined, main-body portions' edges or edgings. A numerous multitude of arrangements can be built for the invention, such that these variants and configurations of the invention will only be disclosed as a fraction of a small portion of the possibilities, herein. The disclosure as provided reveals variations that can be implemented and built upon that would exploit many of the above objects and advantages of a typical invention embodiment as it has been envisioned by the inventor.

BRIEF DESCRIPTION OF THE DRAWINGS

FIG. 1A shows a top view of a portion of a cage-like electrode shield structure portion with a by-pass electrode of the present invention;

FIG. 2B shows cross-sectional view of the embodiment of the present invention of FIG. 2B taken along a longitudinal centerline between external electrode material connection portions;

FIG. 2C shows cross-sectional view of the embodiment of the present invention of FIG. 2B taken along a longitudinal centerline between external common electrode material connection portions and rotated 90 degrees with respect to FIG. 2B;

FIG. 3A shows a detailed plan view of a portion of a shielding electrode pathway portion depicting a typical spilt electrode configuration in accordance with the present invention;

FIG. 3B shows a detailed plan view cross-section of FIG. 3A depicting a typical spilt electrode configuration in accordance with the present invention;

FIG. 3C shows the a practicable balanced shielded electrode alignments viewed in accordance with the present invention;

FIG. 4 is a cross-section view of another embodiment of the present invention having a predetermined multi-electrode stacking sequence 399 with (2) differential, shielded propagational groupings, in combination with (1) common shielding electrode propagational grouping which comprises a portion of shielding electrode architecture 4000 of FIG. 1B, but without the sandwiching outer "-IM" electrode shields with single shielded electrodes depicting the versatility of the shielding structure with various set back zones and distances in accordance with the principles of the invention;

FIG. 5A is showing a exploded perspective view depicting an upper portion of alternative arrangement embodiment of FIG. 2A showing one sandwiching outer "NON-IM" electrode shield with internally coupled conductive structures disposed through operable as join with a smaller sized, electrode shield in accordance with the principles of the invention;

FIG. 5B is a cross-section view of multi-electrode predetermined stacking sequence of a shielding electrode architecture with differential shielded electrodes depicting FIG. 5A showing two sandwiching outer "-IM" electrode shields with internally coupled conductive structures disposed through operable as join with a smaller sized, electrode shield in accordance with the principles of the invention;

FIG. 5C is showing an exploded perspective view depicting two variations of portions of a differential shielded electrode arrangement that can be made from FIG. 2A in accordance with the principles of the invention;

FIG. 5D is showing cross-section view of multi-electrode predetermined stacking sequence of a shielding electrode architecture with differential shielded electrodes depicting one variation of the two variation portions of FIG. 6A utilized within a portion the shielding electrode structure of FIG. 2A using the single central shielding electrode with sandwiching outer "-IM" electrode shields in accordance with the principles of the invention;

FIG. 6A is showing a cross-sectional view taken along a longitudinal bisector between complimentary external electrodes depicting two variations of portions of a differential shielded electrode arrangement that can be made from FIG. 2A in accordance with the principles of the invention;

FIG. 6B shows the FIG. 6A view rotated to 90 degrees and viewed in accordance with the present invention;

FIG. 7A is showing an a cross-sectional view taken along a longitudinal bisector between complimentary external electrodes depicting a variation of the 3-energy pathway electrode arrangement of FIGS. 2A,2B and 2C, in accordance with the principles of the invention;

FIG. 7B shows the FIG. 7A view rotated to 90 degrees and viewed in accordance with the present invention;

FIG. 8A is showing a cross-sectional view taken along a longitudinal bisector between complimentary external electrodes depicting a variation of the 3-energy pathway electrode arrangement of FIGS. 2A,2B and 2C, in accordance with the principles of the invention;

FIG. 8B shows the FIG. 8A view rotated to 90 degrees and viewed in accordance with the present invention;

FIG. 9A is showing a cross-sectional view taken along a longitudinal bisector between complimentary external electrodes depicting a variation of the 3-energy pathway electrode arrangement of FIGS. 2A,2B and 2C, in accordance with the principles of the invention;

FIG. 9B shows the FIG. 9A view rotated to 90 degrees and viewed in accordance with the present invention;

FIG. 11A is showing a cross-sectional view taken along a longitudinal bisector between complimentary external electrodes depicting a variation of the 3-energy pathway electrode arrangement of FIGS. 2A,2B and 2C, in accordance with the principles of the invention;

FIG. 11B shows the FIG. 11A view rotated to 90 degrees and viewed in accordance with the present invention;

FIG. 12A is showing a cross-sectional view taken along a longitudinal bisector between complimentary external electrodes depicting a variation of the 3-energy pathway electrode arrangement of FIGS. 2A,2B and 2C, in accordance with the principles of the invention;

FIG. 12B shows the FIG. 12A view rotated to 90 degrees and viewed in accordance with the present invention;

FIG. 14A shows a circuit assembly or circuit arrangement practicable for maintaining simultaneous, electrical isolation of the 3 energy pathways and certain, energy portion confluences and interaction operable by dynamic operation as well as by a predetermined 'distanced' positioning, all of which are operable and relative to each other made practicable by utilizing an invention embodiment comprising a predetermined 3-energy pathway conductor arrangement as described herein, in accordance with the principles of the invention; and FIG. 14B is a closer view of invention circuit assembly or circuit arrangement of FIG. 14A in accordance with the principles of the invention.

DETAILED DESCRIPTION OF THE PREFERRED EMBODIMENT

Figure 1B:
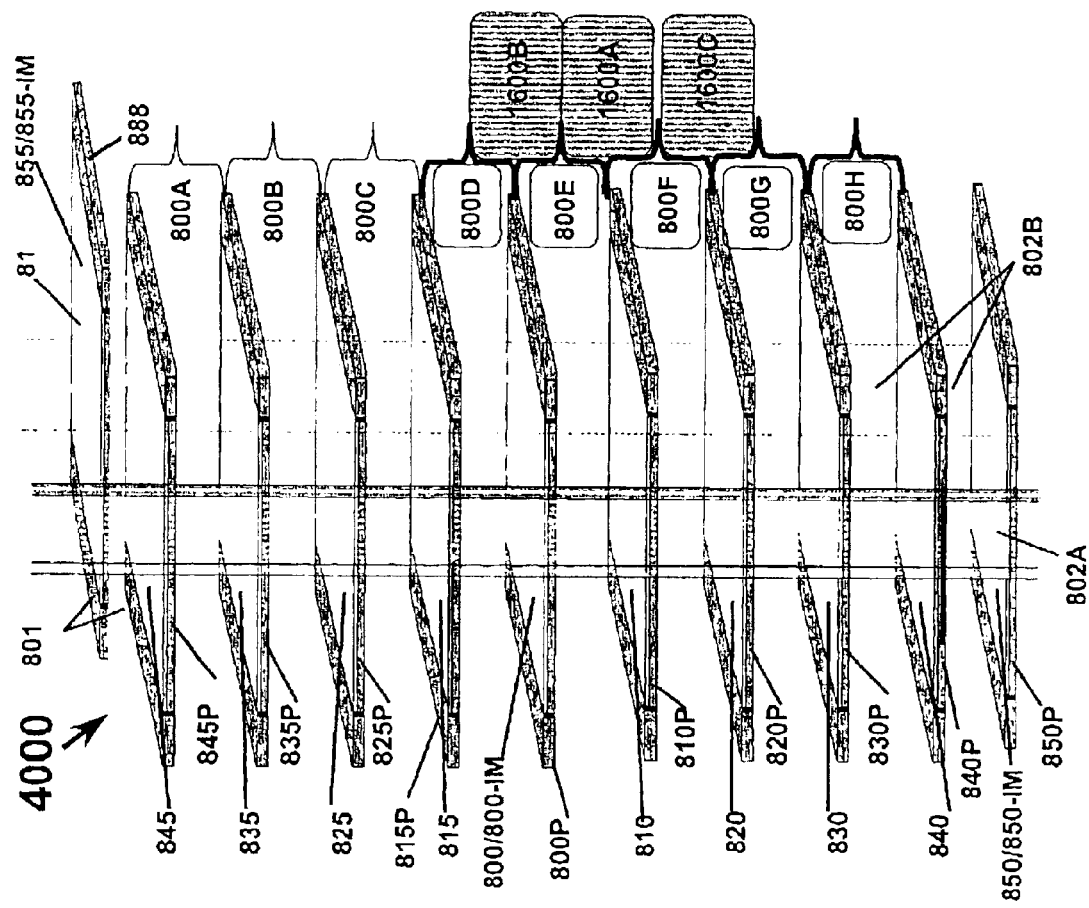
FIG. 1B shows an exploded perspective view of a portion of the present invention comprising predetermined, balanced groupings of internally positioned shielding common electrodes.

This application also incorporates portions of co-pending and co-owned U.S. Provisional Applications herein by reference including U.S. Provisional Application No. 60/200,327 filed Apr. 28, 2000, U.S. Provisional Application No. 60/215,314 filed Jun. 30, 2000, U.S. Provisional Application No. 60/225,497 filed Aug. 15, 2000, U.S. Provisional Application No. 60/255,818 filed Dec. 15, 2000, as they all relate in one form or another to continued improvements to this new family of multi-functional energy conditioners and shield structures for energy propagating circuits.

As used in this disclosure, the word predetermined is to mean among others, "to determine, decide, or establish in advance" "influence or sway toward an action" "predisposed" "to determine or decide something in advance" or any evidence "that would point out through common sense or forensic investigation or records to a fact or substantial assurance to a reasonable person that an action or an assembly of the invention elements had required a human thought process before an invention structure or action had took place or even will take place"

A predetermined, universal shielding electrode architectures' "interrelational-matrix" arrangement that comprises at least a predetermined stacked, parallel and aligned, grouping of conductively coupled, shielding electrodes comprising at least a main-body portion 81, each is disclosed. This is a common, shielding electrode structure formed as an interrelational-matrix static structure that becomes a full and symmetrical, hierarchy progression in dynamic operations as part of a predetermined element combination.

The universal shielding electrode (conductor) architectures' stacked, parallel and aligned, groupings of conductively coupled, shielding and containment structures further comprises a balanced predetermined, grouping of homogenous, interconnected, common, shielding electrodes each with a main-body portion 81 with predetermined shaped surfaces, of which a main-body portion 81 can also comprise or include common, shielding electrode lead attachment portion(s) 79G that are operable to allow further operable attachment or conductive coupling with either, other, predetermined conductive material portion(s), that are in-turn, each (the predetermined conductive material portion(s)) are also operable for shielding electrode lead attachment portion(s) 79G as practicable, themselves, for further conductive coupling to predetermined portions for predetermined electrical circuit coupling or to predetermined intermediate conductor portions or just direct energy pathway portions for predetermined electrical circuit coupling, all for eventual, predetermined energized or dynamic, operations.

The universal shielding electrode (conductor) architectures' stacked, parallel and aligned, groupings of conductively coupled, shielding and containment structures can be combined by at least a sequenced, predetermined manufactured operation as will be described. The invention can also comprise a predetermined balanced amalgamation of a stacked, parallel shielding electrode arrangement and alignment that is formed, at least in-part as a relative, 3-demensional offset/outset or inset predetermined positioning arrangement of the various predetermined shielded and/or fully shielded, complementary positioned, predetermined and same-size, portions of paired, shielded electrodes with main-body portion 80, each, that are symmetrically arranged respective to each other operable for common predetermined, complementary alignment.

These shielded electrodes with main-body portion 80, each are also operable for mutually covering, registration or stacked alignment arrangement to each other that allows for these complementary positioned, predetermined and same-size, electrode, main-body portions 80 of the paired differential electrodes to be complementary, in an electrically dynamic operational circuit, as well.

These complementary arranged pairs(s) of shielded electrode main-body portion 80s are all at least practicable to be arranged by predetermined manner to operable in the range to be at least fully shielded or a fully shielded in terms of their main-body portion 80 relative to each other as well as relative to the predetermined, shielding electrodes with at least main-body portion 81 and their full range of shielding of the differentials from other external energy, not of the paired differential electrodes when energized into a circuitry by predetermined manner.

In a fully shielded, static state, a portion of the predetermined, universal shielding electrode architecture is operable to physically shield or provide a shielding function in order to either fully isolate and immure these predetermined paired, differential, shielded electrode main-body portions 81 as they still maintain a full symmetrical relationship to each other within a shielding coverage of the predetermined, universal shielding electrode architectures' "interrelational-matrix" arrangement comprising at least a predetermined stacked, parallel and aligned, grouping of conductively coupled, shielding electrodes comprising at least a main-body portion 81, each. The predetermined shielding and/or fully shielding electrodes are conductively coupled and will be operable together as a single conductively connected structure that is practicable for an electrically common voltage potential at energization.

Declarations stating 'cancellation' or 'suppression' mean in the ordinary sense of the understanding of the typical manufacturing tolerances in mind, in-terms of the invention or variant, structures shapes, and sizes. Other uses of the words such as 'same-time, same size, same sized, identical, equal, equal-sized', etc. should be understood with the preciseness of the real world as to the words relied upon for an explanation which is all bearing upon the general understanding as to what is considered a 'normal' and a 'standard', especially to what is as practical for manufacturing tolerances or as normally practiced manufacturing within the state of the art for the various OEM's who will actually construct the invention or its' variants described herein. The acronym term "AOC" will be used for the words, "predetermined area or space of physical convergence or junction" refers to both, to discrete or non-discrete versions of an invention or variant and can be defined as the general recognized physical boundary of predetermined manufactured-together invention or variant elements.

The acronym term marked as AOI, 69-AOI within the drawings and text will be used for the words "the predetermined or designated for three-dimensional area(s), locals, or predetermined zone(s) within an invention or variant, that is practicable for sustaining preferred electrically opposing, mutually complementary energy portion confluences and interactions" when an invention is configured with by-pass electrode structures.

The acronym term marked as 806 or 806"X" within the-drawings and text will be used for the words "the predetermined or designated for three-dimensional boundary zone(s) or area(s), locals, or predetermined zone(s) within an invention or variant, that is practicable as an additional parasitic barrier that separates areas practicable for sustained electrostatic shielding along a setback portion or predetermined setback portion or portions of differential electrode main-body portion 80 perimeter edges that could be operable to or for disruption of energy parasitics when an invention is configured with by-pass electrode structures and under goes energy propagations as opposed to areas that will allow energy parasitic entry or escape in a region not comprising an 806-AOI (as just described) and which will be designated or described later.

Accordingly, at least one predetermined manufacturing process can be utilized to create an invention will result in a sequentially positioned formation of relatively positioned (to each other) groupings of electrodes made into an amalgamated electronic structure comprising balanced groupings of predetermined energy pathways or electrodes. The predetermined amalgamation of selected electrodes are formed in-part, by at least a predetermined, sequential manufacturing operation that has normally occurred before actual and final placement into an application for energization. During a manufacturing operation at least one repetitive sequential step of invention or variant, element amalgamation will take place when these manufacturing operations are the result of automated operations to manufacture at least a two or more invention units in one location, sequential manufacturing process of the invention either in a building location where layering of the invention has already occurred or if practicable or operable in another area or building location found anywhere else in the world practicable for a manufacturer or owner of the materials at that moment before ½ of any 500 units that are layered sequentially during a 7 day time period.

Rather than produce a deluge of the repeated uses of the words "predetermined manufacturing sequential placement", "pre-selected manufacturing sequential placement", it will be stated that substantially all of the various electrodes that comprise the invention, should be disclosed to have had at least a two part, predetermined manufacturing sequential placement creating a portion of an eventual AOC of the invention preformed. This means that a placement of certain numbers of a groups of various electrodes element groups is repeated at least twice within an hours' period when manufacturing or making at least one invention or variant, unit.

Specifically, related to the words "predetermined manufacturing sequential placement", "pre-selected manufacturing sequential placement", for example, a timing of manufacturing of the invention is disclosed which will begin with the placement of a first shielding electrode created for final amalgamation as part of a first invention units' AOC.

Immediately following placement of the first common for use as part of a first invention or variant, unit, directly after that point in time, a one-hour period begins. At least a second, shielding electrode will be will be created for final amalgamation for use as part of a first invention or variant, units' AOC within at least a one hours' time of the placement of the first shielding electrode.

This axiom is good regardless of the number or kinds of other, final electrode elements utilized as part of a first invention or variant, units' AOC that are positioned or placed in-between or within, both from a positioned, or deposited standpoint, adjacent to the first shielding electrode as described above. This includes or kinds of material elements, final electrode elements utilized during that one hour time window that started in the manufacturing process for the subsequent positioning of the second shielding electrode. With this EMI filtering ability, the invention will also provide predetermined types of surge protection for circuitry attached between a source and an energy utilizing-load. The predetermined amalgamation of selected electrodes are formed in-part, by at least a predetermined, sequential manufacturing operation that has normally occurred before actual and final placement into an application for energization. During a manufacturing operation, at least one repetitive sequential step of invention element amalgamation will take place when these manufacturing operations are the result of automated operations to manufacture at least a two or more invention units in one location.

In arrangements of the shielding electrode cage-like structure or portions, balanced groupings of predetermined and internally positioned electrodes can also create specific predetermined, shielding electrode architectures using a stacked hierarchy progression that can be observed statically as an arrangement of predetermined elements that are found to be positioned both, complementary and/or equally in amounts on one, of two, larger, symmetrical and parallel sides comprising material, disposed or formed as the shielding electrode's, two, main-body portions 81 of a centrally positioned, shielding electrode 800/800-IM that serves as the predetermined physical, sharing point, dividing zone, fulcrum or balancing point for equally divided remaining portions of not only a plurality of the shielding electrodes comprising the predetermined shielding structure but all the other Inventions' predetermined material elements located within an invention predetermined AOC.

Specifically, the invention and/or variations of the invention will utilize the other various predetermined common shielded electrodes, each comprising 799 material, and disposed or formed with an electrode, main-body portion 81 in a predetermined placement positioning and alignment normally to be dispersed and found on either side of the centrally positioned shielding electrode 800/800-IM, all equally divided and arranged in a balanced and predetermined physical positioning whether as described in this disclosure or not, within an AOC structure.

Predetermined placement or selective positioning of various paired same-size, shielded electrodes each with at least an electrode, main-body portion 80, or differential electrodes that results in what appears to be an oppositely positioned same or duplication figure as the original figure (or its reverse-mirror image) that could be called a complementary symmetrical positioning. Such symmetrical positioning includes reflected or rotated translation as well. Above all, the pairing operations yield a symmetrical electrode arrangement that can be considered a balanced electrode symmetrical design, as one will find with the invention or its' variants in most complementary energy interactions that are described as dynamic events, that are in complementary balance, by symmetry, mainly of the energies propagating along the various differential electrode pairings and common, shielding electrodes are happening simultaneously, due to many reasons.

Among these reasons as noted, comprise the same-sized, or complementary, reverse-mirror image positioning orientations of the various symmetrical parings of differential, shielded electrodes. It is important to note that for a shielded electrode to be in a reverse-mirror image positioning orientation with a mate, the electrode structure called out includes the respective electrodes' whole portion, including main-body portion 80, plus any electrode lead portion(s) 812"X", extending, therefrom.

Another of these reasons as noted, comprise the common, shielding electrodes and their same-sized portion, as well as a predetermined, aligned perimeter mirror image positioning orientation of the units. It is noted that a shielding electrode can not be found in discernable position to the naked eye in a 'reverse-mirror image positioning orientation' with any mate, because as noted, the electrode structure includes each respective electrodes' placed and coupled together as a whole, including main-body portion 81, plus any electrode lead portion(s) 79G, which form an electrode were all portions stacked, coupled and commonly aligned, share total perimeter edge alignment as they are operable to form the single shielding, electrode structure as one unit.

The invention and/or variations of the invention or variant, will also comprise predetermined conductive structures, electrode lead portions like, 79G or 812"X", electrode termination elements or other conductive material portions, like 802"X" or 890"X", 809"X", etc. that are practicable for predetermined invention to predetermined circuitry attachment of these various conductive portions of the invention, to any number of various predetermined external (to the invention) energy pathways that will create what is considered an unenergized, predetermined circuit assembly or one that later becomes an energized circuit assembly. Before energization, predetermined circuit portions can also include predetermined circuit portions comprising the invention and/or variations of the invention are practicable to be made operable by combination and conductive coupling to predetermined external portions.

In by-pass arrangements, balanced groupings of predetermined and internally positioned, shielding electrodes, each electrode being comprised with at least an electrode, main-body portion 81 used to create a predetermined, shielding, electrode architecture using a stacked, electrode, main-body portion hierarchy progression that can be observed statically as an arrangement of predetermined elements that are found to be positioned both, complementary and/or equally in amount on one of two sides of a centrally positioned common, shielding electrode that serves as the apparent physical fulcrum or balancing point for these equally divided portions of material elements.

Predetermined, equal integer numbers of both predetermined same-size, shielded electrodes each with at least an electrode, main-body portion 80, or differential electrodes as well as equal numbers of same-size, shielding electrodes each with at least an electrode, main-body portion 81, will normally be found on either side of a centrally positioned, shielding electrode that serves as the divider or line of balanced portions of equal interspersed numbers of these two groupings of different sized electrodes divided and arranged in a predetermined, balanced physical positioning that can include mirror image positioning and or in some cases, as reverse-mirror image positioning of paired same-size, shielded electrodes each with at least an electrode, main-body portion 80 that are described as being disposed, but separated, as a pair or pairings such that their electrode, main-body portion 80 are shielded, segregated or separated, and considered to be sandwiched between and within a stacking of at least two larger, electrode, main-body portion 81 of the similarly sized shielding electrodes within the over all invention or variant structure.

The invention and/or variations of the invention can also comprise predetermined conductive structures, electrode main-body portions, electrode lead extension electrode termination elements or conductive portions that are practicable for predetermined circuitry attachment of these various conductive portions of the invention itself to any number of various predetermined external (to the invention) energy pathways that will create what is considered an unenergized circuit assembly. Before energization, predetermined circuit portions can also include predetermined circuit portions comprising the invention and/or variations of the invention are practicable to be made operable by combination and conductive coupling to predetermined external portions.

The invention is also disclosed as operable for both discrete and non-discrete structural embodiment versions and circuit assemblies where at least one pair of same-sized, complementary electrodes that are reversed-mirror images of each other are selectively positioned by predetermined manner on opposite sides of a common, shielding electrode energy pathway with respect to each other. The central, shielding electrode along with any other of the Invention's energy pathways can also be considered in some instances to be an electrode substrate, conductive material deposit, result of a etching away of non-conductive material to reveal conductive material, the result of a doping process that makes a normally poor or nonconductive material portion conductive for energy propagations, but in any embodiment all elements or results of a process could potentially be considered to serve as a central isolating barrier that is interposed physically and in most cases, electrically (when energized) between each same-sized, complementary electrodes of the paired same-sized, complementary electrodes or any of any other of the Invention's energy pathways or electrodes that creates an invention.

The advantage of providing same-sized, complementary electrodes for those energy pathways requiring filtering enables the new energy conditioning filter to be constructed with conventional materials that is economical for the many possible variants of the present invention that can be construed.

An invention will also provide for closely positioned internal parallel energy pathways of the invention to operate dynamically, in close proximity to one another, to allow development of a low impedance energy pathway or blocking function that develops upon or along another common and parallel energy pathway or amalgamated common, shielding electrode structure that is not normally considered as integral for energized circuit operations or its (the circuits') completion or maintenance for electrical operability.

This third but common energy pathway can be found both internally within the invention as well as adjacent to the electrically opposing differential electrode energy pathways or power/signal planes and can be utilized in at least one invention variation or device for certain predetermined circuitries or bus lines as opposed to utilizing many, individual discrete low impedance decoupling energy conditioners or capacitor/resistor combinations that are positioned in parallel within a comparable circuit system in an attempt to accomplish the same goal such as high frequency decoupling.

This invention is intended to allow for an ability to minimize, suppress or filter unwanted electromagnetic emissions resulting from differential and common mode currents flowing within electronic pathways that come under an invention(s) influence both internally, with parallel complementary aligned and positioned electrodes, as well as in combination with externally coupled and positioned circuitry portions, all in accordance with the present invention.

The invention, when energized, will also allow both the fully contained or contained and oppositely paired differential energy pathway electrodes to function with respect to one another, in balance, yet in an electrically opposite, complementary manner.

The invention can also comprise an arrangement of same-sized, complementary electrodes into a shielding or fully shielding common, shielding electrode structure combines to form a new filter assembly. An arrangement of various conventional materials elements, same-sized, complementary electrodes, common electrodes or shielding electrodes that are conductively connected to each other, as well as the predetermined selective positioning process, final amalgamation, attachment and circuit coupling can also be considered as at least one invention variant. The usage of predetermined and selective decisions as to the various nonattachment and non-coupling of certain whole elements or portions of elements, such as same-sized, complementary electrodes, as well as the common, shielding electrodes to one another or not, can also be considered as at least one invention variant.

Portions of this third, but common energy pathway for a circuit arrangement assembly comprising the by-pass architecture invention, can be found both internally within an invention, as well as portions can be found positioned almost physically, against, but adjacent with an interposing material insulator or material with predetermined properties 801 as a buffer to the electrically opposing same-size, shielded electrodes, each with at least an electrode, main-body portion 80, or differential, shielded electrode energy pathways or power/signal planes. Portions of this third, but common energy pathway can be utilized in conjunction with at least one invention circuit arrangement assembly variation or device for certain predetermined circuitries or bus lines that are utilizing two other non-common energy pathways or differential, shielded energy pathways (not shown).

This three separate energy pathway energy network or energy distribution network concept used with a single, self-contained electrode arrangement is opposed to the prior art, which often is utilizing many, individual discrete low impedance decoupling energy conditioners or capacitor/resistor combinations that are positioned in parallel within a comparable circuit system in an attempt to accomplish the same goal such as high frequency decoupling provided by a predetermined circuit arrangement assembly.

Turning to FIG. 1A, and FIG. 1B, portions of predetermined, cage-like shielding electrode structure 4000 in FIG. 1B and are shown in detail in FIG. 1A and FIGS. 2A, 2B and 2C and accordingly, discussion will move freely between FIGS. 1, 2A and 2A, 2B and 2C to disclose the importance of the predetermined, universal shielding electrode architectures' "interrelational-matrix" arrangement comprising at least a predetermined stacked, parallel and aligned, grouping of conductively coupled, shielding electrodes comprising at least a main-body portion 81, each. Conductively coupled together, shielding electrodes with main-body portion 81, as well as any electrode extensions 79G that are of those shielding electrodes will be stacked by predetermined sequencing to comprise a single, common shielding electrode structure like that of embodiment portion 4000, used for a dynamic function of electrostatic shielding and suppression of portions of energy parasitics during energized operations.

In FIG. 1A, element 806 is shown as the distance or 3-demensional area of inset and positioning that is normally predetermined as the common relative distance utilized during manufacturing to accommodate the needed insetting of the smaller electrode, main-body portion 80 of the shielded electrodes like that of 854BB and it's main-body portion 80, substantially within the registration, or area, or surface area of the larger electrode 800/800-IM's main-body portion 81, which is also noted as the key and centrally positioned shielding electrode.

Element 814F is the predetermined distance or 3-demensional area of inset and positioning of shielded electrode 854BBs' main-body portion 80 from the embodiment edge 817 of the whole embodiment portion 4000. Element 814 is the predetermined distance or 3-demensional area of inset and positioning of centrally oriented, aligned and positioned, larger shielding electrode designated herein as 800/800-IMs' own, main-body portion 81 from the edge 817 of embodiment portion 4000.

The inset and positioning of whole shielded electrode 854BBs' main-body portion 80 and later defined electrode lead portion 812A or generally as 812"X", is relative to its position to the predetermined position of shielding electrode 800/800-IM position in an AOC as a result of a predetermined, manufacturing operation or sequence result. This predetermined, manufacturing operation or sequence result comprises a static predetermined electrode groupings comprising shielded electrodes and shielding electrodes.

A shaped material portion designated as 800P comprises at least a portion of material 801 comprising predetermined properties also practicable for receiving electrode material or at least made practicable for energy portion propagation by a predetermined process such as a chemical doping or a other predetermined combination doping process or predetermined steps involving predetermined processes that leave a resulting predetermined area at least operable for conductive operations upon a material portion comprising predetermined properties.

The predetermined electrodes, 800/800-IM and shielded electrode 854BB are shown in FIG. 1A already disposed upon or coupled to material portions with predetermined properties 801 designated as 800P and 854BB-P (not shown), and were done as to better disclose certain aspects of the final structure combination. This is not to say that the orientation, alignments or positions laid out as depicted should be conceived to be the only type of layout of the final amalgamation of the invention that is possible.

On the contrary, FIG. 1A represents a fraction of the innumerable possible layout combinations of a final amalgamation of an invention as long as predetermined orientation, alignments or positions relationship rules are maintained, almost anything is practicable in terms of a final predetermined amalgam result of predetermined electrode combinations with other predetermined material portions or predetermined elements.

For a configuration as shown in FIG. 1, the whole, planar-shaped, shielded electrode 854BB comprises at least one electrode portion designated as an electrode lead portion 812 or electrode extension 812, which is found to be co-planar with the main-body electrode portion 80 of shielded electrode 854B. Electrode lead portion 812 or electrode extension 812 is normally disposed or formed contiguously with the main-body electrode portion 80 by at least predetermined manner.

Conductive-shielded electrode or shielded electrode 854BB is sandwiched between central larger, shielding electrode 800/800-IM and larger, shielding electrode 815 (not shown). Larger (this relationship is always relative to and between the two groupings of electrodes larger shielding electrode verses smaller shielded electrodes described herein), shielding electrodes 800/800-IM, and 815 are all separated from each other by a general parallel interposition of a material 801 with predetermined properties as well as between the other 800D shielding electrodes relative position to any shielded electrodes, respect position to the central larger, shielding electrode 800/800-IM and shielded electrode or energy pathway 854BB that feature a shielded electrode such as electrode 854BB with a main-body electrode portion 80 almost completely inset and immured within the two sandwiching coverage of both shielding electrode 815 and 800/800-IM, respectively that are sandwiching shielded electrode 854BB in this case, above and below, within the invention. The electrode lead portion 812 or electrode extension 812 is normally practicable to be oriented, aligned and positioned in a relative distance relationship as part of the whole, shielded electrode 854BB and can be utilized by when at least the smaller sized electrode, main-body portion or portions 80 of the shielded electrode 854BB is physically inset within at least one predetermined distance or area portion designated as at least 806 or 806-AOI. This relationship of inset would also be comprise within predetermined amalgamation portion of at least two same-sized (to each other) coupled common together, shielding electrodes with at least a main-body portion 81 each.

Shielded electrode 854BB also comprises at least two additional contiguous (but, not necessarily, adjacent) portion(s) or electrode leads 79G or electrode extensions 79G, which in this case, are found as positioned by predetermined manner, directly opposite each other, to either of the North/South sides (relative per the standard page orientation of the Top being North and the bottom the South) of shielding electrode 800/800-IM or with the coupling electrode material portions 802A and 802B.

At least one of 812s' conductive edge portion(s) (not shown) of electrode lead portion or lead extension 812 further comprised of the smaller sized shielded electrode 854BBs' main-body electrode portion 80 is operable for at least one conductive edge portion (not shown) practicable for at least one eventual, predetermined electrical circuit coupling or conductive connection attachment (not shown).

This at least one, 812 conductive edge portion will be operable for at least one eventual, predetermined electrical circuit coupling or conductive connection attachment (not shown) that is normally located beyond a predetermined boundary portion 805 or predetermined perimeter portion 805 or a grouping edge portion 805 comprising the commonly aligned electrode edge portions of at least a predetermined stacked and parallel grouped, electrode, main-body portion 81s (not all shown) of the predetermined coupled, shielding electrodes such as 854BB.

Because the smaller sized shielded electrode 854BBs' main-body electrode portion 80 (but for the 812 electrode lead portion) is position inset or immured within the area registries or sandwiched area or space by both shielding electrodes 800/800-IM and 815s' (not shown) electrode main-body portion 81s shielding electrode material 799, when shielded electrode 854BB is conductively coupled to conductive material portion 890A and amalgamated with at least two other predetermined shielding electrodes, the grouping will comprises at least a portion of a 3-demensional static area or space operable as 69.

The shielding amalgamation is practicable as a single conductive structure and when, in-combination with predetermined coupled connections, to perform a combination static and dynamic shielding function operable during energized operation upon portions of energy propagating along portions of at least one predetermined pair of same-sized, complementary orientated, positioned and parallel, stack shielded electrodes, each.

This combined static and dynamic shielding function is performed by a predetermined, amalgamated, shielding electrode structure when the inset, shielded electrode pair combinations receive a static portion of the shielding function at all times as the single, electrically common structure, specifically, and occurs in an at rest state by its static, immuring or containment, physically upon substantially all of a main-body electrode portion 80 of any shielded electrode found within a typical conditioner like 400.

An exception would be a small shielded electrode portion (not numbered) transitioning into the predetermined electrode lead portion 812"X" that is practicable for conductive electrical connection at a point found beyond the outside perimeter, co-planar to the lead 812"X"s main-body electrode portion from which it is integrally coupled.

A predetermined electrode lead portion 812"X" could be to be aligned up to or against the imaginary inside perimeter of the 806 area or space as a transition portion (not numbered) becomes defined generally as now beyond the 806 portion which is normally defined as area or space located between or within, an average of the alignments

2500 of a predetermined cross section comprising both shielding and shielded electrode portions, readily definable, or just predetermined cross section a common alignment of the shielding electrodes' main-body electrode portion 81 edges and the common alignment of the shielded electrodes' main-body electrode portion 80 edges that together, help define a portion of the 806's 3-demensional perimeter within the shielding structure 4000 portion common 805.

69 is also operable predetermined in a dynamically operating predetermined circuit assembly portion as 69/AOI within an invention AOC operable as a contiguously and integrally comprised portion dynamically created within the predetermined amalgamation portion of AOC comprising at least three same-sized (to each other) coupled common together, shielding electrodes. Arrows 813A and 813B depict various energy propagation movements.

The contiguously and integrally comprised portion 69/AOI dynamically created operable within an invention AOC is always found to be within the smaller designated area relative to that total designated area a portion of which can be demarcated by at least physical, predetermined boundary 803 or a physical, predetermined perimeter portion 803 or a physical, grouping edge portion 803 of a shielded electrode like 854BB and its' main-body portion 80.

For coupling to an un-contiguously disposed or formed conductive portion like 890A, 802A and 802B or one not shown located coupled to portions of edge 817, respectively, these predetermined electrodes 854BB and 800/800-IM are positioned in a substantially parallel manner relative to each other by a desired or a needed predetermined result to be operable to these other conductive material portions like 890A for shielded electrode 854BB by way of electrode lead portion 812 and to another conductive material portion like 802A and 802B for the central shielding electrode 800/800-IM by way of electrode lead portions 79G's, respectively.

Electrode lead portions 79G's can be conductively coupled to conductive material portions, 802A and 802B, respectively, and electrode lead portion 812A can be conductively coupled to conductive material portion 890A, all respectively.

Application sequence of the conductive material portions 890A, 802A and 802B are not critical as compared to at least a stacking of electrodes manufacturing run, and can be applied or deposited or conductively couple at a later time or under a separate conductive coupling process that at least leaves the (2) 79Gs electrode portions and the 812A electrode portion conductively attached to conductive material portions 802A, 802B and 812, respectively, operable for eventual electrical operations.

For predetermined, non-discrete embodiment portions, for example, not shown, lectrode lead portion 812 is practicable for conductive coupling with, or such as but not limited to at least a conductive material portion or structures not shown but any circuit portion coupled connection that is predetermined for a specific coupling to an electrode portion practicable for using the invention embodiment in a predetermined manner.

(It should also be noted that the preceding defined placements were subject only to this drawing for aiding in disclosure understanding and that north, South East and West are drawing location aids ONLY and that this drawing, as are the rest of the disclosures are depictions only to aid one skilled in the art for understanding. It is the applicants true preference for a disclosure without drawings, but it is done here as a concession to others. These drawings and locations called out are present as graphics and are not and can not be taken by the reader as to scale or construed as such, for determining any sort of quantifiable measurement result, made, attempted or contemplated as anything but a rough drawing.) A shielding electrode's main-body portion 81 is not limited to just two electrode extensions 79G, but normally with a discrete multi-layered non-holed chip-embodiment will comprise at least a paired, contiguous (but, not necessarily, adjacent) portion(s) or electrode leads or electrode extensions 79G. There are exceptions, such as a contiguous common, shielding electrode extension 79G found in some hole-thru embodiment portions of commonly-owned copending invention variations performing propagations of energy (not shown) and is allowed.

Shielded electrode's main-body portion 80 is also not limited to just one electrode 10 extension 812A as an axiom as far as this position for at least contiguous (but, not necessarily, adjacent) portion(s) or electrode leads or electrode extensions 812s and a predetermined configuration needed as such is always contemplated.

Each of these electrode lead 812, 79G or electrode extension 812, 79G is made of the same electrode material 799. These leads 812, 79G are simply an extension of the same electrodes and their main-body portions 80 and 81, respectively, of electrodes like that of shielded electrode 854BB and 800/800-IM, respectively all integral to a monolithic or contiguous format with each respective electrode, main-body portion 80/81.

At least one pair of contiguous (but, not necessarily, adjacent) portion(s) or electrode leads or electrode extensions designated 812A and 812B are both practicable for conductive connection for future energized operation by operable coupling or electrical connected or are eventually conductively or electrically coupled to external terminal electrodes or electrode terminal material portions 890A and 890B for further conductive attachment (not shown) into predetermined circuitry by soldering or other commonly used conductive attachment manners like resistive fit or tension fit by conductive material portions operable for such functions, respectively, in the case of discrete versions.

In addition, a non-discreet version of the invention embodiment portion, although not shown, could easily be fabricated in silicon and directly incorporated into integrated circuit microprocessor circuitry or chips. Integrated circuits are already being made comprising capacitors etched within the silicon die or semiconductor die or silicon foundation, which allows the non-discreet versions architecture of the present invention to readily be incorporated with technology available today. Non-discreet versions of the invention can use a coupling of electrode lead or electrode extension(s) 812 from the shielded, electrode, main-body portion 80 for the active by-pass electrode pathways to be operable or practicable for conductive amalgamation of the various predetermined active circuitry pathway(s).

For extension, 812A of the predetermined shielded electrode 854BB, at least predetermined one portion is operable for coupling to at least one of two predetermined differential conductive portions of a predetermined circuit pathway located between a predetermined energy source and a predetermined energy-utilizing load in most cases.

The same non-discreet version of the invention can use a coupling of electrode lead or electrode extension(s) 79G from the electrode, main-body portion 81 for the shielding electrodes or common shielding pathways electrode, main-body portion 81 to be operable or practicable for conductive amalgamation of various predetermined, common pathway(s) not of the various predetermined active circuitry pathway(s). In this type of embodiment portion as a non-discreet version of the inventions' shielding electrode contiguous shielding electrode lead portions 79G and the contiguous, common electrode lead portions 79G are operable for electrical operations after coupling to portions of predetermined electrical conduit or any other sort of electrical coupling interconnecting medium portion normally found physically between a energy source and an energy-utilizing load to allow operable electrical coupling or electrical connection or an electrically operable amalgamation result to allow the invention embodiment to become a portion of a predetermined common circuit.

In an energized system, the invention contains a single shielding, cage-like structure 1600B or grouped commonly conductive elements that form extension and/or transformational fusion to its attached an external contiguous conductive area 314, will significantly eliminate, reduce and/or suppress E-Fields and H-fields emissions, RF loop radiation, stray capacitances, stray inductances, capacitive parasitics, and at the same time allow for mutual cancellation of oppositely charged or phased and adjacent or abutting electrical fields. The process of electrical energy transmission conditioning is considered a dynamic process over time.

This process can be measured to some degree by devices such as dual port, Time Domain Reflectometry test equipment and/or other industry standard test equipment and fixtures. The invention can also be attached in a single, dual or multi-conductor electrical system with slight modifications made to accommodate external input and output energy transmission conductors or paths for such applications like signal, energy transmission and/or the energy source line decoupling, bypassing and filtering operations. Circuitry and depictions of some of the embodiment portions shown in this document expose some of the placements contemplated by the applicant and should not be construed as the only possible configurations of the invention elements.

Figure 2A:
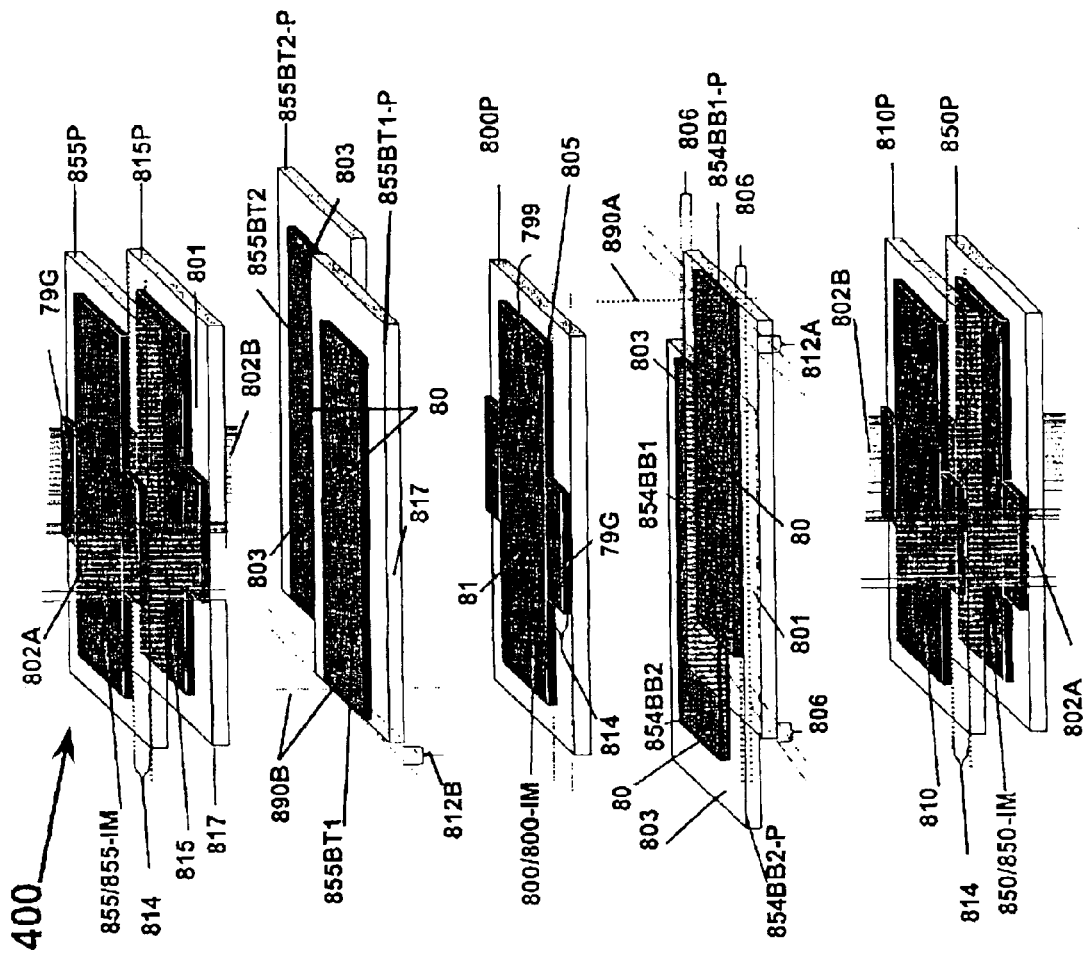
FIG. 2A shows an exploded perspective view depicting a predetermined multi-electrode stacking sequence with two differential, bypass propagational groupings, in combination with a portion of the universal shielding, common electrode architecture of FIG. 1B in a double bypass electrode configuration using two sandwiching outer "-IM" electrode shields in accordance with the present invention.

In dynamic operation, a large portion of energy parasitics will normally be found, concentrated along the smaller, shielded electrodes' outer electrode edge 803 portions of the electrode main-body portion 80s such as from 854BBs' of FIG. 1A substantially immured within the predetermined electrode, main-body portion 81 area of the commonly aligned, shielding electrode 800/800-IM with perimeter electrode edges 805 found comprising a portion of the larger shielding electrodes 855/855-IM, 845, 835, 825, 815, 800/800-IM, 810, 820, 830, 840, 850/850-IM in FIG. 2A for example.

The shielding electrodes 800/800-IM, 815, and 810 are also surrounded by material with predetermined properties 801 that provides support and an outer casing of a discrete version of an invention component. Both common shield termination structures 802A and 802B are conductively coupled to the same larger, shielding electrodes 815 and 800/800-IM and 810 individually and commonly conductive as a grouping, which is essential and is desired for this embodiment portion.

When the entire predetermined invention or predetermined embodiment portion is placed into circuitry, termination structures 802 should be attached by standard means known in the art to the same external conductive area or to the same external conductive path (not shown) without an interruption or conductive gap between each respective termination structures, 802.

A predetermined standard coupling means known in the art facilitates conductive connection of common shield termination structures 802A and 802B, which are attached, respectively, oppositely, on all three shielding electrode 800/800-IM, 815, and 810 (not shown) together. This act will help form a single structure to act as one common conductive predetermined, common conductive cage-like shield structure of 1600B (not shown).

Predetermined, common conductive cage-like structure 800D mirrors single, predetermined, common conductive cage-like structure 800E except that shielded, differential electrode 855BT (not shown) contained within, is sandwiched and has a exit/entrance section 812B (not shown) with conductive material portion or structure 890B (not shown) that is not fully shielded, but in a generally opposing direction to that of conductive material portion or structure 890A and shielded electrode 854BB to join with conductive material portion or structure 890B (not shown).

These two predetermined, common conductive cage-like structures 800D and 800E are in a predetermined, aligned and stacked positioned and parallel relationship, but most importantly, cage-like structures 800D and 800E are sharing the same, central, shielding electrode 800/800-IM, layer or pathway simultaneously that makes up each predetermined, common conductive cage-like structures 800D and 800E, when taken individually.

Together, predetermined, common conductive cage-like structures 800D and 800E create a single and larger conductive predetermined, common conductive cage-like shield structure 1600B that acts as a shielding electrode double container. Each shielding electrode double container 800D and 800E will hold an equal number of same sized, shielded electrodes that are complementary oriented and positioned to each other inset within. The invention when energized will operate dynamically opposing during energized operations one another within said larger structure 1600B in a generally parallel manner, respectively. Larger conductive predetermined, common conductive cage-like shield structure 1600B is made with co-acting 800D and 800E individual, shield-like structures when energized, and attached to the same external common conductive path 34 (not shown), to become one electrically.

The 1600b structure in essence, forms a minimum of two predetermined, common conductive cage-like structures 800E and 800D are required to make up a shielding, multi-functional energy conditioning device in all of the layered embodiment portions of the present invention. The central larger, shielding electrode 800/800-IM with respect to its interposition between the differential, shielded electrodes 854BB and 855BT (not shown) needs the outer two additional sandwiching larger (but identically sized) shielding electrodes 815 and 810 to be considered an un-energized predetermined, common conductive cage-like shield structure 1600B.

To go farther, the central larger, shielding electrode 800/800-IM will be simultaneously used by both differential electrodes 854BB and 855BT at the same time, but with opposite results, with respective to charge switching. It must be noted that for most chip, non-hole thru embodiment portions, a new device will have a minimum of two differential electrodes sandwiched between three larger (but identically sized) shielding electrodes and connected, external termination structures that are connected, and are conductively, as one, to form a single, larger predetermined, common conductive cage-like shield structure 1600B that when attached to a larger external conductive area 314, helps perform simultaneously, energized line conditioning and filtering functions, upon the energy propagating along the conductors sandwich within the said cage-like shield structure 1600B, in an oppositely phased or charged manner.

The now attached, internal common conductive electrodes 800/800-IM, 815 and 810 (not shown) that make up the predetermined, common conductive cage-like shield structure 1600B and their subsequent energization will allow the external conductive area or pathway 34 to become, in essence, an extended and closely positioned and essentially parallel arrangement of conductive elements with respect to its position also located internally within the pre-determined layered PCB or similar electronic circuitry.

Connection of the joined common conductive, and enveloping, multiple, common shield electrodes 815 and 810 (not shown) with a common centrally located larger, shielding electrode 800/800-IM that will be, to external extension elements 314 interposed in such a multiple, parallel manner that the external extension elements will have microns of distance separation or 'loop area' with respect to the complimentary, phased differential electrodes 854BB and 855BT (not shown) that are sandwiched themselves and yet are separated (not shown) from the external extension 34 by a distance containing a dielectric medium 801 so that said extension becomes an enveloping shield-like element that will perform electrostatic shielding functions, among others, that the said energized combination will enhance and produce efficient, simultaneous conditioning upon the energy propagating on or along said portions of assembly differential conductors. The internal and external parallel arrangement groupings of a combined common conductive planes or areas will also cancel and/or suppress unwanted parasitics, electromagnetic emissions that can escape from or enter upon portions of said differential conductors used by said portions of energy as it propagates along a conductive pathway to active assembly load(s).

In the following sections, reference to central shielding electrode 800/800-IM also applies to larger, shielding electrodes 815 and 810. Shielding electrode 800/800-IM is offset a distance 814 from the edge of the invention. One or more portions 79G of the shielding electrode 800/800-IM extends 814 through material 801 and is attached to shielding electrode material connection portion or structure 802. Although not shown, the shielding electrode material connection portion 802 electrically connects the identically sized, shielding electrodes 800/800-IM, 815, and 810 to each other, and to all other identically sized, shielding electrodes of the filter, if used.

The conductive-shielded electrode 854BB is not as large as the shielding electrode 800/800-IM such that an offset distance and area 806 exists between the edge 803 of the shielded electrode 854BB and of the edge of the central larger, shielding electrode 800/800-IM. This offset distance and area 806 enables the larger, shielding electrode 800/800-IM to extend beyond the shielded electrode 854BB to provide a shield against any flux lines which might extend beyond the edge 803 of the electrode 854BB resulting in reduction or elimination of near field coupling to other electrodes within the filter or to elements external to the filter.

The horizontal offset 806 is approximately greater than 0 to at least 20+times or even more, dependant upon application situations, as long as the range selected allows the 806 distance, as manufactured, to be considered operable for a same-sized, but larger, sandwiching pair of shielding electrodes with main-body portion 81s. These shielding electrodes with main-body portion 81s are to be operable for physical and dynamic electrostatically shielding operations relative to a predetermined shielded electrode with main-body portion 80.

The predetermined shielded electrode with main-body portion 80, singularly or as part of a predetermined grouping is normally immured within the predetermined sandwiching shielding electrode pair, as just described, and relative to shielded main-body portion 80, grouped (at least averaged uniformed spacing defined distances common 803 electrode edges) when not inset again within a sub-group that are together, inset within the at least averaged uniformed spacing defined by the electrode edge 805 perimeter that is common and used to create the 806 distance insetting relationship.

These electrode lead portions 812 are connected to electrode material connection portion 890A which enables the shielded electrode 854BB to be electrically connected to the energy pathways (not shown) by solder or the like as previously discussed. It should be noted that element 813 (not shown) is a dynamic representation of the center axis point of the three-dimensional energy conditioning functions that take place within the invention and is relative with respect to the final size, shape and position of the embodiment portion in an energized circuit. For the static elements of the an amalgamation 813 (not shown) can also be further defined, relative to an imaginary intersecting or confluence point of (3) axis or components of spatial positioning relationships, such as X-axis, Y-axis and Z-axis relationship of a three-dimensional Cartesian-like, coordinate system and will be expanded upon in FIG. 3C.

Turning to FIG. 1B, which shows a portion of a cage-like shielding electrode container 800D depicted in FIG. 1A now shown in FIG. 1B. By showing common conductive cage-like shielding structure portion 1600B, comprising common conductive cage-like structures, 800D and 800E, respectively, one immediately that sees 800D and 800E is comprising the predetermined embodiment-location relative, centrally positioned, shielding electrode 800/800-IM disposed upon material portion 800-P. At a very basic element, level comprises a portion of material 801 comprising predetermined properties and conductive electrode material 799.

It should be noted that for FIG. 1B, substantially all of 8"XX" electrode portions of material 799 shown are disposed upon, in this case, planar-shaped material 801 portions with bottom portions 888, or portions of material 801 comprising predetermined properties with bottom portions 888 for stacking and sintering or bonding together as a single unit.

These planar-shaped material 801 portions comprise a top surface (not numbered) 845P, 835P, 825P, 815P, 800P, 810P, 820P, 830P, 840P, 850P are each disposed for receiving at least a portion of shielding electrode 845, 835, 825, 815, 800/800-IM, 810, 820, 830, 840, 850, etc., and of which the shielding electrodes may comprise at least one, same-sized, electrode, main-body portion 81 with electrode lead portion(s) 79G.

In other variations of the invention where portions of material 801 are not used as predetermined sheets or plates, centrally positioned and shared, shielding electrode 800/800-IM, as well as shielding electrodes 815, 810 and the optional shielding electrodes 855/855-IM and 850/850-IM, as well as the shielded electrode pathways 855BB and 854BB, will all have the disposed, main electrode planar-shaped portions 81 and 80 (for 81 for the shielding electrode, and 80 for the main-body portion for the shielded, differential electrode portions) generally separated from each other for the most part by a predetermined or measured amount of a parallel interposition or deposition of a predetermined material, dielectric material or medium material 801, which is placed or deposited during the manufacturing process between each of just mentioned conductive pathway or electrode material 799 applications or positioning.

As has seen in FIG. 1B, dielectric material portion with predetermined properties 801 or material portion with predetermined properties 801 or medium portion with predetermined properties 801, non-conductively couples and physically separates a substantial portion of the individual shielding electrodes or common pathway electrodes 830, 810, 800/800-IM, 808, 840, from the conductive pathway electrodes (not shown) sandwiched therein form one another. It is then, with locations normally found co-planar along the predetermined electrode edge portions of 805 the 79G electrode extensions or electrode leads are found operable for conductive attachment or conductive coupling to electrode material portions like 802A and 802B which are applied and amalgamated to couple all members of the predetermined grouping at some pint in a sequential manufacturing process.

As described in relation to FIG. 1B, a minimum of two cages, for example 800D and 800E, which make up larger cage 1600B, are required to make up a multi-functional line-conditioning structure for use in almost all of the layered embodiments of the present invention are shown. The electrode extensions 79G for coupled or conductive attachments or terminations with materials 802A or 802B or similar or not, may extend beyond the end 817 (not fully shown) or final margins of a typical invention device when surface mounting is as described early is desired. Alternative conductive termination methods include applications of vertical/horizontal material layers of conductive material elements that are compatible with available and future processing technology can be used.

Most importantly, structures 800C, 800D, 800E, 800F, and 800G for example as shown in FIG. 1B, when taken individually are comprising six shielding electrodes, 825, 815, 800/800-IM, 810, 820, 830, but when taken as separate operable shielding structures 1600A, 1600B, 1600C, one finds that individually the six same-size, shielding electrodes each with at least an electrode, main-body portion 81 825, 815, 800/800-IM, 810, 820, 830 utilized or shared together in a predetermined interweaved, overlapping manner, one will find that an operable shielding structure, 1600A utilizes same-size, shielding electrodes each with at least an electrode, main-body portion 81 800/800-IM, 810, 820, while operable shielding structure 1600B utilizes same-size, shielding electrodes each with at least an electrode, main-body portion 81, 815, 800/800-IM, 810, while operable shielding structure 1600C is utilizing same-size, shielding electrodes each with at least an electrode, main-body portion 81, 810, 820, 830, respectively.

It is of interest to note that shielding electrode 810 is utilized by all three operable shielding structures 1600"X" (A, B, C) as just shown, thus a multiple usage of predetermined and positioned same-size, shielding electrodes each with at least an electrode, main-body portion 81, such as 810 can be utilized in a manner that covey's 810 shielding role to multiple, adjacent, and even non-adjacent, same-size, shielded electrodes each with at least an electrode, main-body portion 80, or differential active electrodes not found.

Contained within common, shielding electrode structure 4000 of FIG. 2A, container structures 800E and 800F for example when taken as a larger group and not individually, create a single and larger conductive cage-like shielding electrode shield structure 1600A, that acts as a double or paired shielded electrode or common pathway container. Yet, 800E and 800F also make up portions of 1600C and 1600B, respectively. Each container 800"X" can hold an equal number of same sized, same-size, shielded electrodes each with at least an electrode, main-body portion 80, or differential active electrodes that are not necessarily physically adjacent one another within larger structure 1600"X", yet each container 800"X" container is predetermined to be oriented in a generally homogenous physical as well as electrically parallel and common manner, respectively.

Larger, conductive cage-like electrode shield structure 1600A with co-acting 800E and 800F individual shield-like structures, when energized, and attached to the same external common conductive path area (not shown) by common conductive material connection portions 802A and 802B or by any possible means of commonly acceptable industry attachment methods such as reflux solder 777 (not shown) or conductive epoxies and adhesives and the like (all not shown), become one electrically, when energized.

To begin, an exploded, perspective view of predetermined multi-functional energy conditioner 400 is shown in FIG. 2A. Energy conditioner 400 combines and extends the concepts discussed in FIGS. 1A and 1B and throughout the disclosure. FIG. 2B is a cross-sectional view taken along a longitudinal centerline bisecting the external electrode material connection portions 890A and 890B revealing the layered architecture of the internal electrodes. FIG. 2C is a cross-sectional view taken along a latitudinal centerline bisecting the external common electrode material connection portions 802A and 802B revealing the layered architecture of the internal electrodes from a 90 degree rotation of the resulting cross-section as it is viewed from the same location that FIG. 2B was seen.

Shielding electrodes 850/855-IM, 815, 800/800-IM, 810, and 850/855-IM comprising a predetermined plurality of the members of a shielding electrode groups are interleaved between a first of two predetermined plurality of members of a predetermined shielded electrode groups and a second of two predetermined plurality of the members of a predetermined shielded electrode groups.

A first of two predetermined plurality of members of a predetermined shielded electrode groups are shown as 855BT1 and 855BT2 and a second of two predetermined plurality of members of a shielded electrode groups is shown as 854BB1 and 854BB2, and will comprise an amalgam of electrodes eventually manufactured into an amalgamated grouping of various predetermined elements.

Additional complementary paired and positioned sets of predetermined numbers of alternating, individual members of predetermined pluralities of members of electrode groups can be further placed, positioned and oriented parallel to each other, stacked by predetermined manner within additional predetermined common, shielding electrodes that are selectively positioned as needed (not shown).

In the present disclosure, many variations of energy conditioner 400 are to be presented, but as such, all will comprise at least one shielding electrode 800/800-IM or similar functioning centrally positioned, shielding electrode separating the first plurality of members of the groups of shielded electrodes 855BT1 and 855BT2 from the second plurality of members of a shielded electrode groups 854BB1 and 854BB2.

Furthermore, at least one shielding electrodes 810, 815 are stacked and positioned on the outermost ends covering the upper most shielded electrode 855BT1 and the lower most shielded electrode 854BB2, respectively.

Referring now to FIG. 2A, energy conditioner 400 comprises a central shielding electrode 800/800-IM disposed or formed on a layer 800P of material 801 comprising predetermined properties, which also comprises a portion of embodiment 400s' perimeter edge 817. Shielding electrode 800/800-IM comprises at least two electrode lead portions 79G, or electrode extension portions, which are conductively connected to common external conductive wrap around electrode material portion 802 (not shown but disclosed as an option for all invention embodiments, if applicable.) or common external, electrode material portion 802"x" or in this case, paired, common external, electrode material portions, 802A, 802B, respectively. These 802"x" portions can also be referred to as electrode material connecting portion(s), which conductively interconnect all shielding electrodes to each other operable for common electrical operations. Shielding electrode 800/800-IM has a main-body, electrode portion 81 with electrode perimeter edge 805, which is inset from conditioner 400's edge 817 by a distance or area shown as 814.

Shielded electrodes 855BT1 and 855BT2 are positioned above shielding electrode 800/800-IM. Shielded electrodes 855BT1 and 855BT2 are disposed on a layer 855BT1-P and 855BT2-P, respectively, of material 801 comprising predetermined properties and comprising a portion of embodiment 400's perimeter edge 817. Shielded electrodes 855BT1 and 855BT2 each comprise a main-body, electrode portion 80 and a common, shielding electrode perimeter edge portion 803, which is inset from embodiment 400 perimeter edge 817 by a distance 814F and inset from the shielding electrode perimeter edge 805 by a distance of 806-AOI, except for at least one electrode lead portion 812B, which in this embodiment 400, is merely a conductive electrode extension of main-body electrode portion 80 to the embodiment 400s' edge 817, which is also comprises of a portion of layer 855BT1-P and 855BT2-P to provide connection to external electrode material portion 890B or external conductive pathway.

Shielded electrodes 854BB1 and 854BB2 are predetermined to be positioned inset and below, shielding electrode 800/800-IM. Shielded electrodes 854BB1 and 854BB2 are disposed on a layer 854BB 1-P and 854BB2-P of material 801 comprising predetermined properties in each portion of 801 material of 854BB1-P and 854BB2-P which (801) also comprises a portion of embodiment 400s' perimeter edge 817.

Shielded electrodes 854BB1 and 854BB2, each comprise a main-body, electrode portion 80 which is also comprising a perimeter edge portion 803, which is inset from shielding electrode perimeter edge portions 805 by a distance 806-AOI, except for at least one electrode lead portions 812B, which in this embodiment is merely an extension of main-body electrode portion 80 to the portion of the respective embodiments' material edge 817 of layer 854BB 1-P and 854BB2-P to provide connection to external electrode material portion 890A or external conductive pathway. It is noted that the orientation of shielded electrodes 854BB1 and 854BB2 is 180 degrees from shielded electrodes 855BT1 and 855BT2 in an electrically complementary configuration.

Shielding electrodes 815 and 855/855-IM are positioned and stacked parallel above shielded electrode 855BT1 and 855BT2. Shielding electrodes 815 and 855/855-IM are disposed on a layer 815P and 855P, respectively of material 801 comprising predetermined a property, which also comprises a portion of embodiment 400s' perimeter edge 817.

Shielding electrodes 815 and 855/855-IM each comprise at least two-electrode lead portion 79G, or electrode extension portions, which are conductively connected to shielding external conductive material portions 802A, 802B that conductively interconnect all shielding electrodes together as a single common conductive structure (not shown). Shielding electrodes 815 and 855/855-IM have main-body electrode portion 81s, respectively, each with a common perimeter edge 805, which is inset from edge 817 of embodiment 400, like central shielding electrode 800/800-IM by a distance 814.

Shielding electrodes 810 and 850/850-IM are positioned above shielded electrodes 855BT1 and 855BT2. Shielding electrodes 810 and 850/850-IM are disposed or formed on a layer 810P and 850P of material 801 comprising predetermined properties, which also comprises a portion of embodiment 400s' perimeter edge 817. Shielding electrodes 810 and 850/850-IM each comprise at least two electrode lead portions 79G, or electrode extension portions, which are conductively connected to common external conductive material portions 802A, 802B which conductively interconnect all shielding electrodes. Shielding electrode 810s and 850/850-IM each have a main-body, electrode portion 81 with perimeter edge 805, which is inset a portion of embodiment 400s' perimeter edge 817 by a distance 814, while as well as overlaps shielded electrode 854BB1 by a distance 806-AOI.

Although not shown, additional pairs of shielded electrodes can be utilized by modifying and repeating the alternating shielded/shielding electrode stacking sequences or arrangements of the energy conditioner 400. In extended repeated stackings, in one embodiment it is preferred that either at least one, or two final shielding electrodes are used at the outermost shielding electrode locations, and one shielding electrode is used in between the alternating pluralities of shielded electrodes.

Referring now to FIGS. 2B and 2C, the assembled energy conditioner 400 is shown in cross-section as previously described. In these views the insetting by predetermined distance 806 of the plurality of shielded electrodes 855BT1, 855BT2 as well as 854BB1 and 854BB2, is shown in better detail.

Also the extension or electrode lead portions 812A and 812B are shown operable for coupling to external electrode portions 809A and 809B, respectively for electrical operation.

Furthermore, the predetermined size and coverage of predetermined numbers of shielded electrodes' main-body portions 80 of the predetermined sequential static stacking order are equivalent, and the predetermined size and coverage of the predetermined shielding electrodes' main-body portions 81 are equivalent, such that they are the same size, shape, and are aligned with the predetermined edges or predetermined perimeters of their respective, shielded electrodes' main-body portions or of their respective, shielding electrodes' main-body portions members.

Turning to now to FIGS. 3A and 3B depicting shielded electrode 875R taken as a closely paired, predetermined, symmetrical shielded electrode assembly of split-paired or pairing of a predetermined split-electrode or doubled layering application, deposit or placement of electrode material 799 into predetermined, equal-sized, shielded electrode elements now called 875R-1 and 875R-2 with main-body portion 80 electrode 'twin symmetrical' portions that are separated with a very thin predetermined application or predetermined deposit or predetermined layering 814B of a material with predetermined properties 801 disposed between the first and second 'split' or doubled layering material 799 application, 799 deposit or 799 placement. There is no actual, splitting process, rather, it is a predetermined manufacturing technique that relies upon the precise, manufacturing machinery and/or precise, skills of the electrode builders in placing the very, very close, predetermined electrode application layerings, that offer in some cases the appearance of a 875R split-electrode.

In this instance, a 875R is manufactured into the predetermined, dual layer ("split") electrode elements 875R-1 and 875R-2 as described above is achieved by subdividing the predetermined electrode application layerings from one to two cycles with a material 801 between each cycle. 'Split' or doubled layering material 799 application layerings for example, or whether it be a shielding, common electrode or a shielded electrode like 875R is now seen as a manufacturing technique that allows closely paired, predetermined, symmetrical twin electrodes or predetermined equal-sized electrode assembly elements to be separated by a very thin 814B spacing layer. This 814B layering could be different than material with predetermined properties 801, depending on properties of the 814B thin layering materials used. Since all embodiments shown are considered dielectric independent, almost any material 801 could be used. It is also to note that 814B is not to be confused with a thin application dimensions or deposit dimensions or layering dimensions designated as 814A which is used with the predetermined "-IM" layerings, for example, and which is also uses a predetermined spacing distance 814A, but, NOT to the degree of thin spacing between 799 materials for 814B, which is on the order of about 0.005 mil to 1.0 mil or as material technology improves anywhere from twice the thickness of the average of the two material 799 application layerings for the 875R1 and 875R2, for example to 1.0 mil is disclosed.

To contrast, the spacing provided by disposed material 801 with predetermined properties designated as 814C between the interleaved shielded electrode main-body portion 80s and shielding electrode main-body portion 81s noted in FIG. 4A, for example is substantially greater, typically on the order of greater than 1.0 mil to 10 mil and even beyond those ranges, dependent upon application usages.

As another option for determining a predetermined 814B distance between any of the split-electrodes could be considered normally, greater than zero to a range of 25% of the predetermined separation distance 814A normally found between, any two non-split-shielded and shielding electrodes, or the distance 814A normally found with a prior art, standard electrode spacing utilized by the manufacturers such as either PhyComp/Yageo of Roermond, The Netherlands and Taiwan or Syfer Technology, Ltd./Nova Cap/Dover Corporation of England and USA.

At least one of these companies or at least one of their business survivors or one of the parent companies after official filing of this writing, could be considered capable of creating a predetermined split-electrode stacking sequences of the new invention with 814B distances of the invention considered by them (after the disclosure filing)to be considered as a 'gauging' or comparison as to what is considered the standard split-electrode, 814B spacing utilized by the between any two split-electrode placements of either a shielded electrode grouping groups and sub-groupings or groups or of the shielding, common electrode grouping or groups in split-electrode, layering separations.

In almost any voltage configuration, for all embodiments in this disclosure it is contemplated that various shielded and/or shielding electrodes can be predetermined and configured to utilize a significantly increased of energy portion propagation capacity of an embodiment like 400, for example, and is contemplated in all configurations of the predetermined multi-functional energy conditioner co-owned or disclosed, but only for the groups of shielded electrodes or its complementary paired differential, sub-groups of the shielded electrodes like 875R for example that are utilizing an electrode, main-body portion 80 that the 'twin symmetrical' portions of very thin predetermined application or predetermined deposit or predetermined layering 814B of a material with predetermined properties 801 is desired for. This configuration will provide a resulting, insignificant increase in the overall volumetric size of the, predetermined multi-functional energy conditioner when comparing two units, one configured with slit-electrode technology, the other in standard embodiment shielded electrode configurations.

It is noted that in this disclosure, split-electrode technology is also contemplated, but in all cases always predetermined as to the final make-up of any embodiments manufacture, for all shielding electrode with main-body portion 81 is desired.

There are also certain caveats: NO configurations of the center 800/800-IM common, shielding electrode or "x"-IM-common, shielding electrodes are desired.

Another exception to be considered is that for the remaining shielding electrodes, it should be predetermined that either, all or none of the remaining shielding electrode can be configured in this manner, not some, unless a pattern of allowed vs. not allowed is done were the result is a balanced configuration of split/non-split operable to equal sides of the non-split common, shielding electrode.

This same rule applies for shielded electrodes, as well. Split-electrode-type configuration is also fully contemplated and preferred in applications of the invention where ONLY the larger, shielding electrodes with electrode main-body portion 81 (with -IM caveats in place) are configured as split-electrode configuration, however in any case all or none of the shielded/shielding electrodes should be configured in split-electrode technology, not just a haphazard, few. Another exception is that a pattern or sequencing of allowed vs. not allowed is acceptable provided the resulting configuration yields a symmetrically balanced, complementary oriented, configuration of split electrodes verses non-split electrodes between sub-groups of shielded electrodes that are operable and equal in number when divided between the single, non-split, common, centrally positioned, shielding electrode 800/800-IM shielding electrode or embodiment 'fulcrum'.

Predetermined distance 814B or spacing 814B is used with split-electrode technology to allow the shielded element to increase a desired energy propagational capacity or capability over that of a single, shielded electrode, and will with a predetermined grouping of split-electrode shielded elements created for entire shielded electrode main-body portion 80s of predetermined sub-groups of complementary position shielded electrode pairs that are disclosed or found in an embodiment like 400, for example, and are contemplated in all configurations of the predetermined multi-functional energy conditioner disclosed or co-owned, elsewhere to enhance the whole, predetermined 875R shielded electrodes' ability individually, and as a part of a grouping of split-electrode shielding elements that as combined will allow a significantly increased of energy portion propagation capacity and reliability to elements by providing additional useable shielded electrode main-body portion 80, surface 'skin' (not shown) or area for such energy portion propagation situations of situation anomalies such as when un-planned or planned, voltage pulses/energy surges under unknown situations are operable as in and out rush of energies during otherwise nominal electrified or energized operations and of which those situations as just described can be considered unplanned, system or circuit energy anomalies.

Turning to now to FIG. 3C depicting a predetermined, amalgam of electrodes and other predetermined element portions and types that comprises at least two groups of electrodes, which in turn can be further discerned as at least three pluralities of electrodes form the two groups designated as groups 1, the larger, shielding electrodes and groups 2, the smaller, shielded electrodes. Groups 2, the smaller, shielded electrodes will further comprise at least two sub-groups of complementary oriented, shielded electrodes that are complementary paired.

All together, and including the other predetermined elements and/or limitations are all amalgamated into a whole structure of elements that are internally relative to each other such that together, will comprise a whole, 'in-combination invention embodiment' that is practicable to be fully operable for predetermined circuit attachments and predetermined energized operations.

However, the elements as an amalgamation can also be further defined, relative to an imaginary intersecting or confluence point of (3) axis or components of spatial positioning relationships, such as X, Y and Z axis relationship of a three-dimensional Cartesian-like, coordinate system (not shown) which will help to determine a predetermined arrangement that allows for discerning of a complementary and balanced symmetrical amalgamated portion member that is one of 4 complementary and balanced symmetrical amalgamated portion members, each comprising one of the four quadrants, respectively of 3-dimensional matter-occupied spatial positioning relationship that is relative to a complementary opposite or counter part positioning scheme used upon a quad-sectioned, whole complementary and balanced symmetrical amalgamated structure portion divided to a 3-axis systems' central 3-axis intersecting point common to each one of the four members of a 3-demensional, 4 quadrant system that comprise it.

For example, if a desktop is on a X-axis and the walls holding up a ceiling in a room with the desk and its top is considered on a Y-axis, then, if one reaches for a paper directly in front, the arm is considered on a Z-axis.

In addition, any dissection to determine applicability to a quadrant system as far as 'exact' amounts must always be taken with manufacture's limitations to achieve 'exact' amounts and that an averaging of the amounts that allow greater than 0 to 4% of a range will be considered as 'practicable or feasibly balanced' between divided quadrants.

To allow for an example in FIG. 3C, an example of an alignment of pluralities of one of two groups electrodes, the shielded electrodes that are further segregated into two complementary oriented, sub-groups of shielded electrodes with main-body portion 80, designated R and L, depicted as 875L, 875R, 865L, 865R, 855L, 855R that are shown shielded by a portion of 865, 855, 845, 865, 825, 815, and 800/800-IM, respectively, which is a good example of 'practicable or feasible balance' found among elements within a typical quadrant that, will in-turn, translate into overall complementary quadrant balance determinations.

In FIG. 3C, one will note that allowance of registration or alignment of the 803-electrode edge of each of the main-body portions 80 depicted as portions of 875L, 875R, 865L, 865R, 855L, and 855R, to be slightly askew. An area between alignment 3000 of sub-groups 1 and alignment 2000 of sub-groups 2 is area of askew 2500.

The determinate of the alignment 3000 of sub-groups 1 and alignment 2000 of subgroups 2 balance found between these complementary sub-groups as to overall alignment would be taken as an average for all sub-groups 1 & 2 alignments within an invention embodiment.

Thus, if the averaging of miss-alignments or area of askew 2500 is taken of 3000 position verses the 2000 position from the FIG. 3Cs' alignment sample shown, that number of the range of misalignment or area of askew 2500 could be determined to be "x" relative to the center point of the 3-axis system for one quadrant.

Then the same could be done for FIG. 3Cs' (not shown) counter-part on a complementary, or opposite quadrant portion. It can be stated, that despite the opposite orientation of the position of the 803 electrodes edges of 875L, 875R, 865L, 865R, 855L, 855R, in this cross-section, if the "x" relative to the same center point of the 3-axis system is found, as a 'practicable or feasible balance' and would be considered in a range found between at least 0 to 4% when comparing two complementary quadrants of an invention embodiment.

Of course, a true average balance or zero is always preferred, but it is never absolute, given various manufacturing tolerances. Use of 'practicable or feasible balance' or even the term 'operable balance' is more probably as a real-world situation or result, optimistically because a real-world situation or result is the standard, standards are always continually improved as manufacturing equipment evolves over time.

It should be noted that the actual same-size, shielding electrodes each with at least an electrode, main-body portion 81, 800/800-IM, shielding electrode pathways 815 and 810 and use of the optional 855/855-IM and 850/850-IM shielding electrodes are all disposed into a minimum, predetermined positioning shielding-shielded relationship to each other is predicated upon a predetermined stacked sequential manufacturing operation and that results in shielding electrode pathways 800/8001M, 815 and 810 and the optional 855/855-IM and 850/850-IM same-size, shielding electrodes each with at least an electrode, main-body portion 81, when used, all respectively, formed as part of the invention by predetermined stacking manner to be physically identical to each other as members of a selected or predetermined grouping of electrodes with respect to being designated or considered members of a shielded grouping of electrodes or members of a shielding grouping of electrodes. Identical means to each other and only as is possible under normal manufacturing operations for such configurations to be done or achieved.

In FIG. 1A and FIG. 3, and for generally all of the configurations, the smaller, shielded active electrodes are being utilized by by-pass energy portion propagations 813A while the single common, shielding electrode groupings or single electrode coupled structure portions like 800/800-IM shown for both 400 and 4000 are handling the energy portion propagations designated 813B in the version shown in FIG. 1A, (which is not an array configuration.) that is practicable in certain predetermined circuit assemblies, like those shown later in FIG. 14A and FIG. 14B, to be operable as a common pathway of lower impedance for portions of propagating energies found with an energized circuit system comprising an invention circuit assembly such as those depicted in FIG. 14A and FIG. 14B.

These circuit assemblies can be utilized by when there is always to be found at least one smaller sized electrode, main-body portion or portions 80 of the shielded electrodes that will be physically inset to a predetermined distance 806 or 806"X" and others, within the a pairing of electrode, main-body portion 81 of a larger set of common, shielding electrode, main-body portion 81s' with the only exceptions being the electrode extensions 812s (if any) of at least one smaller sized electrode, main-body portion or portions 80 that are operable for eventual predetermined electrical circuit coupling or conductive connection attachment to a point beyond the common aligned perimeter edge of a stacked or parallel grouped, electrode, main-body portions 81 of coupled, common, shielding electrodes from which the 812s are contiguously and integrally comprised of.

It should be noted, that same manufacturing process might place an 812 lead electrode portion 799 or electrode lead portion 812 in an integral or contiguously manner at the same time or process the other 799 electrode material for the electrode, main-body portion 80 is manufactured will apply to an 812-X (not shown) non-integral or non-contiguously extension portion not placed or positioned at the same time or during the same process as the other 799 electrode material portion for the electrode, main-body portion 80. An 812-X portion could be applied and amalgamated later in manufacturing of the invention if that is practicable or operable for a builder of the invention and it should be noted that although not shown, this extension type is allowed, but substantially with the understanding that electrical operations that would utilize electrode, main-body portion 80 and a non-contiguous/integrally produced and coupled 812-X portion would still be conductive in a predetermined manner that would be approximately in a similar energy propagational condition of a standard 812 to be considered substantially operable.

In substantially all versions of the invention, smaller, shielded electrode, main-body portion 80s or common, shielding electrode, main-body portion 80s, can be normally defined by flat, planar shaped in surface areas for the electrode, main-body portions, 80 or 81, which is the general area that can be measured to determine the general composition of size for each respective electrode, main-body portions, 80 or 81 when and if needed. This electrode, main-body portion 80 or 81 areas will not include any portions considered to be of the 812 or 79G lead electrode portions or 812 or 79G electrode extension portions.

Because there is no precise way of determining the exact point or portion where each respective electrode, main-body portions, 80 or 81 ends and where each respective electrode lead portion 812 or 79G lead electrode portions or 79G electrode extension portions starts for every typical individual invention, made, it is safe to say, that electrode, main-body portion 80 and/or 81 areas for typical invention electrodes will be considered the area that is predetermined to be positioned to create a distance or a predetermined average of a predetermined distance like gap 806 or 806"X" of the shielded electrodes that can be measured as the area found as the area volume or distance located between the common perimeter 805 or the average common perimeter of the outer, shielding electrode edges 805 of the common, shielding electrode stackings of a predetermined number of stacked, shielding electrode, main-body portion 81 and that of the average common perimeter of the outer shielded electrode edges 803 of the shielded electrode stackings of a predetermined number of stacked, shielded electrode, main-body portion 80.

This axiom would hold true for any number or all of the two groupings of electrodes found between or as a part of the same predetermined electrode grouping within an AOC of an invention embodiment that included the electrode, main-body portion 81 comprising at least three shielding electrodes of any plurality of the same, found within the invention with respect to the 80 electrode, main-body portion comprising at that of at least two shielded electrodes.

Additionally placed, same-size, shielding electrodes each with at least an electrode, main-body portion 81, or energy pathways with a main-body portion 81 or those marked -IM, as shown in FIG. 2A, for example are conductively coupled or attached with the inherent central, shared image "0" voltage reference plane 800/800-IM, and will substantially increase the shielding effectiveness of an invention embodiment not only physically, but during energized operations utilizing predetermined invention attachments made earlier for the later energized circuit application. The sandwiching function of these outer, paired active conductive pathways with a main-body portion 81 with respect to the essential groupings of paired conductive shield-like containers 800"X" will substantially aid in total overall invention in effecting energy propagation portions in a relative manner with respect to externally attached common conductive areas and/or third energy pathway which is a common conductive area.

It should also be noted that offset distance and area 806 of FIG. 2A, enables the shielding electrode or shielding electrode pathway 800/800-IM with a main-body portion 81 to extend beyond the complementary and balanced group alignment of electrode pathways 854BB1+854BB2 and 855BT1 and 855BT2, each with a main-body portion 80, so that shielding electrode pathway 800/800-IM is operable to provide a shield against portions of energy flux fields (not shown) which might have normally attempted to extend beyond the edge 803 of the electrode pathways 854BB1+854BB2 each, with a main-body portion 80 and 855BT1 and 855BT2, each with a main-body portion 80, but were it not for the electrostatic shielding effect of an energized faraday-like cage systems composite of grouped, coupled shielding electrode main-body portion 81 stackings or structure 4000, are practicable for the resulting reduction or minimization of near field coupling between shielded, electrode pathways the complementary and balanced group alignment of electrode pathways 854BB1+854BB2 and 855BT1 and 855BT2, each with a main-body portion 80.

The horizontal offset 806 is approximately greater than 0 to at least 20+times or even more, dependant upon application situations, as long as the range selected allows the 806 distance, as manufactured, to be considered operable for a same-sized, but larger, sandwiching pair of shielding electrodes with main-body portion 81s. These shielding electrodes with main-body portion 81s are to be operable for physical and dynamic electrostatically shielding operations relative to a predetermined shielded electrode with main-body portion 80.

The predetermined shielded electrode with main-body portion 80, singularly or as part of a predetermined grouping is normally immured within the predetermined sandwiching shielding electrode pair, as just described, and relative to shielded main-body portion 80, grouped (at least averaged uniformed spacing defined distances common 803 electrode edges) when not inset again within a sub-group that are together, inset within the at least averaged uniformed spacing defined by the electrode edge 805 perimeter that is common and used to create the 806 distance insetting relationship.

It should be noted that the 806 or 806-AOI distance for subsequent manufactured invention units could be considered to be what is not predetermined to be available but can be considered or arrived at an averaging of the plurality of 806 or 806-AOI distances created by an amalgamation of a sampling of invention units with a total number of each homogenous grouping of electrode, main-body portions. This 806 or 806-AOI distance method could be verified by physical cross section and can be determined to be an 806 or 806-AOI distance as well for any later invention unit batches or as a guide line used and determined to be an 806 or 806-AOI distance by the inventor, considering the many various predetermined manufacturing tolerances available.

In many instances with this type of inventor determination or one used by those skilled in the art, the averaging of any minor 806 or 806-AOI size differences (the individual 806s, on there own, are unimportant) as a grouping in the 806 or 806-AOI distance or area between the electrode pathways in a typical sample cross-sectioning as long as electrostatic shielding function of 401 (not fully shown) for example, is not compromised.

In order to connect shielded electrode 855BB or 855BT to energy pathways positioned external to 855BB or 855BT (not shown), yet on either side of the 800B, respectively (not shown), the electrode 809 may have one, or a plurality of, portions 812 which extend beyond the edge 805 of the shielding electrodes or shielding electrode pathways 800/800-IM, 810 and 815 by electrode extensions 812A and 812B which are in-turn conductively connected to conductive pathway material, deposit or electrode 890A and 890B respectively which enables the shielded, electrodes 855BB and 855BT to be electrically coupled to active the energy pathways (not shown) on either side electrically of shielding electrode pathway 800/800-IM. Other than the centrally positioned and balancing 800/800-IM shielding, common electrode, all additionally placed shielding electrode energy pathways designated "-IM", are normally located outside all groupings of invention electrodes to allow final sandwiching, in close proximity, of the -IM's electrodes closely, adjacent and internally positioned shielding electrode neighbor. This predetermined placement positioning is for a purpose larger than that of adding capacitance to UMPCESS embodiments. These additionally placed shielding electrode energy pathways are placed as a set of outer, common shielding active electrode pair(s) A predetermined, amalgamated, shielding, electrode structure similar to FIG. 1B's 4000 structure or a predetermined shielding electrode architecture comprises an odd integer number of equal-sized, shielding electrodes, as well as, other predetermined elements and/or limitations that are predetermined to form relative, to each other, a whole in-combination invention, embodiment portion.

The shielding electrodes are grouped as members of a predetermined groups, that are manufactured into a resulting static but predetermined, stacked, parallel alignment that includes common edge 805 perimeter alignment to each other, such that when each shielding electrode is also operable for conductively coupled by predetermined manner to each other and practicable for coupling together with a predetermined portion(s) of conductive material portion(s) such as 802"X".

This predetermined amalgam of shielding conductors electrically common as a predetermined whole sub-combination, and then combined by at least a predetermined process portion with other, predetermined elements and/or limitations, that together as a single, multilayered amalgamation can be combined with other externally found predetermined conductive portions as well as circuit portion predetermined elements to be considered practicable and operable for specific and unique, in terms of the simultaneous nature and mix of the dynamic energy conditioning functions operable upon portions of propagating energy under the influence to some degree of the predetermined element arrangement configured as a multifunctional energy conditioner structural embodiment, which is shown in a standard configuration, for device 400, as depicted, in FIGS. 2A–2C.

Energy conditioner 400 comprises a predetermined amalgamated grouping of pluralities of electrodes that are segregated into a predetermined balanced and symmetrical embodiment stacking comprising predetermined relative orientation and positioning relationships both individually and as grouped relationships between members of the electrode groups all additionally relative and predicated upon a predetermined orientation and positioning relationships to a centrally positioned, shielding electrode 800/800-IM.

The manufacturing of predetermined pluralities of electrodes building of at least two groups of predetermined electrodes in terms of each pluralities relative size relationship to each other in terms of each of at least two types of main-body electrode portion either 80 or 81 they could be classified under. Each one of two groups of plurality is comprised of identical sized and identical shaped, main-body electrode portion either 80 or 81, which are at least a minimal criteria under which each respective main-body electrode portion either 80 or 81 would be classified as a groups for comprising an embodiment like conditioner 400 for it's final composition.

Energy conditioner 400s' final material and number of elements and the resulting size and shapes as well as quantities and composition are normally dependant upon the final predetermined configuration by either a manufacturers' intent or a users' intent by purchase from a manufacturer.

At least one of the two groups of a planar-shaped electrodes, the larger shielding electrodes (relative in size as a plurality to the smaller, but equally-sized members of the shielded groups of electrode main body-portions), will always total an odd numbered, integer of total shielding electrodes found within a typical invention embodiment.

The remaining one of the at least two groups of a planar-shaped electrodes, the smaller shielded electrodes, (relative in size as a plurality to the larger, but equally-sized members of the shielding groups of electrode main-body portions), will always total to an even numbered, integer of shielded electrodes found in almost any amount within a typical invention embodiment.

The two groups of pluralities of electrode main-body portion 80s are divided, paired, oriented complementary to each other as they are segregated onto at least two predetermined groupings of predetermined pluralities of predetermined electrode main-body portion 80s available, while the larger, equally-sized members of the remaining one of two groups of electrodes will be of the shielding groups and in embodiment 400 comprises in this instance same-sized and same-shaped members that can include shielding electrodes 850/855-IM, 815, 800/800-IM, 810, and 850/855-IM, as shown.

It should also be noted that anywhere in the disclosures' specification (excluding Title, Claims Section), unless the electrode leads, 79Gs or 812"X"s or similar are specifically called out or designated with the following words, singular or plural, the applicants' usage of specific element words of: electrode(s), conductor(s) energy pathway(s) are generally relegated to mean these respective specie members' specific type of planar-shaped, main-body portion of conductive material which is disposed or formed as such and found herein.

Each usage of these specific element words will or can be further designated by the functional adjectives: 'shielded' or 'shielding', when these terms are used in-combination with, and/or are referring specifically and respectively to the static and dynamic function received or performed upon as a member of an identically-sized and identically-shaped plurality of element members of one of the two groups of electrode elements designated as operable to either a 'shielded' or 'shielding' function both statically and dynamically (in energized operations) as each is relatively comprising at least a main-body electrode portion 8"X".

Any relative-sized and relative-shaped relationship difference(s) noted among any of the individual members of a segregated groups of electrode, main-body portions 8"X" will be called out specifically, as needed or found, within each groups or Figure Number to be designated, relative, as its numbered, element type, location, spacing, positioning, orientation to the other element(s) members such a specific element is depicted with.

This caveat above as just stated, holds the same for the number(s), orientations and positioning (all relative, specifically), as needed for any of the respective electrode lead portion(s) 79G or 812"X" (if any), found among these specific member electrode portions to further provide detail of the embodiments, as needed, as described.

To begin, an exploded, perspective view of predetermined multi-functional energy conditioner 400 is shown in FIG. 2A. Energy conditioner 400 combines and extends the concepts discussed in FIGS. 1A and 1B and through out the disclosure.

The horizontal 806 or 806-AOI area/distance can be stated as approximately between 0 to 20+ times the vertical distance 806 or 806-AOI between the electrode pathways 855BB and 855BTs' respective main-body portion 80 the shielding electrode or shielding electrode pathway 800/800-IMs' respective main-body portion 81. This offset distance 806 or 806-AOI can be optimized for a particular application, but all distances of main-body portion 81s's overlap of the main-body portion 80s yield a predetermined 806 or 806-AOI distance (and others) among each respective pathways main-body portion that are ideally, approximately the same with in an invention embodiment as predetermined manufacturing tolerances allow. It should be noted that the 806 or 806-AOI distance for subsequent manufactured invention units could be considered to be what is not predetermined to be available but can be considered or arrived at an averaging of the plurality of 806 or 806-AOI distances created by an amalgamation of a sampling of invention units with a total number of each homogenous grouping of electrode, main-body portions. This 806 or 806-AOI distance method could be verified by physical cross section and can be determined to be an 806 or 806-AOI distance as well for any later invention unit batches or as a guide line used and determined to be an 806 or 806-AOI distance by the inventor, considering the many various predetermined manufacturing tolerances available.

In many instances with this type of inventor determination or one used by those skilled in the art, the averaging of any minor 806 or 806-AOI size differences (the individual 806s, on there own, are unimportant) as a grouping in the 806 or 806-AOI distance or area between the electrode pathways in a typical sample cross-sectioning as long as electrostatic shielding function of 401 (not fully shown) for example, is not compromised.

It should be noted that the directional orientation of the two predetermined groupings of electrode, main-body portions, respectively can be switched such in final length to width orientations, that for example 802A and 802B electrode material coupling portions are now located 'east and west' (relative to their positioned 'north and south', as shown in FIG. 1A, for example), while 890A and 890B electrode material coupling portions that could be located 'north and south' (relative to their positioned 'east and west', as shown in FIG. 1A, for example) and placed in a predetermined circuit and predetermined to be coupled in the same electrically attached, respective manner as FIG. 14A or FIG. 14B.

When directional orientation of the two predetermined groupings of shielding electrodes with main-body portions 80 include, 905R, 885R, 865R, 855R, 875R, 895R, and the other grouping of main-body portions is switched to an opposite final length to width orientation, and applied in a same predetermined circuit and predetermined to be coupled still with the 890A and 890B electrode material coupling portions utilized, as a portion of the primary energy propagational pathway, in whole invention embodiment, but now rotated 90 degrees to be configured respectively in the same original position like shown in FIG. 1A to be able to be in the same electrically attached, respective manner as shown utilized FIG. 14A. This also goes for 802A and 802B electrode material coupling portions to still utilized in a non-primary energy propagational pathway usage that was shown utilized by 802A and 802B electrode material coupling portions in the same electrically attached, respective manner as shown utilized FIG. 1 or FIG. 6A. In BOTH orientations or width to length positionings the electrodes utilized in an active, primary energy propagational pathway usage will always maintain any, one, ½, of a pairing of smaller, main-body portion 80 inset within than any one, of the larger main-body portion 81 electrode performing a shielding function, both physically and electrostatically during energization in a FIG. 14A predetermined circuit scheme or similar.

To restate, as long as the smaller, of the two electrode, main-body portion groupings are operable to handle the main circuit propagational pathway functions, while the larger, common, shielding electrodes are utilized in a more passive, propagational function manner as a third pathway for various circuit attachments like depicted in FIG. 14A, or similar the invention is fully operable for the primary shielding function of electrostatic shielding used very effectively for conditioning portions of energy as the applicant is disclosing and as the applicant is contemplating.

Less desirable, but still acceptable, is the attachment manner that circuit usage that allows the common, shielding electrodes to be utilized as a main, or primary energy propagation return or source pathway (not shown). This is because when the shielding electrode, main-body portion 81 of each shielding electrode 855/855-IM, 815, 800/800-IM, 810, and 850/850-IM like that in FIG. 3A and FIG. 3B are configured second or first energy pathways within a circuit (not shown), the primary shielding function of electrostatic shielding is not used as effectively for parasitic portions suppression or conditioning portions of energy used by a complete working Whole embodiments found within the disclosure will all relate to each other to some degree such that a invention+predetermined element portions in-combination are configured as a static structure used to create a unique dynamic result when operable in a predetermined circuit or circuit assembly can each be depicted as comprising a predetermined, balanced, but off-setting overall structures.

Herein, the principle of complementarity is taken as an assertion that there symmetrical portions of opposing dynamic quantities i.e. complementary dynamic energy quantities, in the sense that these symmetrical portions of opposing dynamic quantities i.e. complementary dynamic energy quantities can be described as a whole only to a combined energy conditioning function they seem to produce in terms of circuit portion performance located near or within the AOC of a predetermined invention in predetermined circuit attachment with energization that is unique and only found or can be seen as possible but from a predetermined invention, its variants or co-owned embodiments, Thus, it can be seen that when taken together as a family, an invention and to some degree its variants will be seen as able to perform this simultaneous energy conditioning function within a predetermined circuit arrangement, exclusive of all other, non-owned, prior art, in terms of the exclusive state of performance of an invention configured circuit portion that is so efficient that current state of the art, Time Domain Refractometery equipment and fixturing are currently just outside the range of truly measuring within a degree of certainty as to an invention, coupled-circuit portion configurations' true energy efficiency performance below 10 Pico seconds with assurance of accuracy. (as this disclosure is submitted) These energy portions of these complementary dynamic energy quantities will come together simultaneously within a range of space considered by the observer to be as an area of operable for dynamic interaction, confluence or convergence" or AOI and produce the exponential results over that of the limited prior art in dynamic applications.

Predetermined distances or areas 806, 814 and 814F which are outlined by the various predetermined alignments of selected or predetermined perimeter portions of various electrode and material elements that can make up a predetermined cage-like shielding electrode structure. These defined areas that use perimeters include, but are not limited to electrode, main-body portion 81 of all of the shielding electrodes found comprising a common, shielding electrode structure like 4000 in FIG. 1B and which will normally utilize this type of placement positioning of the common, shielding electrode structure in a predetermined, relative manner, with respect to the area or distance dimensions that are normally predetermined or found with respect to the smaller, uniformly inset, shielded, electrode, main-body portion 80 of the shielded, electrodes, shown in FIG. 2A. A physical, Faraday cage-like effect or a physical, electrostatic shielding effect function with electrically charged containment is used upon portions of external and internally generated, energy parasitics, portions of which are found propagating upon the various, smaller, shielded electrodes. These active conductive energy pathways will normally have concentrations of these energy parasitics located near the 803 electrode edges of the shielded, electrode, main-body portion(s) 80 that are now contained or immured from escape by the predetermined inset distance parameters relative to the shielding electrode, main-body portion(s) 81 that substantially prevent escape of local energy parasitics as well as substantially preventing entry of foreign or non-localized energy parasitics created elsewhere and the coupling of either groups of energy parasitics to the same shielded, electrode, main-body portion(s) 80, in the case of foreign parasitics, that are substantially prevented from entry) adjacent, shielded, electrode, main-body portion(s) 80 neighbor(s).

This active, electrostatic parasitic control system is substantially the result of a combination of predetermined limitations or requirements of specific elements that included, but are not all limited to:

These requirements listed above represent a substantial portion of the minimal requirements needed to provide both a physical shielding protection of the smaller, shielded electrodes' main-body portion 80 as a group or groups, but also represent a substantial portion of the minimal requirements needed as well for providing active, electrostatic shielding protection functions to portions of energy parasitics found along the smaller, shielded, electrode, main-body portion 80's as a group or groups from externally generated energy parasitics attempting coupling to these same active, and smaller, conductive energy pathways.

These requirements represent a substantial portion of the minimal requirements needed to provide during energization, a minimization of energy parasitics is attributed to the smaller, shielded electrodes' main-body portion 80 as a group or groups by utilizing a predetermined positioning or predetermined insetting of the smaller electrode, main-body portion 80 as a group or groups within the area foot print or the electrode, main-body portion 81 of a sandwiching shielding electrode(s), both individually and as a grouping for the invention embodiments.

The portioned amount and predetermined number of specific materials, elements and particularly predetermined numbers and arrangements of the various electrodes are normally evenly, or are balanced or divided between and positioned in a predetermined manner on opposite sides of the critical, centrally positioned shielding electrode 800/800-IM and its' electrode, main-body portion 81.

For this reason, variations of the minimum invention are certainly practicable to be operable for receiving, additional shielding electrode energy pathways that include the electrode, main-body portion 81 surrounding of the combination of a shared centrally-positioned conductive energy pathway 800/800-IM surrounding a predetermined grouped, predetermined placement of center conductive energy pathway and a predetermined plurality of paired, smaller by-pass or shielded electrodes with at least one main-body portion 80 created during manufacturing or employment of the invention to be able to exploit the increased inherent electrostatic shielding function created during energization by a predetermined optimized conductive attachment or coupling of the Faraday cage-like electrodes' main-body portion 81 comprising a substantial material portion of the single shielding structure.

This allows the Faraday cage-like electrodes' main-body portion 81 comprising a substantial material portion of the single shielding structure to also be practicable to facilitate surge dissipation to within and/or to any external common conductive area portion or common energy pathway portion the shielding electrode structure is operable in its attachment to be considered electrically operable or conductively coupled to these portions in a predetermined, common manner to provide an increase or enhancement of not only a low impedance effect of the common, shielding electrode structure and its' external common conductive area portion or common energy pathway portion, but its' use as a primary routing pathway beyond an invention AOC, itself, which is not considered part of the active, smaller, shielded electrode pathways, as found within the AOC for many of the invention embodiments.

These 'invention+predetermined' element portions in-combination's are all considered balance and 3-demensionally symmetrical using the central and shared common, shielding electrode or conductive pathway 800/800-IM as it physically is dividing various predetermined elements within the invention embodiments.

Energization of area AOI-69 zone of (2) various identical embodiments when compared as a whole structure with their various amalgamated predetermined invention elements will have similar dynamic relationship characteristics to each other for the various energy portions and propagational confluences that will allow (usually in terms of either observable or measurable or lack of observable or measurable) a repeatable and sustainable, optimized, or harmonious or even a 'least, disruptive' dynamic confluence or complementary energy portion inter-actions (that could include mutual energy portion coupling and/or cancellation or enhancements) within the comparative invention embodiments in predetermined configurations that will be measured substantially the same relative to each other and each relatively measured against a co-owned, Norm/Standard with the preferred configured AOI-69 zone elements when it too, is also placed into an identical predetermined circuit configuration and energized for measurement standard to which the various embodiments as depicted and that could be compared to.

Connection of the internally placed shielding electrodes with one another and the external energy pathway not of the at least two differential conductive pathways can be used a as a non-active energy pathway that can provide a reference voltage to the circuitry contained within the invention that allows for predetermined low impedance pathway utilized by the respective portions of the differential pathway propagating energies to utilize in a complementary and balanced manner with respect to one another and to the benefit of the circuit system efficiency over that of similar prior art circuitry.

The invention architecture when combined in a predetermined manner with separate and multiple circuitry pathways for energy propagation will allow portions of energies propagating along the contained circuitries a jointly and simultaneously shared ability for portions of these energies to utilize a third but common energy pathway created by the common interconnection of the shielding electrode pathways into a shielding structure along with this shielding structures external conductive attachments to the same electrically potentialed common conductive area or pathway not of the differential energy pathways. This separate but common and commonly shared third pathway acts as not only a voltage divider for energies found in predetermined energized circuitry, but due to its actual physical and electrical placement locations in a normally larger energized circuitry. This physical and electrical location can best be described as a shielding interpositioning and electrically common placement between at least a set of paired and oppositely co-acting, differential conductive energy pathways during energized operations.

The separate third pathway also becomes simultaneously utilized and shared as a common voltage reference node with respect to not only the multiple circuits operating within the invention and/or its AOC but at least a set of paired and oppositely co-acting, differential conductive energy pathways of the same circuit during energized operations, as well.

The various energy conditioning functions performed by the invention in-combination with other predetermined elements when coupled into a predetermined circuit for predetermined energized operation will also depend upon the predetermined coupling or attachment choices made for the predetermined attachment portions operable of invention elements that are methodologies employed by a user. These coupling or attachment methodologies with any associated materials are predetermined operations that could include, but are not limited to, such thing or methods as soldering, re-flux soldering, tension attachment(s) and are revealed as but a small portion of common industry coupling or attachments procedures, materials or utilized techniques or methodologies that are either practical or practicable to a potential user of the invention combination for predetermined circuit inclusion of the device.

At least a predetermined portion of one or more of the various energy conditioning functions derived by the inventions' operation as part of a predetermined circuit or predetermined application in a predetermined energized operation can be measured or observed by predetermined placement within a predetermined test circuit or even tested as part of an actual predetermined application circuit portion.

The 'invention+predetermined elements that are in-combination' are practicable to form an embodiment that is operable for a portion of confined, groupings of dynamic relationships at least taking place between/amongst propagating, energy portions that are utilizing portions of the invention+predetermined elements, in-combination.

These dynamic relationships at least taking place between/amongst propagating, energy portions will develop for conditioning various energy portions in propagation are as a result in substantial part, due to at least a predetermined, sequential manufacturing operation used to form a predetermined embodiment's static invention structure of invention+predetermined elements, in-combination which BOTH comprise predetermined material portions that will also include various predetermined spatial relationships or limitations disclosed. This means that the predetermined spatial relationships or limitations such as predetermined distance-relative proximities, predetermined relative-positional orientations, as well as, predetermined material compositions and intermixed positionings are all substantially related to these various predetermined material portions and the invention that comprise the final structure, that will be amalgamated as the predetermined relationships within the invention to combine from these parts into a whole static structure and will be responsible in substantial part to the results received by a new user to the invention as compared to any other possible non-owned, prior art device by the manner and effect upon dynamic energy propagations, confluence, conditioning and interplay a predetermined area of interaction(s) (AOI) or local within the invention AOC portion plays with a predetermined and energized, circuit portion.

In dynamic operation, with its various energy propagation portions utilizing the 'invention+predetermined elements that are in-combination' will propagate within the confines of a 3-demensional space or area created within the AOC that is called area of interaction (AOI). Propagations will occur in a relative in terms of symmetrical, asymmetrical, and complementary, but shielded/non-shielded confluence hierarchy progression of energy. The and the interrelational-matrix structure influences and is formed initially as static structure in a symmetrical, hierarchy progression appears so in a static structural state.

It should be apparent that the aligned, the invention is dependant upon predetermined, symmetrical balanced arrangements of the invention elements that are predetermined in both how they are arranged and positioned on either side of a centrally positioned shielding electrode. Although in some variants in cases where a bias or unbalanced portion of the invention as a grouping might be desired, the inventions' portioned balance, dynamic function is dependant upon what the static structure result reveals and is always dependant upon predetermined static structural AOC balance and static structural AOC symmetry in element portions of materials, positionings, shapes, thickness or sizes, shielding.

With Prior Art, emphasis is placed on the need for a balanced circuit arrangement to be in place before any energy conditioners are predetermined and coupled for usage. But for the new invention this criteria is minimal, rather the invention is more dependant upon its structure internally, for yielding an optimal dynamic result to an unbalanced or balanced circuit as part of an energized circuit assembly. Portioned balance is a dynamic function the invention offers to active load within an operating circuit. The inventions' portioned balance, dynamic function is dependant upon what the static structure arrangement result will reveal at energization and the predetermined static structural AOC balance and static structural AOC symmetry in element portions of materials, positionings, shapes, thickness or sizes, shielding as well as the static conductive coupling arrangement when the device is energized is more determinant in the quality of the portioned balance dynamic function in terms of the resulting dynamic AOI balance/symmetry than it is the other external circuit assembly portions found beyond the AOC.

It is very important to note that in dynamic circuit operation it is more important for the internal circuit network portion of the AOC structures and coupling mechanisms be of balanced arrangement, over all, than it is required that the portions of circuitry beyond the inventions be propagating energy in a balance manner.

FIG. 4 is a cross-section view of device 399 which is a predetermined, stacking sequence of a currently owned multi-layer, shielding electrode architecture with differential shielded electrodes with various predetermined selected areas distance relationships between predetermine electrodes and other elements. FIG. 4A presents 69 as an ideal AOI.

69-AOI is the area recognized statically, as well as dynamically, where the unique energy conditioning is practicable to take place simultaneously within this area and cannot be repeated identically without this type of arrangement, according to at least the prescribed disclosed herein.

Some of these principals comprise; a predetermined positioning and predetermined static sequence arrangement of each individual electrodes' main-body portions, 80 and/or 81 is in its relative final positioning to or from the other adjacent, individual electrodes' main-body portions, 80 and/or 81 and their own, predetermined positioning sequence has been created; the predetermined, from all direction, distance arrangements of each individual electrodes' main-body portions, 80 and/or 81 edges, relative to the predetermined distance arrangements of to, or from, the other electrodes' main-body portions, 80 and/or 81 edges or edge groupings of electrodes' main-body portions, 80 and/or 81 edges; the predetermined, (relative to and/or from many, predetermined directions), distance arrangements of each individual electrodes' relative predetermined, (relative to and/or from many, predetermined directions), distance arrangement to or from the final invention physical AOC boundary or casement 817 edges, if applicable; the predetermined numbers of electrode element groups of the various groups of (shielding and shielded) electrodes are present; the predetermined physical balancing effect of predetermined placement of equally divided invention elements on either planar-shaped side the centrally located and equally shared common, shielding electrode 800/800-IM that results in a predetermined parallel sandwiching of the centrally located and equally shared common, shielding electrode 800/800-IM by these elements are in place and positioned correctly; the predetermined number and positioning of the various electrode lead extensions 812"X" or 79G"X" (not shown) used relative to each other and their predetermined contribution as a portion of the whole invention to a circuit attachment or coupling for energization are, present but not labeled; energization of the smaller, shielded electrodes for utilization of energy propagations is practicable; predetermined conductive coupling of the larger same-size, shielding electrodes each with at least an electrode, main-body portion 81, to each other, as a group by 802A and 802B is practicable but not shown predetermined conductive coupling of the larger shielding electrode grouping (which can be considered one shielding structure 4000, for example) to predetermined coupling or attachment points external to the invention AOC are practicable but not shown; the confluence of at least three conductive energy pathways from a varied direction on the compass that can be practicable for internal placements as described, and others not shown.

Because the conductive shielding structure is formed from an odd integer number of shielding electrodes, the total shielding electrode structure possesses a balancing effect to the contained, same-sized, shielded electrodes each with at least an electrode, main-body portion 80, or differential electrodes that will with predetermined circuit attachment of the invention at energization be both practicable and operable to allow both complementary and simultaneous either full for partial electrostatic shielding of portions of propagating energies.

Thus, in all embodiments, the final integer number of shielding electrodes will always be an odd-numbered integer equal to or larger than 3. In all embodiments, the final integer number of shielded, electrodes will always be at least an even-numbered integer equal to or larger than 2. In all embodiments, the final integer number of shielding electrode cage-like structures 800"X" will always be at least an even-numbered integer equal to or larger than 2. In all embodiments, the final integer number of shielded, electrodes+number of shielding electrode cage-like structures 800"X"+number of shielding electrodes will always be at least an odd-numbered integer equal to or larger than 7.

It should also be noted that various combinations of minimum stacking arrangements like those shown in FIGS. 2A, 2B and FIG. 2C could be combined by predetermined manner and with minimal changes other than allowing for the adjustments in various stacking engagements to accommodate the shielding separations and various adjacent placements needed to configure a final new amalgamation comprising and FIG. 12A and FIG. 12B with FIGS. 2A, 2B and FIG. 2C, for example.

In previous embodiments, grouped electrodes were conductively interconnected by an external electrode band such as 809A, 809B for differential electrodes and 802A and 802B for common, shielding electrodes. In other embodiments of the present invention, one or more of the grouped electrodes are inset from the external electrode band such that it is "floating", or not directly connected by a terminal or lead portion.

Referring now to FIGS. 5A–5D, alternate embodiments of the present invention are shown including the use conductive vias 1000 to conductively interconnect two or more electrodes of a single electrode grouping. The vias 1000 extend perpendicularly through the material separating the electrodes to conductively connect the electrode groupings.

In FIG. 5A, a common, shielding electrode 815 positioned on material 815P includes electrode lead portions 79G for electrical connection to other common, shielding electrode groupings (not shown). A second common, shielding electrode 815BF, formed on material 815F1P is positioned directly below common, shielding electrode 815 by a distance 814A. Second common, shielding electrode 815BF does not include electrode lead portions 79G and is considered to be 'floating'. Vias 1000 are used to provide a conductive pathway through material 815P to allow common, shielding electrode 815BF to have an electrical connection to not only common, shielding electrode 815, but also other common, shielding electrode groupings. The concept is further shown in a cross-sectional view with regard to FIG. 5B which is identical to FIG. 2B except that common, shielding electrode 815BF is shown inset from common, shielding electrode 815 by distance 804 and from embodiment edge portion 817 by distance 804C and vias 1000 are shown conductively connecting common, shielding electrode 815BF to common, shielding electrode 815.

The concept is also applicable to differential electrode groupings as well and is shown in FIGS. 5C and 5D. In the upper electrode grouping 403A, differential electrode 855BT-1 is sandwiched by floating differential electrodes 855BT1-AF and 855BT1-BF. Vias 1000 are used to conductively connect the smaller floating differential electrodes 855BT1-AF and 855BT1-BF to differential electrode 855BT-1. The concept is further shown in a cross-sectional view with regard to FIG. 5D. An alternate embodiment of a grouping is shown in the lower electrode grouping 403B in FIG. 5C. In the differential electrode grouping 403B, each differential electrode extends to the end of their respective support plate material for conductive connection to an external electrode band (not shown). The conductive interconnection of differential electrode grouping 403B is supplemented by vias 1000 with allow alternate conductive interconnection pathways within the differential electrode grouping 403B. It should also be noted that vias 1000 also enhance the structural integrity of the attached electrode groupings and of the energy conditioner as a whole.

The predetermined multi-functional energy conditioner 506 shown in FIGS. 7A and 7B is identical to predetermined multi-functional energy conditioner 505 of FIGS. 6A and 6B except that the outer shielding electrodes 850/850-IM and 855/855-IM have been eliminated. This predetermined configuration will still maintain the shielding integrity provided predetermined shielding electrode structure's electrostatic shielding functions used upon the predetermined groupings of shielded electrodes.

The predetermined multi-functional energy conditioner 501 shown in FIGS. 8A and 8B is identical to predetermined multi-functional energy conditioner 400 of FIGS. 2B and 2C except that two additional predetermined common, shielding electrodes 800T and 800B have been added. Common, shielding electrode 800T is positioned above shielding electrode 800/800-IM and shielding electrode 800B is predetermined to be positioned inset and below shielding electrode 800/800-IM.

Predetermined shielding electrodes 800T and 800B are generally parallel and predetermined when stacked in a predetermined sandwiching manner relative to shielding electrode 800/800-IM. It is also noted that predetermined shielding electrodes 800T and 800B comprise a predetermined and smaller main-body electrode portion 80 such that each is inset equally with respect to shielding electrode 800/800-IM. As previously mentioned, the predetermined insetting relationship of the shielding electrodes 800T and 800B helps reduce commonly located stress concentrations that form aligned stacked vertically over each other with normally identically aligned, main-body electrode portion 80s' electrode edges during operation of the energy conditioner within a predetermined circuit.

Predetermined insetting of various predetermined electrodes also serve the purpose of producing material stresses on portions of material 801 comprising predetermined properties that could be of a dielectric material that would other wise be vulnerable to develop in certain 15 instances, stress damage that would possibly concentrate along perimeter or electrode edges 805 or 803 respectively, in certain predetermined electrodes stacking sequences that would result in an embodiment like that shown in FIGS. 5C thru 11B where the results of certain predetermined, electrodes stacking sequences beyond two identical groups members as shown in FIGS. 5C thru 11B and specifically, like 855BT1-ASB, 855BT1 and 855BT1-BSB of FIG. 5C for example, are not respectively adjacent or sandwiched by at least a normally interposing shielding electrode.

In certain, predetermined circuit configurations these embodiments would be more vulnerable to energy portion concentrations then they would other wise be in two-in-a-row-same groups stackings as they would be in three-in-a-row-same groups stacking arrangements.

Taking this concept further, predetermined multi-functional energy conditioner 502 shown in FIGS. 9A and 9B is identical to predetermined multi-functional energy conditioner 501 of FIGS. 8A and 8B except that the shielded electrodes 855BT-2 and 854BB-2 had been replaced by smaller shielded electrodes 855BT-2S and 854BB-2S which are of a smaller main-body electrode portion 80 such that they are inset from the rest of the shielded electrodes as the shown in FIG. 9B. Again, the insetting of the electrodes helps reduce stress concentrations at the electrode edges during operation of the energy conditioner.

Figures 10A, 10B:
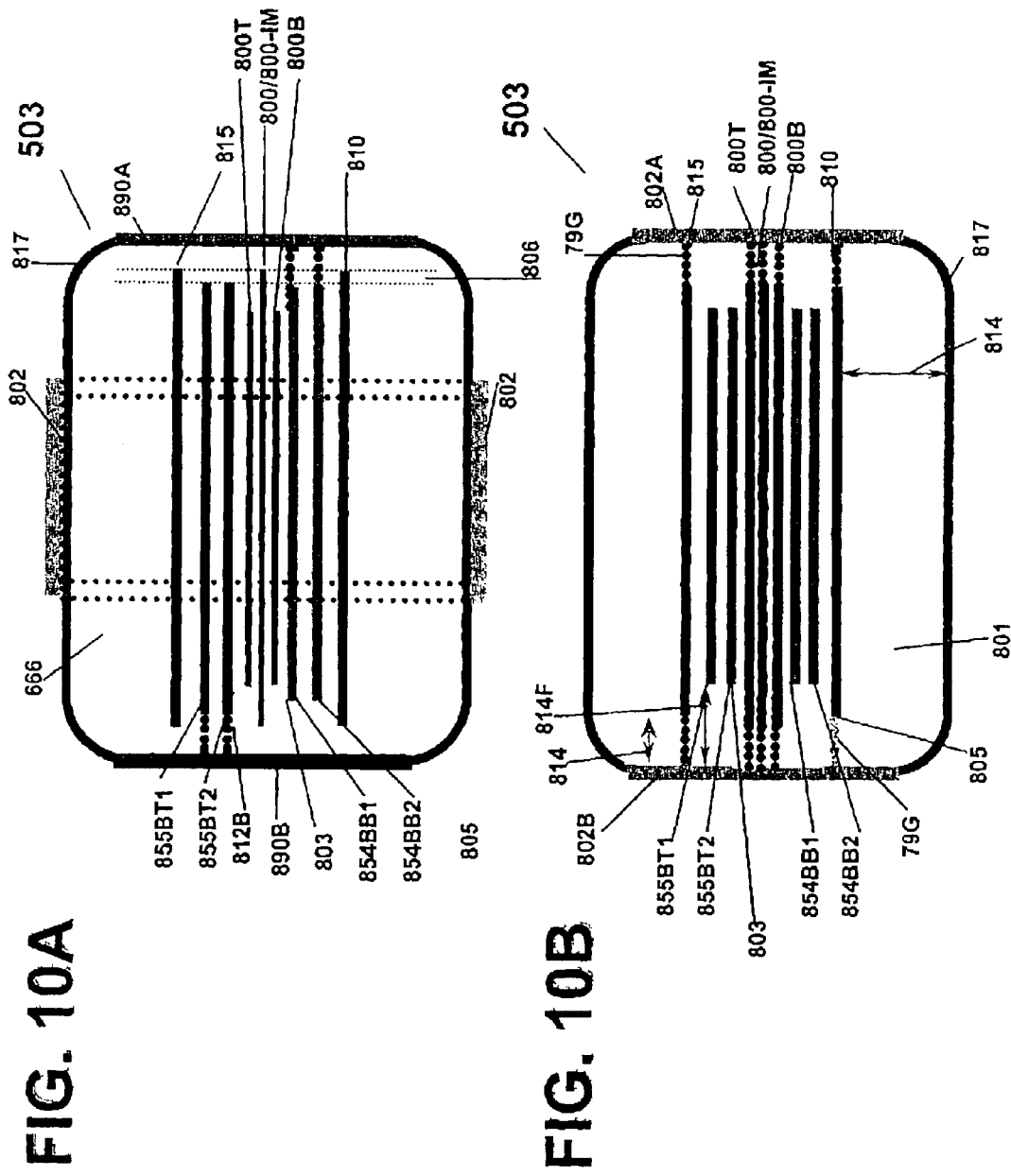
FIG. 10A is showing an exploded perspective view depicting a variation of the 3 energy pathway electrode arrangement of FIGS. 2A,2B and 2C, in accordance with the principles of the invention.
FIG. 10B shows the FIG. 10A view rotated to 90 degrees and viewed in accordance with the present invention.

In another embodiment variation, the predetermined multi-functional energy conditioner 503 shown in FIGS. 10A and 10B is identical to predetermined multi-functional energy conditioner 501 of FIGS. 8A and 8B except that the outer shielding electrodes 850/850-IM and 855/855-IM have been eliminated.

In another embodiment variation, the predetermined multi-functional energy conditioner 504 shown in FIGS. 11A and 11B is identical to predetermined multi-functional energy conditioner 502 of FIGS. 9A and 9B except that shielded electrodes 855BT-2S and 854BB-2S are not only of a smaller main-body electrode portion 80 such that they are inset from the rest of the shielded electrodes as the shown in FIG. 9B, but they are also of a smaller length such that they are inset from the rest of the shielded electrodes as the shown in FIG. 9A. Accordingly, three of the four shielded electrode edges of shielded electrodes 55BT-2S and 854BB-2S are inset from the shielded electrode edges of the remainder of shielded electrodes 55BT-1 and 854BB-1.

In the embodiments shown in FIGS. 5B and 5C, shielded electrodes 855BT1-AF, 855BT1, and 855BT1-BF were interconnected with paired, conductive vias 1000 or paired internal, electrode coupling portions 1000 which are operable for common electrical coupling or as electrically common connection of otherwise, 'floating' shielded electrodes 855BT1-AF and 855BT1-BF, respectively to shielded electrode 855BT1. Shielded electrodes of 855BT1-ASB, 855BT1, and 855BT1-BSB using the normal, designated 890"X"-type, coupling connections or attachments (not shown) could also make use of the at least paired, conductive vias 1000O's (or the at least paired, internal, electrode coupling portions 1000), internal electrode portion interconnecting function for providing additional structural integrity beyond that of the horizontal support function offered support function offered by the 801 material portions' layering.

Paired, conductive vias 1000 or paired internal, electrode coupling portions 1000 would offer and provide a vertically secured internal electrode portion interconnecting function provided in addition to that horizontal support function offered by adjacent material 801 to these respective electrode portions found within a predetermined multi-functional energy conditioner like 403. It is noted that the actual methods used to form or dispose of the paired, conductive vias 1000 or paired internal, electrode coupling portions 1000 between any respective electrodes or the coupling of units 1000 to each electrode are disclosed to be claimed, only the result is disclosed to be claimed by the applicant in combination with co-owned universal cage-like common, shielding electrode shielding structure and other elements, as disclosed.

In a similar manner, an alternate embodiment to the shown in FIGS. 12A and 12B. The predetermined multi-functional energy conditioner 506 shown in FIGS. 12A and 12B is identical to predetermined multi-functional energy conditioner 400 of FIGS. 2B and 2C except that the energy conditioner 506 has 'floating' shielded electrodes 855BT1-AF and 855BB1-AF which are electrically connected to shielded electrodes 855BT1 and 855BB1, respectively, by a plurality of paired, conductive vias 1000 or paired internal, electrode coupling portions 1000.

Figure 13A:
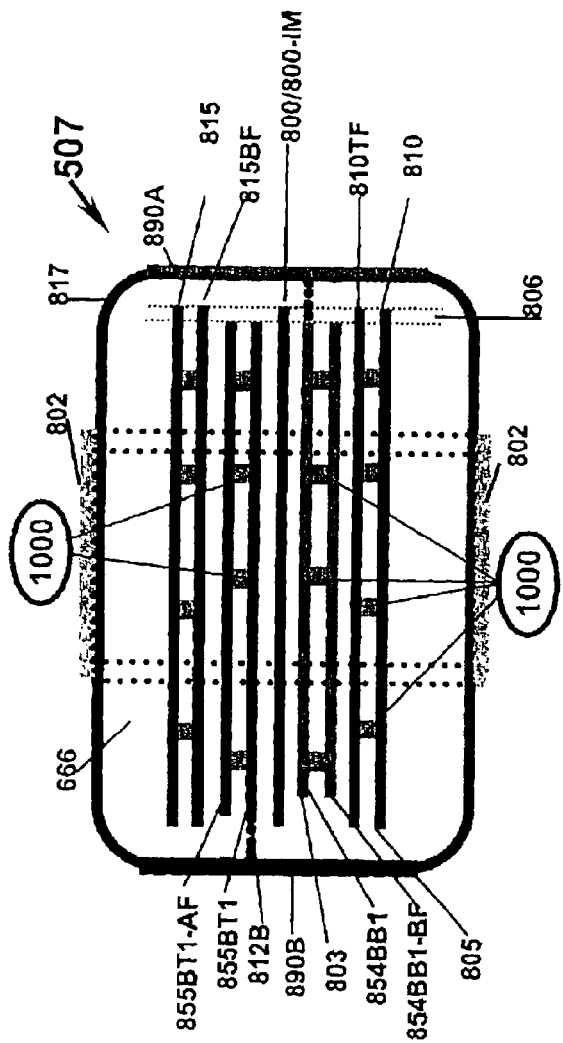
FIG. 13A is showing a cross-sectional view taken along a longitudinal bisector between complimentary external electrodes depicting a variation of the 3-energy pathway electrode arrangement of FIGS. 2A,2B and 2C, in accordance with the principles of the invention.
Figure 13B:
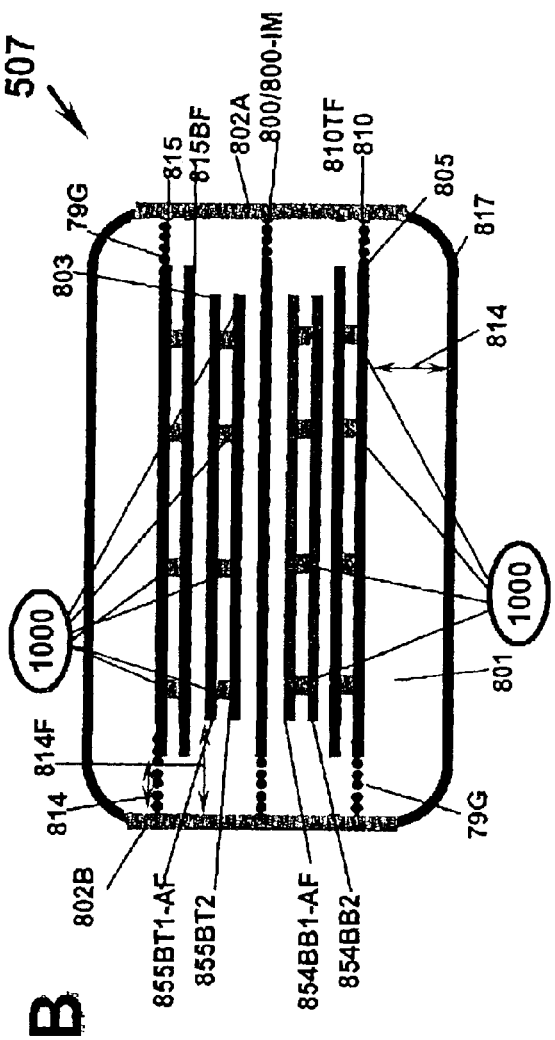
FIG. 13B shows the FIG. 13A view rotated to 90 degrees and viewed in accordance with the present invention.

Still, another embodiment shown in FIG. 13, paired, conductive vias 1000 or paired internal, electrode-coupling portions 1000 are used with both shielded electrodes and shielding electrodes. The predetermined multi-functional energy conditioner 507 shown in FIGS. 13A and 13B is identical to predetermined multi-functional energy conditioner 506 of FIGS. 12A and 12B except that shielding electrode 815 is electrically connected by a plurality of paired, conductive vias 1000 or paired internal, electrode coupling portions 1000 to a 'floating' common, shielding electrode 815BF and that shielding electrode 810 is electrically connected by a plurality of paired, conductive vias 1000 or paired internal, electrode coupling portions 1000 to a 'floating' common, shielding electrode 81 OTF.

In this embodiment 507, the extensive use of paired, conductive vias 1000 or paired internal, electrode coupling portions 1000 again, enhances and will provide a vertically secured internal electrode portion interconnecting function in addition to that horizontal support function offered by adjacent material 801 comprising predetermined functions to these respective electrode portions found within a predetermined multi-functional energy conditioner like 507.

As a final note to predetermined non-heterogeneous insetting relationships normally found within an embodiment such as FIG. 2As; embodiment 400, a combination of predetermined non-heterogeneous insetting relationships with the usage of paired, conductive vias 1000 or paired internal, electrode coupling portions 1000 enhancements that are also providing a vertically secured, internal, electrode portion interconnecting function that is well suited for certain circuit assembly configurations where usage of an isolated third energy pathway is not possible and where the need to utilize the larger shielding electrodes as direct feed-thru conductors in anyone direction, makes this configuration well suited for that type of circuit assembly.

Referring now to FIG. 14A and FIG. 14B which shows a basic circuit assembly or circuit arrangement 6900 that is practicable for simultaneously maintaining operable interaction between (3) electrically isolated, energy pathways that will yield sustained and harmonious energy portion confluences and interactions. Portions of energies utilizing these predetermined (3) energy pathways are depicted in FIGS. 14A and 14B as energy-in pathway 303, energy-return pathway 309, and third energy pathway and voltage reference 314 with optional vias 315 or low impedance energy pathway and voltage reference 314 with optional vias 315, respectively.

It is noted that depicted is a basic circuit assembly 6900, which is not the only circuit assembly foreseen or allowable, by the applicant. Many types of circuit portions and components could be coupled and utilizing portions of the (3) energy isolated pathways as just said, along the way to other elements and componentry will be contemplated by the applicant. These circuit assemblies or just circuit portions can include, but will not be limited to; energy distribution networks, data or signal energy networks; all of which can comprise a multitude of possible circuit assemblies configurations that are operable or practicable for conditioner 400 inclusion.

A closer depiction of FIG. 14A shows an energized circuit portion 6901 of FIG. 14B comprising an embodiment 400 of FIGS. 2A, 2B and 2C, or even any one of the predetermined electrode layered embodiments, disclosed herein, as well as the co-owned embodiments disclosed in other filings, that are known as the discrete versions of predetermined electrode layered embodiments practicable or operable for sustained circuit energy conditioning. (co-owned embodiments are not shown). For example, the energized circuit portion of a larger electronic circuit application operating with this circuit assembly as a whole, or as at least with this circuit assembly configured could easily have 6901 as a component test fixture or component test circuit (both specifically not-shown). Following a predetermined insertion and coupling which then includes a subsequent energization, the energized circuit portion 6901 will be operable for a unique, multi-functional, simultaneous energy conditioning combination function that is only found in an energized result unique of the disclosed, with these predetermined electrode layered embodiments or with the other previously disclosed embodiment members comprising this family of predetermined energy conditioning and shielding electrode structure embodiments in combination with other predetermined elements.

Multi-functional, simultaneous energy conditioning combination function results from predetermined coupling or attachments of an energy conditioner like 400 operable for conductive attachment with predetermined circuit portions that when energized can be observed by predetermined measurement operations elsewhere, performing the same type of energy conditioning upon portions of energies that include, but are not limited to, at least predetermined portions of sustained, common mode and differential mode energy filtering utilizing predetermined internal, capacitance characteristics manufactured by predetermined manner, as part of a finished structure like 400.

The circuit portion 6901 is a coupled passive energy conditioning network that is part of a larger circuit assembly 6900 and is utilized in an energized manner after operable attachment or coupling of predetermined conductive material coupling portion(s) 315 are made for predetermined conductive portion conductive coupling of conditioner 400 an application of predetermined conductive material coupling portion(s) 315 applied by standard means of attachment or method operations known in the art such as soldering, mechanical coupling techniques such as resistive fit, tension fit or other standard means of attachment or attachment method or operations known in the art.

Almost any embodiment disclosed herein, as well as any of the same family members of the other, co-owned embodiments previously disclosed, are practicable to be made operable by a predetermined manner for usage during predetermined electrical operations. This usage can comprise predetermined and conductively coupled, conductive material structure pairs 890A and 890B each conductively attached by material 315 to either first or second energy pathway, respectively as long as either one of conductive material structure pairs 890A and 890B is coupled to an external conductive portion 304 or 310 respectively.

Contiguous wrap-around (if used but not shown here) central shielding electrode material portions 802 or the separate 802A and 802B or 802"x" portions are practicable for conductively coupled connection by electrode connection material portions such as 315 material to contiguous conductive planar portion 314 so that a combined physical and dynamic shielding function is operable at energization relative to providing the combined static and dynamic shielding function simultaneously to portions of energy propagations located along portions of the internally located (within 400), and shielded complementary oriented/positioned, bypass electrode pairings, which are also respectively, conductively coupled to electrode material portions 890A and 890B. Electrode material portions 890A and 890B are coupled to energy pathways 303 and 309, respectively, each isolated between the third conductive pathway provided by the electrically coupled electrode material portions 802A, 802B, then by electrode connection material portions 315 to contiguous conductive planar portion 314 and on, if needed to 315 conductive via portions to common conductive area predetermined (not shown) or a operable portion utilized as a common conductive portion (not shown) operable for common circuit voltage referencing (not shown) relative to the circuit assembly 6900's' dynamic operations and elements that are operating. This third pathway can also be any other common conductive portion operable for providing the same common circuit voltage referencing function like an area (not shown) coupled to optional chassis or earth ground, in some cases.

The conductive coupling as described for the predetermined portions and the circuit pathways 303 and 309 are practicable to provide portions of propagating energies found within the circuits, a alternative, low impedance node or third pathway that is not by way of direct conductive connection from either first energy pathway 303 (energy-in pathway 303) or second energy pathway 309, (energy return pathway 309) or any direct conductive connection or alternate energy-return pathway. This third pathway when conductively coupled to embodiment 400 during energized operations provides or allows a low impedance pathway alternative for detrimental energy portions or circuit energy portion disturbances, such as circuit noise,, an alternative, low impedance node or third pathway as an additional routing for propagation. It can also provide return of detrimental energy portions or circuit energy portion disturbances, such as circuit noise to back to a source as described in Kirchoff's Law that is not needed 301 as an alternative, low impedance node or third pathway as an additional routing for propagation.

This third pathway is also operable because of the coupled, shielding, common electrode structure like a portion of 4000 of FIG. 1B and FIG. 2A that is comprising at least shielding, common electrodes with main-body portion 81 coupled together and operable as a single structure portion with conductive attachment to conductive portion 314 as part of a internal conductive extension of an external common conductive area such as contiguous conductive planar portion 314 and its coupled pathways, beyond.

The third energy pathway is isolated from contiguous electrical attachment to 303 and 309 energy pathways and is operable as a common pathway of least impedance for portions of complementary, propagating energy portion field flux that appear as a result of circuit 6900s' energization, and will also provide energy pathway blocking functions, surge portion suppression functions, as well as facilitate close propagations of complementary and mutual coupling of propagating energy portions that result in mutual cancellations.

An instantaneous, sustained complementary, dynamic polarity charge switching function is operable for a predetermined dynamic circuit operation and will comprise part of the electrically common shielding electrodes' dynamic operations, aid in circuit energy portion decoupling of dynamic propagations, as well as, complementary energy portion bypass operations which are all operable and influenced to some degree directly as a result of the presence of a third energy pathway portion, not of the other two energy pathway portions 303 and 309 (which are in electrically complementary or opposite operation with respect to each other and simultaneously) with an apparent, identical internally provided mutual voltage reference found along the shielding, third energy pathway adjacent to each of the remaining shielded portions of energy pathways.

A voltage dividing function is also available and can be used in an energization after a predetermined coupling comprising embodiment 400 is made into circuit portion 6901, as part of circuit assembly 6900.

The voltage within the embodiment will be found to be effectively one-half as much of the original voltage portion of the circuit located respectively on opposite sides and of the central shielding, common electrode 800/800-IM or energy pathway portion 800/800-IM comprising circuit portion 6901. The isolating and shielding effect of a common conductive portions of the invention embodiment can be operable for dividing the circuit voltage in half. Utilization of this function provides a user a manner in which to minimize the internal stresses or hysteresis effect commonly found with prior art components. Embodiment element material hysteresis effect, as well as other material-"memory" stresses is recognized as debilitating and undesirable within prior art components, and will be little or substantially absent as an energy sapping influence in a new invention embodiment material or elements comprising the invention 400 for example. Hysteresis effects and stresses will not play a substantial role in the overall ability of an invention device in its operable dynamic ability to facilitate efficient, energy portion propagation, conditioning or energy portion confluence occurring within the AOC to any noticeable degree in a circuit assembly like 6900.

The absence or substantially minimization of hysteresis and other stresses placed upon invention materials by dynamic operations are directly a part of the overall energy conditioning function ability of the operating device or assembly and will have a substantial effect upon the various portions of propagating energies utilizing these materials and will thus provide more efficient utilization and will not work against dynamic operations, as to the determent of the circuit energy propagations.

The energized circuit portion 6901 found in FIGS. 14A and 14B comprises energy source 301 that starts the energy portion propagations into a circuit 6900, energy source 301 conductive coupling portion 302 which is physically coupled to external energy pathway 303 which in turn is conductively coupled to predetermined, external conductive area or portion 304 to facilitate alignment, support and further optimal operability of 400 to circuit portion 6900.

External conductive area or portion 304 can also comprise additional pathway elements to load 301 that could include an internal electrode connection material portion or VIA 315 or almost any conductive medium between the remaining portions of pathway 303 which can be wider, narrower, shorter, longer, on the surface of substrate portion 316 or imbedded within multi-layered substrate portion 316B (not shown) by predetermined manner to couple conductively to energy-utilizing load 301.

To return back to the energy source 301, energy portion propagations return once again into a circuit 6900, from energy utilizing load 307, along coupled, conductive coupling portion 308 which is physically coupled in most cases to, external return energy pathway 309 which in turn is conductively coupled to at least a predetermined, external conductive area or portion 310 and on to 311 and the remaining 309 energy pathway portion to facilitate alignment, support and further optimal operability of 400 to circuit portion 6900, if needed.

In conductively attaching embodiment 400 of the invention into a circuit assembly 6900, a solid shaped area or conductive material-mounting pad, 304 and 310 or pad material is desired for conductive connection of conductive material or conductive structures 890A and 890B. The conductive material mounting pads or pad materials 304 and 310 utilized by the conductive material structures 890A and 890B are for mounting and facilitating structural support and conductive connection of into the differential circuit portions 304 and 310 with solder material or the like 315 which is already utilized by prior art.

A third energy pathway normally could comprise (2) separated pad configurations (not shown), which are always preferred for differential circuit operations with the traditional, prior art. However, 91) contiguous pad 314 or conductive area 314 is almost always preferred for mounting and facilitating structural support and conductive connection of the monolithic wrap-around-type conductive structure 802 or multiple, paired structures like 802A and 802B soldering attachments for third pathway operations.

Contiguous pad 314 or conductive area 314 along with conductive VIA or connection medium portions facilitate a static pathway 314–315 to further grounding or reference like a chassis ground or earth ground 313, if desired.

Static third pathway 314–315 to 313, if desired also serves in dynamic operation as a portion of a conductive pathway or third energy pathway or circuit reference pathway of least low impedance as an identical voltage reference node for portions of energies utilizing pathways 303 and 309 and will also facilitate certain, energy portion confluences and interaction operable by dynamic operation as well as by a predetermined 'distanced' positioning, all of which are operable and relative to each other made practicable by utilizing an invention embodiment comprising a predetermined 3-energy pathway conductor attachment arrangement as described herein, in accordance with the principles of the invention disclosing an improved circuit conditioning assembly 6900 with component configurations comprising an embedded electrode layer/electrode material and pr ermined patterns capable of handling significantly higher current loads in certain predetermined applications.

A larger, energy portion propagation network can easily comprised of a predetermined portion of the energized circuit assembly 6900 will comprise a low impedance energy pathway.

Un-like the prior art embodiments, the various electrodes comprising three groupings of common, shielding electrodes are significantly differentiated by the relationship of the size ratios or predetermined sized comparison of each respective electrodes' main-body portion 81 or main-body portion 80 to each other, adjacently as individual electrode, main-body portions or as groupings of single or individual shielding electrode, main-body portion 81s to groupings of single or individual shielded electrode, main-body portion 80s, as well as, their respective orientation directions and their final functionally based on predetermined circuit attachment positions and couplings and subsequent energization.

Because magnetic lines of flux travel counterclockwise (not shown) within a transmission line or line conductor or layer, if the RF return path is parallel and adjacent to its corresponding energy source pathway, the magnetic flux lines observed in the return path (counterclockwise field), related to the energy source pathway (clockwise field), will substantially be in the opposing directions. When one combines a clockwise field with a counterclockwise field, a cancellation or minimization effect is observed. The closer complementary propagating, electrically differential energies found along pathways are brought together, the better the cancellation effect. Internal cancellation effect, especially within single chip by-pass embodiments.

Use of a "0" voltage reference created by the centrally positioned and shared common shielding energy pathway electrode coupled to a external common conductive area or pathway 314/315 is possible with a complementary charging of a portion of two distinct common conductive shield structures, simultaneously from the invention embodiment portion 6901.

The parallel movement of complementary propagating energy portions along found moving mutually opposed along portions of the 303 and 309 energy pathways are practicable to receive operable energy conditioning functions as well as and operable electrostatic shielding effect in which an energy propagation portion operating on one side of the central common and shared conductive energy pathway and the coupled external area 314/315 to chassis ground 313 or an predetermined conductive port (not shown) found elsewhere comprised of substrate 316 that will also aid to circuit portions 6901s' electrical complementary charge switching effect.

Complementary charge switching effect is due to the attachment configurations of identically configured 400 unit, which can be coupled and energized to share a third common conductive pathway 314/315 to 313 or other area not coupled to 313.

Solder material 315 is used to couple together in a conductive manner electrode termination portions 802A and 802B to conductive material pad portion 314 to optional conductive pad/vias 314, 315 to get to earthen ground 313 or similar.

Pad 314 could also be conductively part of conductive pad/vias 314, 315 which would then lead to conductive area or ground 313, or elsewhere if predetermined, which can in turn, can either "float" in an energized operation like a usage in an un-grounded DC motor as such a DC motor is a portion of an energized automobile electrical system (not shown) and by being electrically isolated to all but conductive pad/vias 314, 315 to 313, or elsewhere if predetermined, or similar or some other industry accepted coupling for electrical operation to be operable.

That means as the invention is disclosed, it is revealed that as a portion of an operating circuit 6900 comprising a circuit assembly 6902, where the common shielding electrodes are used as a primary energy return pathway 322, but rather, as a grouping of common shielding electrodes attached to a third conductive pathway conductive pad/vias 314, 315 now attached to a floating or non-circuit grounding common area 313, or elsewhere if predetermined, usually not necessary for completing a primarily, energized operating circuit 6902.

Other operable electrical coupling practicable for electrical operations that could include but is not limited to third pathway combination as described above would lead from shielding electrodes 8"XX" to external conductive area 313 so that 313 could be coupled to a further electrical potential found beyond, like a chassis ground, earth ground or as part as part of a quiet ground (not shown) comprising sub-strate portion 316, for example, a sectioned off portion of a PCB system (used as an example for this situation in FIG. 14A and FIG. 14B).

Each part and its opposite conductive layered electrodes or energy pathways main-body portions found internally are simultaneously being utilized by portions of propagated circuit energies that at one time or another would have an electrically opposite counter part located on opposite sides of the critical centrally positioned shielding, common electrode energy pathway and "0" voltage reference plane comprising conductive pad/vias 314, 315 to 313.

The circuit assembly 6900 with grouped third pathway conductive attachments that utilize and one invention 400 in FIGS. 2A, 2B and 2C, will illustrate as a predetermined tri-pathway, circuit assembly formed by predetermined conductive material attachments.

Thus, predetermined coupled combination of three predetermined independent groups of electrodes that are electrostatically shielding, two isolated and separate predetermined groups of shielded active electrode circuit pathways from each other while also located on opposite sides of a common ground 313 found between a energy source 301 and an energy utilizing load 307 can be practicable as coupled circuit portions for using a commonly utilized common conductive third external pathway comprising conductive pad/vias 314, 315 to 313, that could be, but is not necessarily a primary energy return pathway 309 in a predetermined closed operating circuit 6900, now created during at least energization, for a low impedance pathway to a common conductive area 313 along third common conductive pathway pad/vias 314, 315

These types of conductive circuit attachments can be made regardless of the embodiment 801 encasement in the sense of a discrete or non-discrete embodiment of predetermined conductors not of the actual shielding, common electrodes 855/855-IM, 845, 835, 825, 815, 800/800-IM, 810, 820, 830, 840, and 850/850-IM layers themselves to the external structure pathway 314/315 to 313 or similar utilizing regular portions of the paired inventions units.

To optimize the decoupling performance, invention circuit and invention unit 400 should be located as close to the load 307 as possible, this will minimize the stray inductance and resistance associated with the internal electrode portion of circuit traces 301, 322, thereby taking full advantage of the invention circuit and device properties and capabilities for utilization by the portions taking the energy paths in their propagations to undergo conditioning. In this example portions of propagating energies found in the operating circuits such as 6900, will operate in a complete by-pass propagation mode with respect to overall handling by respective physically active by-pass external energy pathways coupled to either locations upon embodiment 400 to operate in a by-pass relationship back to the energy-load 307 and partially within the device 400, as these portions of propagating energies return back to the source 301.

The external energy pathways will stop at the conductive connections found leading into assembly 6900 like shown on FIG. 14A, pass through the active electrode portions and begin externally on each respective external pathway on the opposite side of the invention.

The external third pathway-coupling scheme will dynamically aid the invention embodiments in providing operable common voltage reference for the shielded electrode pathways but the predetermined external third pathway connection scheme aids the electrostatic shielding function that allows dynamic shielding operability protection to portions of electronic system circuitry.

A predetermined third energy pathway is normally found to be electrically isolated from, but can be found internally adjacent to, the electrically opposing, complementary, differential electrode energy pathways or power/signal planes. A predetermined third energy pathway is also coupled extension of the outer external common conductive pathway, extension. This predetermined third energy pathway can also be utilized in one invention device for certain predetermined circuitries or bus lines as opposed to utilizing many individual discrete low impedance decoupling capacitors positioned in parallel within a comparable circuit system in an attempt to accomplish the same goal.

In other assemblies, these external circuit pathways or traces 303 and 309 to be contiguous in the appearance and the invention would simply be placed coupled, over and on top theses external energy pathways coupled on either side to allow some portions of energy to use the pathways as if the units were not coupled to them, while other portions of energies will enter into the invention units and their respective AOIs of the AOC's.

In all embodiments whether shown or not, the number of conductive pathways, both common shielding pathway electrodes and shielded pathway electrodes, can be multiplied in a predetermined manner to create a number of conductive pathway element combinations in a generally physical parallel relationship that also be considered electrically parallel in relationship with respect to these elements in an energized existence with respect to a circuit source will exist additionally in parallel which thereby add to create increased capacitance values.

When the particular embodiment is attached into a circuit assembly and energized, some of the various energy conditioning functions obtained with usage of the energized circuit using the third pathway connection scheme, include, but are not limited to, simultaneous, certain conditional, filtering, surge protection and energy decoupling, certain conditional mutual flux cancellation of certain types of electromagnetic energy field propagations, containment and suppression of portions of E & H electromagnetic energy field propagation or the various parasitic emissions originating form these fields with minimal portions of energy degradation not normally found by using prior embodiments that do not comprise such elements as described in preceding text.

Although a minimum of one central shielding is shown and acceptable, a common, shielding electrode that is paired with two additionally positioned common electrode pathways or electrode shields are generally desired and these two additionally positioned common electrode pathways or electrode shields should be divided and positioned on opposite sides of the central common electrode shield with respect to each other and the one central shielding, common electrode. Shielding, common electrode 800/800-IM is predetermined to be arranged and positioned, shared and in-between the remaining, other invention elements, the larger common conductive shield structure and finally, the conductive attachment(s) of a common external conductive element(s) that is/are working in combination together, using electrostatic shielding suppression techniques as well as, physical shielding, for influencing and conditioning portions of energy that are propagated within a circuit system that one of the various invention embodiments is incorporated into for usage.

The additional sandwiching, common -IM shielding pathway electrodes surrounding the combination of a center common shielding electrode pathway with interposing shielding pathway electrodes substantially immuring predetermined pluralities of smaller, shielded electrodes are employed to provide an increased and an optimized, cage-like shielding function and surge dissipation area in all embodiments.

The circuit assembly is practicable to be operable with grouped internal and external and the third pathway conductive attachments (other than of dielectric material) when energized. This new assembly combination reveals unequivocally that a factor causing results and improved circuit performances are predicated upon an invention comprising a predetermined, balanced grouping of elements within the embodiments that are centered around the inventions balanced material portions, the inventions balanced, symmetrical arrangement of the material structure in a mirrored relationship on both sides of the structure totally balanced internal or found on, either side of the centrally positioned, common, shielding electrode 800/800-IM.

The choice of the predetermined elements, their quantities, composition or their predetermined arranged groupings that are selected for in-combination amalgamation with the invention will substantially determine what type or what kind of portions of various energy conditioning functions an average user could expect to observe or benefit from as a result attributed to a predetermined amalgamated combination with the invention.

The invention will also minimize or suppress as well as prevent harmful and unwanted energy parasitics originating from either of the paired and oppositely co-acting, differential conductive energy pathways connected to circuitry, respectively, from upsetting one another, portions of the propagating circuit energy or voltage balance within the AOC of the invention. The invention will also minimize or suppress as well as prevent harmful and unwanted energy parasitics and provide a subsequent conduction pathway of release for escaping in the form of common mode energies and the like back into the circuit system to detrimentally affect a larger circuitry, outside the AOC influence.

From a review of the numerous embodiments it should be apparent that the shape, thickness or size may be varied depending on the electrical application derived from the arrangement of common, shielding electrode pathways, attachment structures that form at least one single conductively homogenous faraday cage-like structure and other conductive electrode pathways. The predetermined physically balanced arrangements and distance relationships that at energization will be simultaneously operable for contributed amalgamated energy conditioning upon various energy portions found utilizing the amalgamated invention elements. The contribution of each individual conductive element will create a sum of the whole that is larger than the sum of the parts taken individually.

This interactive mutual dependence of elements upon one another to create a whole that is larger than the sum of all of its parts is an unique and unobvious invention with each individual part or element making a contribution to the entire overall embodiments' energy conditioning ability Invention modifications of the embodiments are fully contemplated and can be made without departing from the spirit or scope of the present invention.

As can be seen, many different applications of the multifunctional energy conditioner architecture are possible and review of several features universal to all the embodiment portions must be noted. First, the material 801 having predetermined electrical properties may be one of a number in any of the embodiment portions including but not limited to dielectric material, metal oxide varistor material, ferrite material and other more exotic substances such as Mylar film or sintered polycrystalline. No matter which material 801 is used, the combination of larger, shielding, common electrode and electrode creates a plurality of capacitors to form a line-to-line differential coupling capacitor between and two line-to-third energy pathway decoupling capacitors from a pair of electrical conductors. The material 801 having electrical properties will vary the capacitance values and/or add additional features such as over-voltage and surge protection or increased inductance, resistance, or a combination of all the above.

Second, in all embodiment portions whether shown or not, the number of electrodes, both common conductive and electrode, can be multiplied to create a number of capacitive elements in parallel which thereby add to create increased capacitance values.

Third, additional same sized, shielding, common electrode surrounding the combination of a center electrode and a plurality of electrodes are employed to provide an increased inherent third energy pathway and optimized electrostatic shielding function and surge dissipation area in all embodiments.

Fourth, in some embodiments, one central common conductive shield is paired with two adjacent and additionally positioned, smaller, common electrodes or shields are also generally desired and should be positioned as well divided and on opposite sides of the central common conductive shield, additional smaller, shielding, common, shielding electrodes can be employed with any of the embodiment portions shown and is fully contemplated by Applicant.

In fact the multi-functional energy conditioner, although not shown, could easily be fabricated in silicon and directly incorporated into integrated circuits for use in such applications as communication microprocessor integrated circuitry or chips. Integrated circuits are already being made having capacitors etched within the silicone foundation which allows the architecture of the present invention to readily be incorporated with technology available today.

Finally, although the principals, preferred embodiments and preferred operations of the present invention and variants have been described in detail, the disclosure is not to be construed as being limited to the particular illustrative forms depicted and thus, it will become apparent to those skilled in the art that various modifications of the preferred embodiments herein, can be made without departing from the spirit or scope of an invention embodiment as defined.

We claim:

1. A predetermined electrode arrangement comprising:
    a first plurality of electrodes comprising at least three electrodes conductively connected to each other;
    at least one paired set of electrodes comprising a second plurality of electrodes conductively connected to each other and a third plurality of electrodes conductively connected to each other;
    a material which is positioned between at least some electrodes of said first plurality of electrodes, said second plurality of electrodes, and said third plurality of electrodes;
    wherein said first plurality of electrodes is conductively insulated from said second plurality of electrodes and said third plurality of electrodes;
    wherein said second plurality of electrodes is conductively insulated from said third plurality of electrodes;
    wherein said at least one paired set of electrodes is interleaved between said first plurality of electrodes such that said second plurality of electrodes is positioned between and within a common stacked alignment of at least two electrodes of said first plurality of electrodes and said third plurality of electrodes is positioned between and within a common stacked alignment of at least two electrodes of said first plurality of electrodes; and
    wherein at least one electrode of said first plurality of electrodes is positioned between said second plurality of electrodes and said third plurality of electrodes practicable as at least a centrally positioned electrode.

2. The predetermined electrode arrangement of claim 1 in which said first plurality of electrodes comprises at least five electrodes wherein at least two electrodes of said first plurality of electrodes is positioned above said one paired set of electrodes and at least two electrodes of said first plurality of electrodes are positioned below said one paired set of electrodes and wherein at least one electrode of said first plurality of electrodes are positioned between said second plurality of electrodes and said third plurality of electrodes.

3. The predetermined electrode arrangement of claim 2 in which said first plurality of electrodes comprises at least seven electrodes wherein at least two electrodes of said first plurality of electrodes are positioned above said one paired set of electrodes and at least two electrodes of said first plurality of electrodes are positioned below said one paired set of electrodes and wherein at least three electrodes of said first plurality of electrodes is positioned between said second plurality of electrodes and said third plurality of electrodes.

4. The predetermined electrode arrangement of claim 3 in which at least two electrodes of said at least three electrodes of said first plurality of electrodes positioned between said second plurality of electrodes and said third plurality of electrodes are smaller than the remaining electrodes of said first plurality of electrodes.

5. The predetermined electrode arrangement of claim 4 in which said second plurality of electrodes comprise at least one electrode that is smaller than any other electrode of said third plurality of electrodes.

6. The predetermined electrode arrangement of claim 5 in which said third plurality of electrodes comprise at least one electrode that is smaller than any other electrode of said second plurality of electrodes.

7. The predetermined electrode arrangement of claim 1 in which said first plurality of electrodes comprises at least five electrodes wherein at least one electrode of said first plurality of electrodes is positioned above said one paired set of electrodes and at least one electrode of said first plurality of electrodes is positioned below said one paired set of electrodes and wherein at least three electrodes of said first plurality of electrodes are positioned between said second plurality of electrodes and said third plurality of electrodes.

8. The predetermined electrode arrangement of claim 3 in which at least two electrodes of said at least three electrodes of said first plurality of electrodes positioned between said second plurality of electrodes and said third plurality of electrodes is smaller than the remaining electrodes of said first plurality of electrodes.

9. The predetermined electrode arrangement of claim 4 in which said second plurality of electrodes comprise at least one electrode that is smaller than any other electrode of said second plurality of electrodes such that at least three sides of said at least one smaller electrode is inset from said any other electrode of said second plurality of electrodes.

10. The predetermined electrode arrangement of claim 9 in which said third plurality of electrodes comprise at least one electrode that is smaller than any other electrode of said third plurality of electrodes such that at least three sides of said at least one smaller electrode is inset from said any other electrode of said third plurality of electrodes.

11. The predetermined electrode arrangement of claim 1 in which said second plurality of electrodes are conductively interconnected by at least one via and wherein said third plurality of electrodes are conductively interconnected by at least one via.

12. The predetermined electrode arrangement of claim 11 in which at least one electrode of said second plurality of electrodes is conductively to a remainder of said second plurality of electrodes solely by a plurality of vias and wherein said third plurality of electrodes is conductively to a remainder of said third plurality of electrodes solely by a plurality of vias.

13. The predetermined electrode arrangement of claim 1 in which said first plurality of electrodes comprises at least five electrodes wherein at least two electrodes of said first plurality of electrodes are electrically interconnected by at least one via and are positioned above said one paired set of electrodes and at least two electrodes of said first plurality of electrodes are electrically interconnected by at least one via and are positioned below said one paired set of electrodes and wherein at least one electrode of said first plurality of electrodes is positioned between said second plurality of electrodes and said third plurality of electrodes.

14. An energy conditioner comprising:
    a plurality of shielding electrodes conductively connected to each other;
    at least one paired set of complimentary shielded electrodes comprising a first plurality of shielded electrodes conductively connected to each other and a second plurality of shielded electrodes conductively connected to each other, said first plurality of shielded electrodes conductively insulated from said second plurality of shielded electrodes;

a material which is positioned to conductively insulate said plurality of shielding electrodes from said at least one paired set of complimentary shielded electrodes and insulate said first plurality of shielded electrodes from said second plurality of shielded electrodes, such that said plurality of shielding electrodes are conductively isolated from said first plurality of electrodes and said second plurality of electrodes;

wherein said at least one paired set of complimentary shielded electrodes is interleaved between said plurality of shielding electrodes such that said first plurality of shielded electrodes is positioned between at least two of said plurality of shielding electrodes and said second plurality of shielded electrodes is positioned between at least two of said plurality of shielding electrodes; and wherein at least one of said plurality of shielding electrodes is positioned between said first plurality of shielded electrodes and said second plurality of shielded electrodes.

15. An energy conditioner comprising:

a layered architecture formed in a dielectric material having a minimum sequence;

a first common shielding electrode;

at least two shielded electrodes of a first group of shielded electrodes that are conductively connected to each other;

a second common shielding electrode;

at least two shielded electrodes of a second group of shielded electrodes which are conductively connected to each other; and a third common shielding electrode;

wherein all of said common shielding electrodes are conductively interconnected;

wherein said at least two shielded electrodes of said second group of shielded electrodes is positioned to be electrically complimentary to said at least two shielded electrodes of said second group of shielded electrodes;

wherein said at least two shielded electrodes of said first group are electrically isolated from said at least two shielded electrodes of said second group;

and wherein said first common shielding electrode is electrically isolated from both said at least two shielded electrodes of said first group and said at least two shielded electrodes of said second group; and wherein upon repeating said minimum sequence, the first common shielding electrode of subsequent repeating layers is omitted.

16. The energy conditioner of claim 15 in which one additional common shielding electrode is added to the outermost common shielding electrodes of said layered architecture.

17. An energy conditioner, comprising:

a G conductive shielding structure;

an A conductor structure;

a B conductor structure;

wherein said G conductive shielding structure, said A conductor structure, and said B conductor structure are conductively insulated from one another;

wherein said G conductive shielding structure, said A conductor structure, and said B conductor structure include a sequence of conductive layers substantially stacked upon one another, said sequence of conductive layers comprising:

an A—A sub-sequence of at least two A conductor layers, said A—A sub-sequence having no other conductive layers there between;

a B—B sub-sequence of at least two B conductor layers, said B—B sub-sequence having no other conductive layers there between;

at least one G shielding layer between said A—A sub-sequence and said B—B sub-sequence;

at least one G shielding layer above both said A—A sub-sequence and said B—B sub-sequence; and at least one G shielding layer below both said A—A sub-sequence and said B—B sub-sequence.

18. The conditioner of claim 17 wherein said sequence consists of an odd number of conductive layers such that said conditioner has a central layer, and said at least one G shielding layer between said A—A sub-sequence and said B—B sub-sequence is said central layer.

19. The conditioner of claim 17 further comprising at least one conductive via connection between said A—A sub-sequence of said at least two A conductor layers.

20. The conditioner of claim 17 wherein said A—A sub sequence comprises at least three conductive layers.

21. The conditioner of claim 17 wherein said A conductor structure comprises an A edge connection structure and wherein at least two conductive layers of said A—A sub sequence physically contact said A edge connection structure.

22. The conditioner of claim 17 wherein said G conductive shielding structure comprises a G top layer at the top of said sequence and a G bottom layer at the bottom of said sequence.

23. A method of making an energy conditioner, comprising:

providing a G conductive shielding structure;

providing an A conductor structure;

providing a B conductor structure;

wherein said G conductive shielding structure, said A conductor structure, and said B conductor structure are conductively insulated from one another;

wherein said G conductive shielding structure, said A conductor structure, and said B conductor structure include a sequence of conductive layers substantially stacked upon one another, said sequence of conductive layers comprising:

an A—A sub-sequence of at least two A conductor layers, said A—A sub-sequence having no other conductive layers there between;

a B—B sub-sequence of at least two B conductor layers, said B—B sub-sequence having no other conductive layers there between;

at least one G shielding layer between said A—A sub-sequence and said B—B sub-sequence;

at least one G shielding layer above both said A—A sub-sequence and said B—B sub-sequence; and at least one G shielding layer below both said A—A sub-sequence and said B—B sub-sequence.

24. A method of using an energy conditioner, said energy conditioner comprising:

a G conductive shielding structure;

an A conductor structure;

a B conductor structure;

wherein said G conductive shielding structure, said A conductor structure, and said B conductor structure are conductively insulated from one another;

wherein said G conductive shielding structure, said A conductor structure, and said B conductor structure include a sequence of conductive layers substantially stacked upon one another, said sequence of conductive layers comprising:

an A—A sub-sequence of at least two A conductor layers, said A—A sub-sequence having no other conductive layers there between;

a B—B sub-sequence of at least two B conductor layers, said B—B sub-sequence having no other conductive layers there between;

at least one G shielding layer between said A—A sub-sequence and said B—B sub-sequence;

at least one G shielding layer above both said A—A sub-sequence and said B—B sub-sequence;

at least one G shielding layer below both said A—A sub-sequence and said B—B sub-sequence; and said method comprising connecting conditioning energy with said energy conditioner.

* * * * *